(12) United States Patent
Jung et al.

(10) Patent No.: US 12,374,257 B2
(45) Date of Patent: Jul. 29, 2025

(54) DISPLAY DEVICE, GAMMA CORRECTION CIRCUIT AND DISPLAY DRIVING METHOD

(71) Applicant: LG Display Co., Ltd., Seoul (KR)

(72) Inventors: Boyun Jung, Seoul (KR); BoGun Seo, Gyeonggi-do (KR); Kyu-Jin Kim, Seoul (KR); SeungTaek Oh, Seoul (KR); Donggun Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/467,514

(22) Filed: Sep. 14, 2023

(65) Prior Publication Data

US 2024/0257689 A1 Aug. 1, 2024

(30) Foreign Application Priority Data

Jan. 30, 2023 (KR) ........................ 10-2023-0011943

(51) Int. Cl.
*G09G 3/20* (2006.01)
*G09G 3/3225* (2016.01)
*H10K 59/122* (2023.01)
*H10K 59/126* (2023.01)
*H10K 59/40* (2023.01)
(Continued)

(52) U.S. Cl.
CPC ......... *G09G 3/2007* (2013.01); *G09G 3/3225* (2013.01); *G09G 2300/0842* (2013.01); *G09G 2310/0232* (2013.01); *G09G 2320/0233* (2013.01); *G09G 2320/0242* (2013.01); *G09G 2320/0276* (2013.01); *G09G 2330/021* (2013.01); *H10K 59/122* (2023.02); *H10K 59/126* (2023.02); *H10K 59/40* (2023.02); *H10K 59/65* (2023.02); *H10K 59/873* (2023.02)

(58) Field of Classification Search
CPC ............... G09G 3/2007; G09G 3/3225; G09G 2300/0842; G09G 2310/0232; G09G 2320/0233; G09G 2320/0242; G09G 2320/0276; G09G 2330/021; G09G 3/20; G09G 3/36; G09G 2320/0626; G09G 2320/0673; G09G 3/3208; G09G 2300/0465; G09G 2320/0686; H10K 59/122; H10K 59/126; H10K 59/40; H10K 59/65; H10K 59/873; H10K 59/352; H10K 59/353; H10K 59/60; G03B 17/00; G03B 17/48; G03B 30/00; H04N 23/82
See application file for complete search history.

(56) References Cited

U.S. PATENT DOCUMENTS

| | | | |
|---|---|---|---|
| 10,984,723 B1 * | 4/2021 | Zhou | G09G 3/3258 |
| 12,167,635 B2 * | 12/2024 | Oh | G09G 3/3291 |
| 2017/0123454 A1 * | 5/2017 | Evans, V | H10K 50/858 |

(Continued)

*Primary Examiner* — Grant Sitta
(74) *Attorney, Agent, or Firm* — Seed IP Law Group LLP

(57) ABSTRACT

The present disclosure relates to a display device, a gamma correction circuit, and a display driving method that are capable of reducing a level at which a boundary between a normal area and an optical area is perceived by a user by correcting image data based on a gamma curve selected based on an area where a subpixel to which image data is to be supplied is disposed among a first gamma curve for the first driving area, a second gamma curve for the second driving area, and a third gamma curve for the boundary driving area, and outputting corrected image data.

14 Claims, 26 Drawing Sheets

(51) Int. Cl.
*H10K 59/65* (2023.01)
*H10K 59/80* (2023.01)

(56) References Cited

U.S. PATENT DOCUMENTS

| | | | | |
|---|---|---|---|---|
| 2021/0358379 A1* | 11/2021 | Li | ............................ | G09G 3/20 |
| 2022/0068219 A1* | 3/2022 | Yoo | ...................... | G09G 3/3258 |
| 2022/0139336 A1* | 5/2022 | Jeon | ....................... | H10K 59/65 |
| | | | | 345/694 |

* cited by examiner

Left Side View　　　Front View　　　Right Side View

DISPLAY DEVICE, GAMMA CORRECTION CIRCUIT AND DISPLAY DRIVING METHOD

CROSS-REFERENCE TO RELATED APPLICATION

This application claims the priority benefit of Republic of Korea Patent Application No. 10-2023-0011943, filed on Jan. 30, 2023 in the Korean Intellectual Property Office, which is incorporated herein by reference in its entirety.

BACKGROUND

Technical Field

The present disclosure generally relates to electronic devices including display, and more specifically, to a display device, a gamma correction circuit, and a display driving method.

Description of the Related Art

As display technology advances, display devices can provide increased functions, such as an image capture function, a sensing function, and the like, as well as an image display function. To provide these functions, a display device may need to include one or more optical electronic devices, such as a camera, a sensor for detecting an image, and the like.

In order to receive light transmitting through a front surface of a display device, it may be desirable for such an optical electronic device to be located in an area of the display device where incident light coming from the front surface can be increasingly received and detected. To achieve the foregoing, in a typical display device, an optical electronic device has been designed to be located in a front portion of the display device to allow a camera, a sensor, and/or the like as the optical electronic device to be increasingly exposed to incident light. In order to install an optical electronic device in a display device in this manner, a bezel area of the display device may be increased, or a notch or a hole may be needed to be formed in a display area of an associated display panel.

Therefore, as a display device needs an optical electronic device to receive or detect incident light, and perform an intended function, a size of the bezel in the front portion of the display device may be increased, or a substantial disadvantage may be encountered in designing the front portion of the display device.

BRIEF SUMMARY

In addition to the technical problems involved in incorporating an optical electronic device into the display device, the quality of images may also be unexpectedly decreased and the performance of the optical electronic device may be impaired due to structures in the display device. For example, in an instance where the optical electronic device is a camera, image quality acquired by the camera may be decreased.

To address these issues, one or more embodiments of the present disclosure may provide a display device including a transmission and display structure in which one or more optical electronic devices configured to receive light are disposed under, or at a lower portion of, a display panel, and a display area of the display panel (hereinafter, which may be referred to as an optical area) overlapping the one or more optical electronic devices is configured to serve as image displaying as well as a light transmission path.

One or more embodiments of the present disclosure may provide a display device, a gamma correction circuit, and a display driving method that are capable of decreasing a level at which a user perceives a boundary between a normal area and an optical area.

One or more embodiments of the present disclosure may provide a display device, a gamma correction circuit, and a display driving method that are capable of reducing a color difference between a normal area and an optical area perceived by a user.

One or more embodiments of the present disclosure may provide a display device, a gamma correction circuit, and a display driving method that are capable of preventing display artifacts such as luminance disparities at a boundary between a normal area and an optical area.

According to aspects of the present disclosure, a display device can be provided that includes: a substrate including a display area for displaying an image, the display area including a first driving area, a second driving area, and a boundary driving area between the first driving area and the second driving area; and a plurality of pixels including a plurality of first pixels disposed in the first driving area, a plurality of second pixels disposed in the second driving area, and a plurality of third pixels disposed in the boundary driving area.

The number of pixels per unit area in the second driving area may be less than the number of pixels per unit area in the first driving area.

Each of the plurality of first pixels may have a first luminance for a first grayscale according to a first gamma curve, each of the plurality of second pixels may have a second luminance for the first grayscale according to a second gamma curve, and each of the plurality of third pixels may have a third luminance for the first grayscale according to a third gamma curve.

All of the first gamma curve, the second gamma curve, and the third gamma curve may be different from each other, and all of the first luminance, the second luminance, and the third luminance may be different from each other.

The second driving area may include one or more transmissive areas allowing light to be transmitted.

The display device may further include a gamma correction circuit for correcting (e.g., performing digital gamma correction for) image data based on a gamma curve corresponding to a location to which image data is supplied among the first gamma curve, the second gamma curve, and the third gamma curve, and outputting the corrected image data.

According to aspects of the present disclosure, a gamma correction circuit can be provided that includes: an area recognizer configured to recognize an area where a subpixel to which image data is to be supplied is disposed as one of a first driving area, a second driving area, and a boundary driving area between the first driving area and the second driving area; a gamma curve selector configured to select a gamma curve corresponding to the recognized area among a first gamma curve for the first driving area, a second gamma curve for the second driving area, and a third gamma curve for the boundary driving area; and a gamma correction processor configured to correct (e.g., perform digital gamma correction for) the image data based on the selected gamma curve, and output the corrected image data.

When the subpixel to which the image data is to be supplied is included in a plurality of first pixels disposed in the first driving area, the gamma correction processor can correct (e.g., perform digital gamma correction for) the image data according to the first gamma curve, and output the corrected image data.

When the subpixel to which the image data is to be supplied is included in a plurality of second pixels disposed in the second driving area, the gamma correction processor can correct (e.g., perform digital gamma correction for) the image data according to the second gamma curve, and output the corrected image data.

When the subpixel to which the image data is to be supplied is included in a plurality of third pixels disposed in the boundary driving area, the gamma correction processor can multiply the image data by a gain (e.g., a second gain), thereafter correct (e.g., perform digital gamma correction for) adjusted image data resulting from the multiplying according to the third gamma curve, and output the corrected image data.

When the subpixel to which the image data is to be supplied is included in a plurality of fourth pixels disposed in the boundary driving area, the gamma correction processor can multiply the image data by another gain (e.g., a first gain), thereafter correct (e.g., perform digital gamma correction for) adjusted image data resulting from the multiplying according to the third gamma curve, and output the corrected image data.

According to aspects of the present disclosure, a display driving method can be provided that includes: recognizing an area where a subpixel to which image data is to be supplied is disposed as one of a first driving area, a second driving area, and a boundary driving area between the first driving area and the second driving area; and correcting (e.g., performing digital gamma correction for) the image data based on a gamma corresponding to the recognized area among a first gamma for the first driving area, a second gamma for the second driving area, and a third gamma for the boundary driving area.

Among a first luminance at a first grayscale according to the first gamma, a second luminance at the first grayscale according to the second gamma, and a third luminance at the first grayscale according to the third gamma, the second luminance may be the highest, and the third luminance may be higher than the first luminance and lower than the second luminance.

According to one or more embodiments of the present disclosure, a display device may be provided that includes a transmission and display structure in which one or more optical electronic devices required to receive light are disposed under, or at a lower portion of, a display panel, and a display area of the display panel overlapping the one or more optical electronic devices is configured to serve as image displaying, as well as a light transmission path.

According to one or more embodiments of the present disclosure, a display device, a gamma correction circuit, and a display driving method can be provided that are capable of decreasing a level at which a user perceives a boundary between a normal area and an optical area by applying a different gamma for the boundary between the normal area and the optical area.

According to one or more embodiments of the present disclosure, a display device, a gamma correction circuit, and a display driving method can be provided that are capable of reducing a color difference between a normal area and an optical area perceived by a user by using a respective gamma for each area.

According to one or more embodiments of the present disclosure, a display device, a gamma correction circuit, and a display driving method can be provided that are capable of preventing display artifacts such as luminance disparities at a boundary between a normal area and an optical area by designing pixels to be arranged in a same layout at each location in the boundary between the normal area and the optical area.

According to one or more embodiments of the present disclosure, a display device, a gamma correction circuit, and a display driving method can be provided that are capable of reducing power consumption, performing efficient driving, and enabling low-power design by using a respective gamma suitable for each area.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1A:
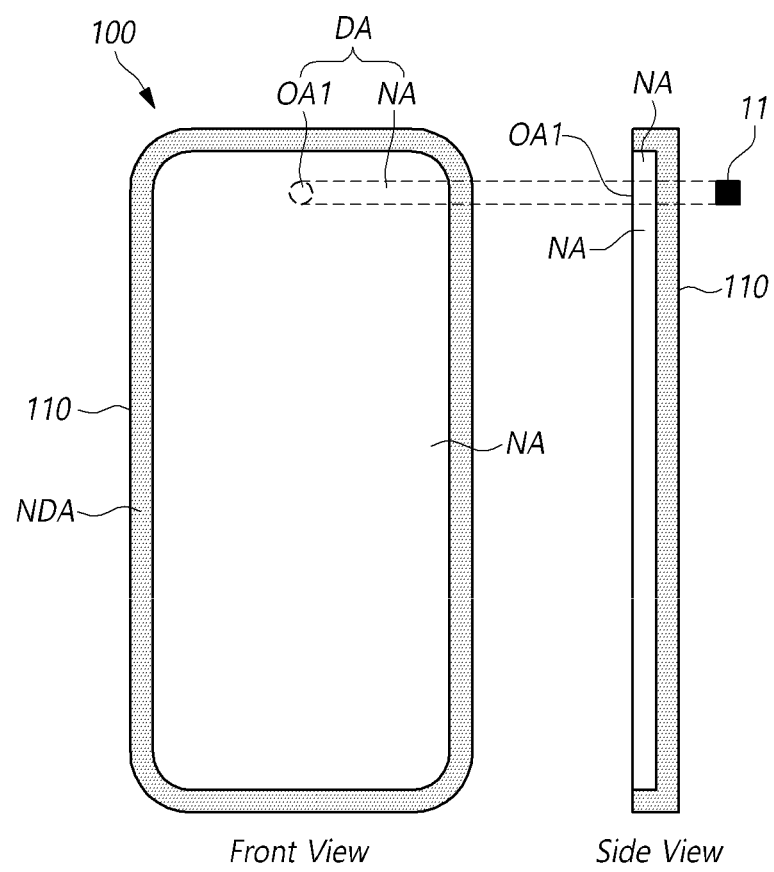
FIGS. 1A, 1B, and 1C illustrate an example display device according to aspects of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Figure 1B:
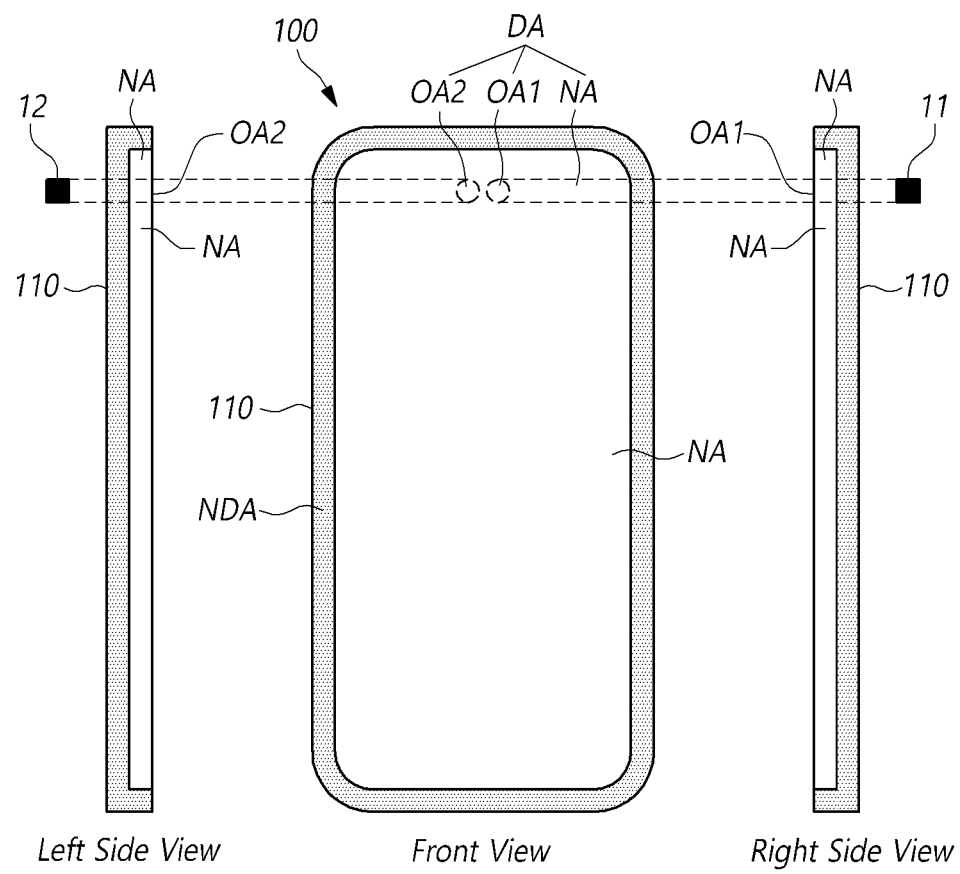
Figure 1C:
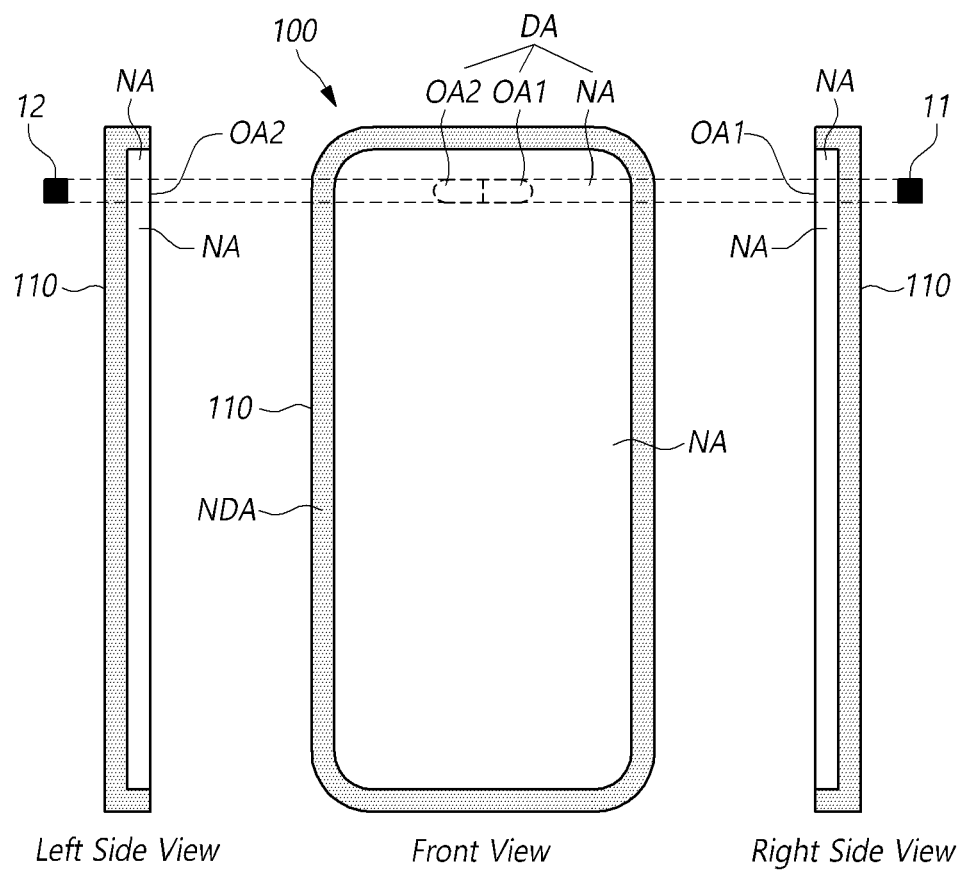

FIGS. 1A, 1B, and 1C illustrate an example display device 100 according to aspects of the present disclosure.

Referring to FIGS. 1A, 1B, and 1C, in one or more embodiments, the display device 100 according to aspects of the present disclosure may include a display panel 110 for displaying one or more images, and one or more optical electronic devices (11 and/or 12). Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which one or more images can be displayed and a non-display area NDA in which an image is not displayed. A plurality of subpixels may be arranged in the display area DA, and several types of signal lines for driving the plurality of subpixels may be arranged therein.

The non-display area NDA may refer to an area outside of the display area DA. Several types of signal lines may be arranged in the non-display area NDA, and several types of driving circuits may be connected thereto. At least a portion of the non-display area NDA may be bent to be invisible from the front surface of the display device 100 or may be covered by a case or housing (not shown) of the display device 100. The non-display area NDA may be also referred to as a bezel or a bezel area.

Referring to FIGS. 1A, 1B, and 1C, in one or more embodiments, in the display device 100 according to aspects of the present disclosure, one or more optical electronic devices (11 and/or 12) may be prepared independently of, and installed in, the display panel 110, and be located under, or in a lower portion of, the display panel 110 (an opposite side of a viewing surface thereof).

Light can enter the front surface (the viewing surface) of the display panel 110, pass through the display panel 110, reach one or more optical electronic devices (11 and/or 12) located under, or in the lower portion of, the display panel 110 (the opposite side of the viewing surface). Light transmitting through the display panel 110 may include, for example, visible light, infrared light, or ultraviolet light.

The one or more optical electronic devices (11 and/or 12) may be devices capable of receiving or detecting light transmitting through the display panel 110 and perform a predefined function based on the received light. For example, the one or more optical electronic devices (11 and/or 12) may include one or more of the following: an image capture device such as a camera (an image sensor), and/or the like; or a sensor such as a proximity sensor, an illuminance sensor, and/or the like. Such a sensor may be, for example, an infrared sensor capable of detecting infrared light.

Referring to FIGS. 1A, 1B, and 1C, in one or more embodiments, the display area DA of the display panel 110 according to aspects of the present disclosure may include one or more optical areas (OA1 and/or OA2) and a normal area NA. Herein, the term "normal area" NA may represent an area that while being present in the display area DA, does not overlap one or more optical electronic devices (11 and/or 12) and may also be referred to as a non-optical area. The one or more optical areas (OA1 and/or OA2) may be one or more areas respectively overlapping the one or more optical electronic devices (11 and/or 12) in a cross-sectional view of the display panel 110.

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In this example, a portion of the normal area NA may be present between the first optical area OA1 and the second optical area OA2. At least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In this example, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In the display panel 110 or the display device 100 according to aspects of the present disclosure, it may be desirable that both an image display structure and a light transmission structure are implemented in the one or more optical areas (OA1 and/or OA2). For example, since the one or more optical areas (OA1 and/or OA2) are portions of the display area DA, it may be therefore desirable that light emitting areas of subpixels for displaying one or more images are disposed in the one or more optical areas (OA1 and/or OA2). Further, to enable light to be transmitted through the one or more optical electronic devices (11 and/or 12), it may be desirable that a light transmission structure is implemented in the one or more optical areas (OA1 and/or OA2).

It should be noted that even though the one or more optical electronic devices (11 and/or 12) are devices that need to receive light, the one or more optical electronic devices (11 and/or 12) may be located on the back of the display panel 110 (e.g., on an opposite side of the viewing surface thereof), and thereby, can receive light that has passed through the display panel 110. For example, the one or more optical electronic devices (11 and/or 12) may not be exposed in the front surface (viewing surface) of the display panel 110 or the display device 100. Accordingly, when a user faces the front surface of the display device 110, the one or more optical electronic devices (11 and/or 12) are located so that they cannot be visible to the user.

The first optical electronic device 11 may be, for example, a camera, and the second optical electronic device 12 may be, for example, a sensor. The sensor may be a proximity sensor, an illuminance sensor, an infrared sensor, and/or the like. In one or more embodiments, the camera may be a camera lens, an image sensor, or a unit including at least one of the camera lens and the image sensor, and the sensor may be an infrared sensor capable of detecting infrared light. In another embodiment, the first optical electronic device 11 may be a sensor, and the second optical electronic device 12 may be a camera.

Hereinafter, for convenience of descriptions related to the optical electronic devices (11 and 12), the first optical electronic device 11 is considered to be a camera, and the second optical electronic device 12 is considered to be an infrared sensor. It should be, however, understood that the scope of the present disclosure includes examples where the first optical electronic device 11 is an infrared sensor, and the second optical electronic device 12 is a camera. The camera may be, for example, a camera lens, an image sensor, or a unit including at least one of the camera lens and the image sensor.

In an example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1 and/or OA2) included in the display area DA in each of FIGS. 1A, 1B, and 1C are areas where images are allowed to be displayed, the normal area NA is an area where a light transmission structure need not be implemented, but the one or more optical areas (OA1 and/or OA2) are areas where a light transmission structure need be implemented. Thus, in one or more embodiments, the normal area NA is an area where a light transmission structure is not implemented or included, and the one or more optical areas (OA1 and/or OA2) are areas in which a light transmission structure is implemented or included.

Accordingly, the one or more optical areas (OA1 and/or OA2) can have a transmittance greater than or equal to a selected or predetermined level, e.g., a relatively high transmittance, and the normal area NA can have a transmittance less than the selected predetermined level or not have light transmittance.

For example, the one or more optical areas (OA1 and/or OA2) may have a resolution, a subpixel arrangement structure, a number of subpixels per unit area, an electrode structure, a line structure, an electrode arrangement structure, a line arrangement structure, and/or the like different from that/those of the normal area NA.

In one embodiment, the number of subpixels per unit area in the one or more optical areas (OA1 and/or OA2) may be less than the number of subpixels per unit area in the normal area NA. For example, the resolution of the one or more optical areas (OA1 and/or OA2) may be lower than that of the normal area NA. In this example, the number of subpixels per unit area may have the same meaning as a resolution, a pixel density, or a degree of integration of pixels. For example, the unit of the number of subpixels per unit area may be pixels per inch (PPI), which represents the number of pixels within 1 inch.

In the examples of FIGS. 1A, 1B, and 1C, the number of subpixels per unit area in the first optical areas OA1 may be less than the number of subpixels per unit area in the normal area NA. In the examples of FIGS. 1B and 1C, the number of subpixels per unit area in the second optical areas OA2 may be greater than or equal to the number of subpixels per unit area in the first optical areas OA1, and be less than the number of subpixels per unit area in the normal area NA.

In one or more embodiments, as a method for increasing respective transmittance of at least one of the first optical area OA1 and the second optical area OA2, a pixel density differentiation design scheme as described above may be applied in which a difference in densities of pixels (or subpixels) or in degrees of integration of pixels (or subpixels) between the first optical area OA1, the second optical area OA2, and the normal area NA can be produced. According to the pixel density differentiation design scheme, in an embodiment, the display panel 110 may be configured or designed such that the number of subpixels per unit area of at least one of the first optical area OA1 and the second optical area OA2 is greater than the number of subpixels per unit area of the normal area NA.

In one or more embodiments, as another method for increasing respective transmittance of at least one of the first optical area OA1 and the second optical area OA2, a pixel size differentiation design scheme may be applied in which a difference in sizes of pixels (or subpixels) between the first optical area OA1, the second optical area OA2, and the normal area NA can be produced. According to the pixel size differentiation design scheme, the display panel PNL may be configured or designed such that while the number of subpixels per unit area of at least one of the first optical area OA1 and the second optical area OA2 is equal to or similar to the number of subpixels per unit area of the normal area NA, a size of each subpixel (e.g., a size of a corresponding light emitting area) disposed in at least one of the first optical area OA1 and the second optical area OA2 is smaller than a size of each subpixel (e.g., a size of a corresponding light emitting area) disposed in the normal area NA.

In one or more aspects, for convenience of description, discussions that follow are provided based on the pixel density differentiation design scheme of the two schemes (e.g., the pixel density differentiation design scheme and the pixel size differentiation design scheme) for increasing respective transmittance of at least one of the first optical area OA1 and the second optical area OA2, unless explicitly stated otherwise. It should be therefore understood that in descriptions that follow, a small number of subpixels per unit area may be considered as corresponding to a small size of subpixel, and a large number of subpixels per unit area may be considered as corresponding to a large size of subpixel.

In the examples of FIGS. 1A, 1B, and 1C, the first optical area OA1 may have various shapes, such as a circle, an ellipse, a quadrangle, a hexagon, an octagon or the like. In the examples of FIGS. 1B and 1C, the second optical area OA2 may have various shapes, such as a circle, an ellipse, a quadrangle, a hexagon, an octagon or the like. The first optical area OA1 and the second optical area OA2 may have the same or substantially or nearly the same shape, or different shapes.

Referring to FIG. 1C, in the example where the first optical area OA1 and the second optical area OA2 contact each other (e.g., directly contact each other), the entire optical area including the first optical area OA1 and the second optical area OA2 may also have various shapes, such as a circle, an ellipse, a quadrangle, a hexagon, an octagon or the like. Hereinafter, for convenience of descriptions related to shapes of the optical areas (OA1 and OA2), each of the first optical area OA1 and the second optical area OA2 is considered to have a circular shape. It should be, however, understood that the scope of the present disclosure includes examples where at least one of the first optical area OA1 and the second optical area OA2 have a shape other than a circular shape.

According to one or more aspects of the present disclosure, when the display device 100 has a structure in which the first optical electronic device 11 such as a camera, and the like is located under, or in a lower portion of, the display panel 100 without being exposed to the outside, such a display device may be referred to as a display in which a under-display camera (UDC) technology is implemented.

The display device 100 in which such an under-display camera (UDC) technology is implemented can provide an advantage of preventing a reduction of an area or size of the display area DA because a notch or a camera hole for exposing a camera need not be formed in the display panel 110. Indeed, since a notch or a camera hole for camera exposure need not be formed in the display panel 110, the display device 100 can provide further advantages of reducing the size of a bezel area, and improving the degree of freedom in design because such limitations to the design are removed.

Although the one or more optical electronic devices (11 and/or 12) are located on the back of (e.g., under, or in a lower portion of) the display panel 110 of the display device 100 (e.g., hidden or not exposed to the outside), it is desirable that the one or more optical electronic devices (11 and/or 12) are able to perform their normal predefined functionalities by receiving or detecting light.

Further, although one or more optical electronic devices (11 and/or 12) are located on the back of (e.g., under, or in a lower portion of) the display panel 110 to be hidden and thus located to overlap the display area DA, it is desirable that the display device 100 is able to normally display one or more images in the one or more optical areas (OA1 and/or OA2) overlapping the one or more optical electronic devices (11 and/or 12) in the display area DA. Thus, even though one or more optical electronic devices (11 and/or 12) are located on the back of the display panel, the display device 100 according to aspects of the present disclosure can be configured to display images in a normal manner (e.g., without reduction in image quality) in the one or more optical areas (OA1 and/or OA2) overlapping the one or more optical electronic devices (11 and/or 12) in the display area DA.

Since the foregoing first optical area OA1 is configured or designed as an optically transmissive area, the quality of image display in the first optical area OA1 may be different from the quality of image display in the normal area NA.

Further, when designing the first optical area OA1 for the purpose of improving the quality of image display, there may be caused a situation that the transmittance of the first optical area OA1 is reduced.

To address these issues, in one or more aspects, the first optical area OA1 included in the display device 100 or the display panel may be configured with, or include, a structure capable of preventing a difference (e.g., non-uniformity) in image quality between the first optical area OA1 and the normal area NA from being caused, and improving the transmittance of the first optical area OA1.

Further, not only the first optical area OA1, but the second optical area OA2 included in the display device 100 or the display panel 110 according to aspects of the present disclosure may be configured with, or include, a structure capable of improving the image quality of the second optical area OA2, and improving the transmittance of the second optical area OA2.

It should be also noted that the first optical area OA1 and the second optical area OA2 included in the display device 100 or the display panel 110 according to aspects of the present disclosure may be differently implemented or have different utilization examples while having a similarity in terms of optically transmissive areas. Taking account of such a distinction, the structure of the first optical area OA1 and the structure of the second optical area OA2 in the display device 100 according to aspects of the present disclosure may be configured or designed differently from each other.

Figure 2:
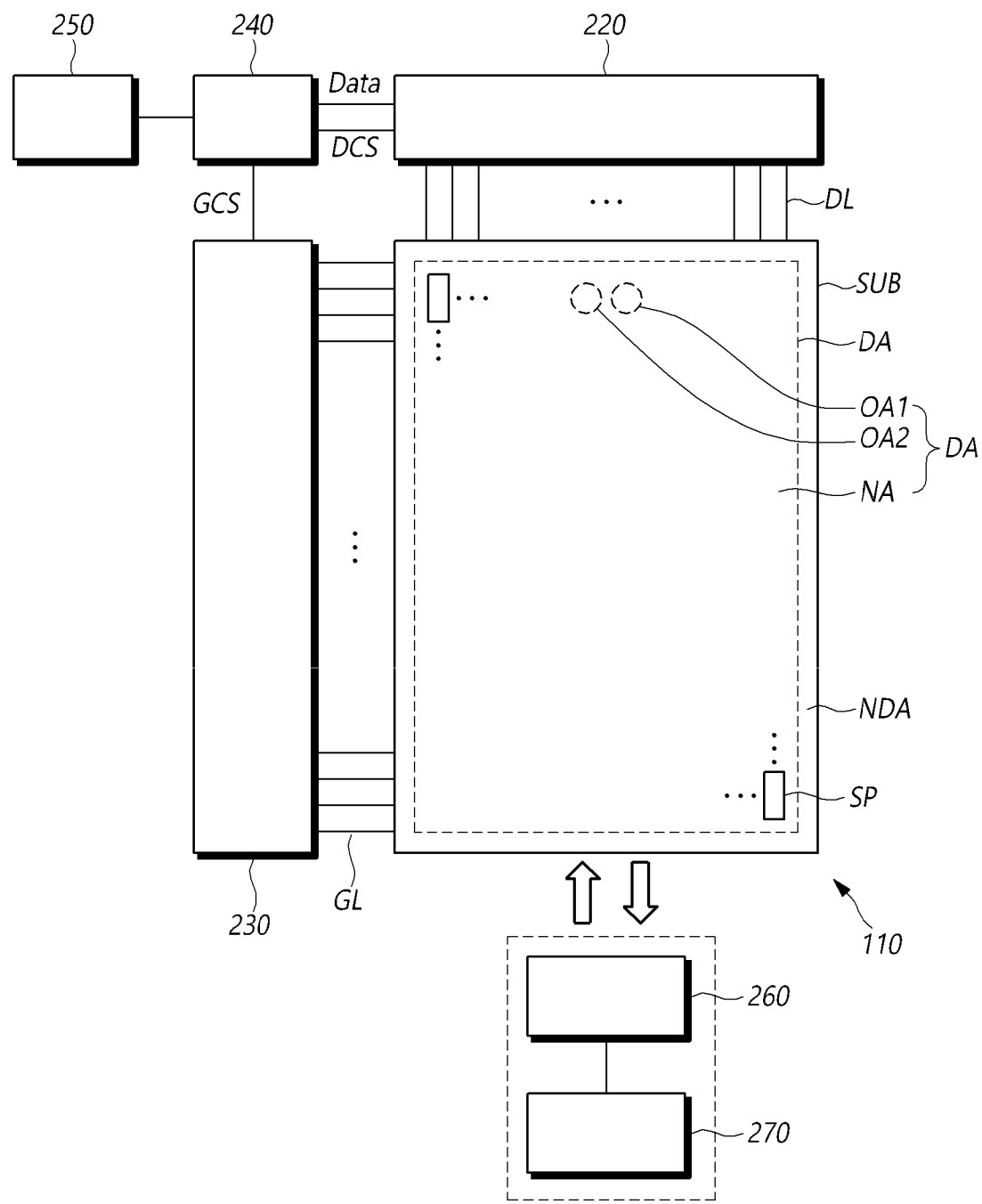
FIG. 2 illustrates an example system configuration of the display device according to aspects of the present disclosure.

FIG. 2 illustrates an example system configuration of the display device 100 according to aspects of the present disclosure.

Referring to FIG. 2, the display device 100 may include the display panel 110 and a display driving circuit as components for displaying one or more images.

The display driving circuit may be a circuit for driving the display panel 110, and include a data driving circuit 220, a gate driving circuit 230, a display controller 240, and other circuit components.

The display panel 110 may include a display area DA in which one or more images can be displayed and a non-display area NDA in which an image is not displayed. The non-display area NDA may be an area outside of the display area DA, and may also be referred to as an edge area or a bezel area. All or at least a portion of the non-display area NDA may be an area visible from the front surface of the display device 100, or an area that is bent and invisible from the front surface of the display device 100. The display panel 110 may include a substrate SUB and a plurality of subpixels SP disposed on the substrate SUB. The display panel 110 may further include various types of signal lines to drive the plurality of subpixels SP.

In one or more embodiments, the display device 100 according to aspects of the present disclosure may be a liquid crystal display device, or the like, or a self-emission display device in which light is emitted from the display panel 110 itself. In examples where the display device 100 according to aspects of the present disclosure is implemented as a self-emission display device, each of the plurality of subpixels SP may include a light emitting element. For example, the display device 100 according to aspects of the present disclosure may be an organic light emitting display device implemented with one or more organic light emitting diodes (OLED). In another example, the display device 100 according to aspects of the present disclosure may be an inorganic light emitting display device implemented with one or more inorganic material-based light emitting diodes. In further another example, the display device 100 according to aspects of the present disclosure may be a quantum dot display device implemented with quantum dots, which are self-emission semiconductor crystals.

The structure of each of the plurality of subpixels SP may be differently configured or designed according to types of the display devices 100. For example, in an example where the display device 100 is a self-emission display device including self-emission subpixels SP, each subpixel SP may include a self-emission light emitting element, one or more transistors, and one or more capacitors.

In one or more embodiments, various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction different from the first direction. For example, the first direction may be a column or vertical direction, and the second direction may be a row or horizontal direction. In another example, the first direction may be the row or horizontal direction, and the second direction may be the column or vertical direction.

The data driving circuit 220 may be a circuit for driving the plurality of data lines DL, and can supply data signals to the plurality of data lines DL. The gate driving circuit 230 may be a circuit for driving the plurality of gate lines GL, and can supply gate signals to the plurality of gate lines GL.

The display controller 240 may be a device for controlling the data driving circuit 220 and the gate driving circuit 230, and can control driving times for the plurality of data lines DL and driving times for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data (which may be referred to as an image signal) from a host system 250 and supply image data Data to the data driving circuit 220 based on the input image data.

For example, an input image data (or an image signal) received by the display controller 240 from the host system 250 may include a red signal value, a green signal value, and a blue signal value.

The data driving circuit 220 can receive digital image data Data from the display controller 240, convert the received image data Data into analog data signals, and output the resulting analog data signals to the plurality of data lines DL.

The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In one or more embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In one or more embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on the substrate, or connected to the substrate. That is, in the case of the GIP type, the gate driving circuit 230 may be disposed in the non-display area NDA of the substrate. In the case of the chip on glass (COG) type, the chip on film (COF) type, or the like, the gate driving circuit 230 may be connected to the substrate.

In one or more embodiments, at least one of the data driving circuit 220 and the gate driving circuit 230 may be disposed in the display area DA of the display panel 110. For example, at least one of the data driving circuit 220 and the gate driving circuit 230 may be disposed such that it does not overlap subpixels SP, or disposed such that it overlaps one or more, or all, of the subpixels SP, or at least respective one or more portions of one or more subpixels.

The data driving circuit 220 may be located in, and/or electrically connected to, but not limited to, only one side or portion (e.g., an upper edge or a lower edge) of the display panel 110. In one or more embodiments, the data driving circuit 220 may be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in, and/or electrically connected to, but not limited to, only one side or portion (e.g., a left edge or a right edge) of the display panel 110. In one or more embodiments, the gate driving circuit 230 may be located in, and/or electrically connected to, but not limited to, two sides or portions (e.g., a left edge and a right edge) of the panel 110 or at least two of four sides or portions (e.g., an upper edge, a lower edge, the left edge, and the right edge) of the panel 110 according to driving schemes, panel design schemes, or the like.

The display controller 240 may be implemented in a separate component from the data driving circuit 220, or incorporated in the data driving circuit 220 and thus implemented in an integrated circuit.

The display controller 240 may be a timing controller used in the typical display technology or a controller or a control device capable of performing other control functions in addition to the function of the typical timing controller. In one or more embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more predefined interfaces. For example, such interfaces may include a low voltage differential signaling (LVDS) interface, an embedded clock point-point interface (EPI), a serial peripheral interface (SPI), and the like.

In one or more embodiments, in order to further provide a touch sensing function, as well as an image display function, the display device 100 according to aspects of the present disclosure may include at least one touch sensor, and a touch sensing circuit capable of detecting whether a touch event occurs by a touch object such as a finger, a pen, or the like, or of detecting a corresponding touch position (or touch coordinates), by sensing the touch sensor.

The touch sensing circuit may include: a touch driving circuit 260 capable of generating and providing touch sensing data by driving and sensing the touch sensor; a touch controller 270 capable of detecting the occurrence of a touch event or detecting a touch position (or touch coordinates) using the touch sensing data; and one or more other components.

The touch sensor may include a plurality of touch electrodes. The touch sensor may further include a plurality of touch lines for electrically connecting the plurality of touch electrodes to the touch driving circuit 260.

The touch sensor may be implemented in the form of a touch panel outside of the display panel 110 or be integrated inside of the display panel 110. In the example where the touch sensor is implemented in the form of the touch panel outside of the display panel 110, such a touch sensor may be referred to as an add-on type. In the example where the add-on type of touch sensor is disposed in the display device 100, the touch panel and the display panel 110 may be separately manufactured and combined in an assembly process. The add-on type of touch panel may include a touch panel substrate and a plurality of touch electrodes on the touch panel substrate.

In the example where the touch sensor is integrated inside of the display panel 110, the touch sensor may be formed on the substrate SUB together with signal lines and electrodes related to display driving during a process of manufacturing the display panel 110.

The touch driving circuit 260 can supply a touch driving signal to at least one of a plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing using the self-capacitance sensing technique, the touch sensing circuit can perform touch sensing based on capacitance between each touch electrode and a touch object (e.g., a finger, a pen, and the like). According to the self-capacitance sensing technique, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing using the mutual-capacitance sensing technique, the touch sensing circuit can perform touch sensing based on capacitance between touch electrodes. According to the mutual-capacitance sensing technique, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may represent, but not limited to, a mobile terminal such as a smart phone, a tablet, or the like, a monitor, a television (TV), or the like. Embodiments of the present disclosure are not limited thereto. In one or more embodiments, the display device 100 may be display devices, or include displays, of various types, sizes, and shapes for displaying information or images.

As described above, the display area DA of the display panel 110 may include the normal area NA and the one or more optical areas (OA1 and/or OA2) as illustrated in FIGS. 1A, 1B, and 1C. The normal area NA and the one or more optical areas (OA1 and/or OA2) may be areas where images can be displayed. It should be noted here that the normal NA may be an area in which a light transmission structure need not be implemented, and the one or more optical areas (OA1 and/or OA2) may be areas in which a light transmission structure need be implemented.

As discussed above with respect to the examples of FIGS. 1A, 1B, and 1C, even though the display area DA of the display panel 110 may include the one or more optical areas (OA1 and/or OA2) together with the normal area NA, for convenience of description, discussions that follow will be provided based on examples where the display area DA includes both the first and second optical areas OA1 and OA2 (e.g., the first optical area OA1 of FIGS. 1A, 1B, and 1C, and the second optical area OA2 of FIGS. 1B and 1C) and the normal area NA (e.g., the normal area NA of FIGS. 1A, 1B, and 1C).

Figure 3:
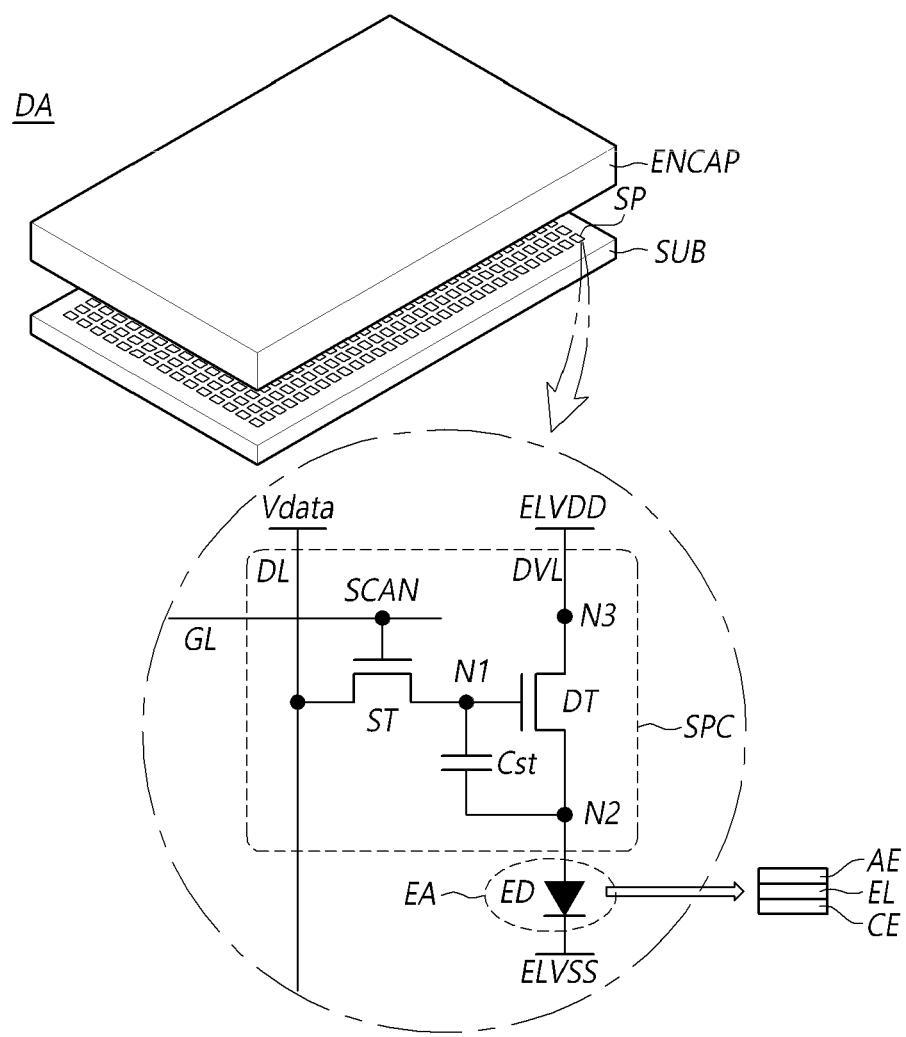
FIG. 3 illustrates an example display panel according to aspects of the present disclosure.

FIG. 3 illustrates an example system configuration of the display device 110 according to aspects of the present disclosure.

Referring to FIG. 3, a plurality of subpixels SP may be disposed in the display area DA of the display panel 110. The plurality of subpixels SP may be disposed in a normal area (e.g., the normal area of FIGS. 1A, 1B, and 1C), a first optical area (e.g., the first optical area OA1 of FIGS. 1A, 1B, and 1C), and a second optical area (e.g., the second optical area OA2 of FIGS. 1B and 1C) included in the display area DA of the display panel 110.

Each of the plurality of subpixels SP may include a light emitting element ED and a pixel circuit SPC configured to drive the light emitting element ED. The pixel circuit SPC may include a driving transistor DT for driving the light emitting element ED, a scan transistor ST for transferring a data voltage Vdata to a first node N1 of the driving transistor DT, a storage capacitor Cst for maintaining a voltage at an approximate constant level during one frame, and the like.

The driving transistor DT may include the first node N1 to which a data voltage is applied, a second node N2 electrically connected to the light emitting element ED, and a third node N3 to which a driving voltage ELVDD through a driving voltage line DVL is applied. In the driving transistor DT, the first node N1 may be a gate node, the second node N2 may be a source node or a drain node, and the third node N3 may be the drain node or the source node. For convenience of description, descriptions that follow will be provided based on examples where the first, second and third nodes (N1, N2 and N3) of the driving transistor DT are gate, source and drain nodes, respectively, unless explicitly stated otherwise. However, it should be understood that the scope of the present disclosure includes examples where the first, second and third nodes (N1, N2 and N3) of the driving transistor DT are gate, drain and source nodes, respectively.

The light emitting element ED may include an anode electrode AE, an emission layer EL, and a cathode electrode CE. The anode electrode AE may represent a pixel electrode disposed in each subpixel SP, and may be electrically connected to the second node N2 of the driving transistor DT of each subpixel SP. The cathode electrode CE may represent a common electrode being disposed in the plurality of subpixels SP in common, and a base voltage ELVSS such as a low-level voltage, a ground voltage, or the like may be applied to the cathode electrode CE.

For example, the anode electrode AE may be a pixel electrode, and the cathode electrode CE may be a common electrode. In another example, the anode electrode AE may be a common electrode, and the cathode electrode CE may be a pixel electrode. For convenience of description, discussions that follow will be provided based on examples where the anode electrode AE is a pixel electrode, and the cathode electrode CE is a common electrode unless explicitly stated otherwise. However, it should be understood that the scope of the present disclosure includes examples where the anode electrode AE is a common electrode, and the cathode electrode CE is a pixel electrode.

The light emitting element ED may include a light emitting area EA having a predetermined size or area. The light emitting area EA of the light emitting element ED may be defined as, for example, an area in which the anode electrode AE, the emission layer EL, and the cathode electrode CE overlap one another.

The light emitting element ED may be, for example, an organic light emitting diode (OLED), an inorganic light emitting diode, a quantum dot light emitting element, or the like. In the example where an organic light emitting diode (OLED) is used as the light emitting element ED, the emission layer EL thereof may include an organic emission layer including an organic material.

The scan transistor ST can be turned on and off by a scan signal SCAN, which is a gate signal applied through a gate line GL, and be electrically connected between the first node N1 of the driving transistor DT and a data line DL.

The storage capacitor Cst may be electrically connected between the first node N1 and the second node N2 of the driving transistor DT.

The pixel circuit SPC may be configured with two transistors (2T: DRT and SCT) and one capacitor (1C: Cst) (which may be referred to as a "2T1C structure") as shown in FIG. 3, and in one or more implementations, may further include one or more transistors, and/or further include one or more capacitors.

In one or more embodiments, the storage capacitor Cst, which may be present between the first node N1 and the second node N2 of the driving transistor DT, may be an external capacitor intentionally configured or designed to be located outside of the driving transistor DT, other than internal capacitors, such as parasitic capacitors (e.g., a gate-to-source capacitance Cgs, a gate-to-drain capacitance Cgd, and the like). Each of the driving transistor DT and the scan transistor ST may be an n-type transistor or a p-type transistor.

Since circuit elements (in particular, a light emitting element ED implemented with an organic light emitting diode including an organic material) included in each subpixel SP are vulnerable to external moisture or oxygen, an encapsulation layer ENCAP may be disposed in the display panel 110 in order to prevent external moisture or oxygen from penetrating into such circuit elements. The encapsulation layer ENCAP may be disposed such that it covers the light emitting element ED.

Hereinafter, for convenience of description, the term "optical area OA" is used instead of distinctly describing the first optical area OA1 and the second optical area OA2 described above. Thus, it should be noted that an optical area described below may represent any one or both of the first and second optical area OA1 and OA2 described above, unless explicitly stated otherwise.

Likewise, for convenience of description, the term "optical electronic device" is used instead of distinctly describing the first optical electronic device 11 and the second optical electronic device 12 described above. Thus, it should be noted that an optical electronic device described below may represent any one or both of the first and second optical electronic device 11 and 12 described above, unless explicitly stated otherwise.

Hereinafter, an example first type of optical area OA will be described with reference to FIGS. 4 to 9, and an example second type of optical area OA will be described with reference to FIGS. 10 to 12.

The first type of optical area OA and the second type of optical area OA are briefly described as follows.

In the case of the first type of optical area OA, one or more pixel circuits SPC for driving one or more light emitting elements ED disposed in the optical area OA may be disposed in an area outside of the optical area OA without being in the optical area OA.

In the case of the second type of optical area OA, one or more pixel circuits SPC for driving one or more light emitting elements ED disposed in the optical area OA may be disposed the optical area OA.

Figure 4:
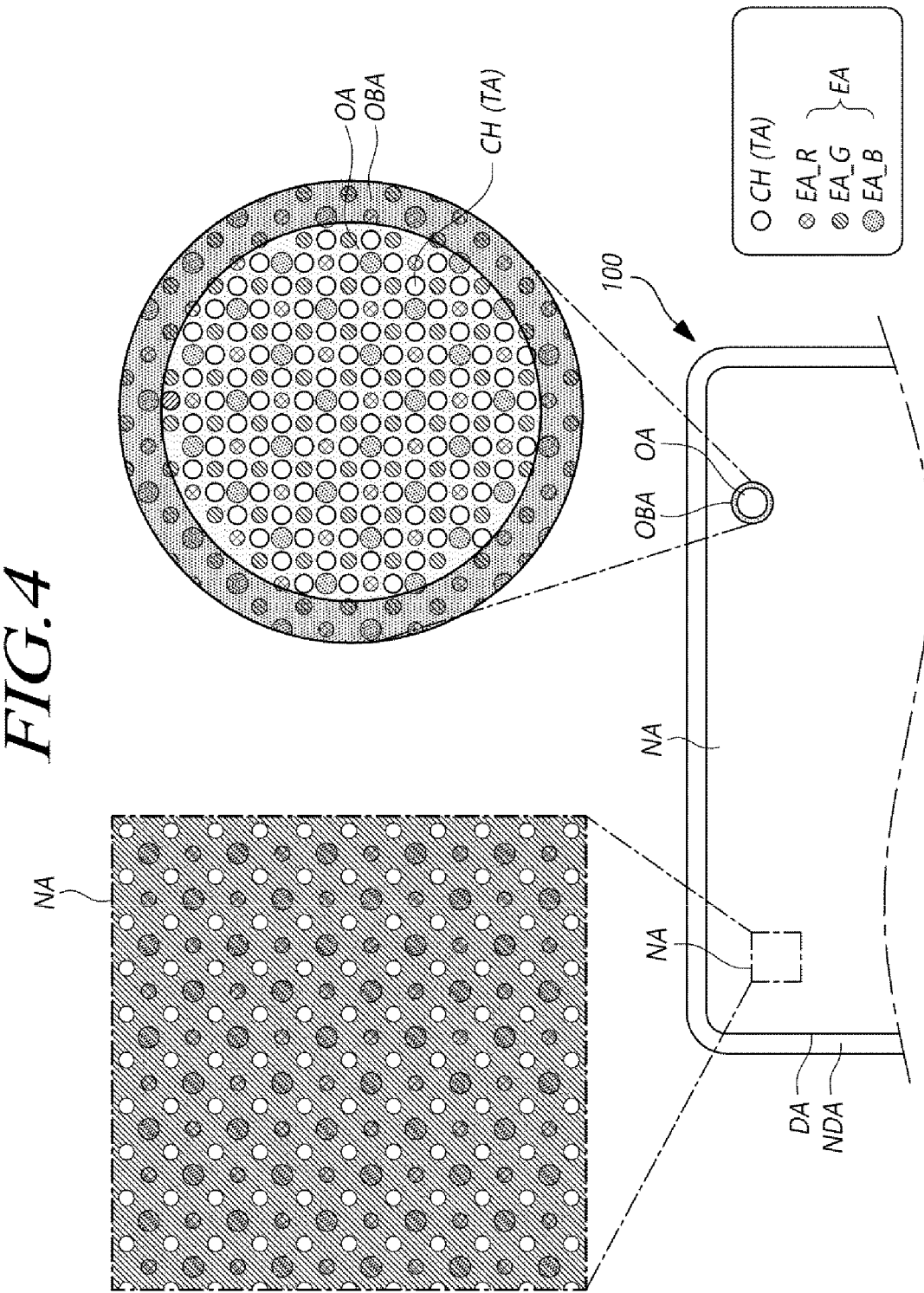
FIG. 4 schematically illustrates an example first type of optical area and an example normal area around the first type of optical area in the display panel according to aspects of the present disclosure.

FIG. 4 schematically illustrates an example first type of optical area OA and an example normal area NA around the first type of optical area OA in the display panel 110 according to aspects of the present disclosure.

Referring to FIG. 4, in one or more embodiments, the display panel 110 according to aspects of the present disclosure may include a display area (e.g., the display area DA of figures described above) where one or more images can be displayed and a non-display area (e.g., the non-display area NDA of figures described above) where an image is not displayed.

Referring to FIG. 4, the display area DA may include an optical area OA through which light can be transmitted, and a normal area NA around the optical area OA. The optical area OA may have the structure of a first type. Thus, in an example where the optical area OA is implemented in the first type, an optical bezel area OBA may be disposed outside of the optical area OA. In one or more embodiments, the optical bezel area OBA may represent a part of the normal area NA.

In other words, when the optical area OA is implemented in the first type, the display area DA may include the optical area OA, the normal area NA located outside of the optical area OA, and the optical bezel area OBA between the optical area OA and the normal area NA.

Referring to FIG. 4, the optical area OA may be an area overlapping an optical electronic device and be a transmissive area through which light used for operation of the optical electronic device can be transmitted. The light transmitting through the optical area OA may include light of a single wavelength band or light of various wavelength bands. For example, the optical area OA may be configured to allow, but not limited to, at least one of visible light, infrared light, ultraviolet light, and the like to be transmitted.

An optical electronic device disposed in the optical area OA can receive light transmitting through the optical area OA and perform a predefined operation using the received light. The light received by the optical electronic device through the optical area OA may include at least one of visible light, infrared light, and ultraviolet light.

For example, in an example where the optical electronic device is a camera, the light used for the predefined operation of the optical electronic device, which has passed through the optical area OA, may include visible light. In another example, in an example where the optical electronic device is an infrared sensor, the light used for the predefined operation of the optical electronic device, which has passed through the optical area OA, may include infrared (also referred to as infrared light).

Referring to FIG. 4, the optical bezel area OBA may represent an area located outside of the optical area OA. The normal area NA may represent an area located outside of the optical bezel area OBA. The optical bezel area OBA may be disposed between the optical area OA and the normal area NA.

For example, the optical bezel area OBA may be disposed outside of only a portion of an edge of the optical area OA, or disposed outside of the entire edge of the optical area OA.

In the example where the optical bezel area OBA is disposed outside of the entire edge of the optical area OA, the optical bezel area OBA may have a ring shape surrounding the optical area OA. For example, the optical area OA may have various shapes such as a circular shape, an elliptical shape, a polygonal shape, an irregular shape, or the like. The optical bezel area OBA may have various ring shapes (e.g., a circular ring shape, an elliptical ring shape, a polygonal ring shape, an irregular ring shape, or the like) surrounding the optical area OA having various shapes.

Referring to FIG. 4, the display area DA may include a plurality of light emitting areas EA. Since the optical area OA, the optical bezel area OBA, and the normal area NA are areas included in the display area DA, each of the optical area OA, the optical bezel area OBA, and the normal area NA may include a plurality of light emitting areas EA.

For example, the plurality of light emitting areas EA may include a first color light emitting area emitting light of a first color, a second color light emitting area emitting light of a second color, and a third color light emitting area emitting light of a third color.

At least one of the first color light emitting area, the second color light emitting area, and the third color light emitting area may have a different area or size from the remaining one or more light emitting areas.

The first color, the second color, and the third color may be different colors from one another, and may be various colors. For example, the first color, second color, and third color may be or include red, green, and blue, respectively.

Hereinafter, for convenience of description, the first color, the second color, and the third color are considered to be red, green, and blue, respectively. However, embodiments of the present disclosure are not limited thereto.

In the example where the first color, the second color, and the third color are red, green, and blue, respectively, an area of a blue light emitting area EA_B may be greater than an area of a red light emitting area EA_R and an area of a green light emitting area EA_G.

A light emitting element ED disposed in the red light emitting area EA_R may include an emission layer EL emitting red light. A light emitting element ED disposed in the green light emitting area EA_G may include an emission layer EL emitting green light. A light emitting element ED disposed in the blue light emitting area EA_B may include an emission layer EL emitting blue light.

An organic material included in the emission layer EL emitting blue light may be more easily degraded in terms of material than respective organic materials included in the emission layer EL emitting red light and the emission layer EL emitting green light.

In one or more embodiments, as the blue light emitting area EA_B is configured or designed to have the largest area or size, current density supplied to the light emitting element ED disposed in the blue light emitting area EA_B may be the least. Therefore, a degradation degree of a light emitting element ED disposed in the blue light emitting area EA_B may be similar to a degradation degree of a light emitting element ED disposed in the red light emitting area EA_R and a degradation degree of a light emitting element ED disposed in the green light emitting area EA_G.

In consequence, a difference in degradation between the light emitting element ED disposed in the red light emitting area EA_R, the light emitting elements ED disposed in the green light emitting area EA_G, and the light emitting elements ED disposed in the blue light emitting area EA_B can be reduced or minimized (or in some cases, eliminated), and therefore, the display device 100 or the display panel 110 according to aspects of the present disclosure can provide an advantage of improving image quality. In addition, as a difference in degradation between the light emitting element ED disposed in the red light emitting area EA_R, the light emitting elements ED disposed in the green light emitting area EA_G, and the light emitting elements ED disposed in the blue light emitting area EA_B is eliminated or reduced, the display device 100 or the display panel 110 according to aspects of the present disclosure can therefore provide an advantage of reducing a difference in lifespan between the light emitting element ED disposed in the red light emitting area EA_R, the light emitting elements ED disposed in the green light emitting area EA_G, and the light emitting elements ED disposed in the blue light emitting area EA_B.

Referring to FIG. 4, it is desirable that the optical area OA, which is an optically transmissive area, has high transmittance. To meet this requirement, a cathode electrode (e.g., the cathode electrode CE of FIG. 3) may include a plurality of cathode holes CH in the optical area OA. That is, in the optical area OA, the cathode electrode CE may include a plurality of cathode holes CH.

Referring to FIG. 4, in one or more embodiments, the cathode electrode CE may not include a cathode hole CH in the normal area NA. That is, in the normal area NA, the cathode electrode CE may not include a cathode hole CH.

In one or more embodiments, the cathode electrode CE may not include a cathode hole CH in the optical bezel area OBA. That is, in the optical bezel area OBA, the cathode electrode CE may not include a cathode hole CH.

In the optical area OA, the plurality of cathode holes CH formed in the cathode electrode CE may be referred to as a plurality of transmissive areas TA or a plurality of openings. Although FIG. 4 illustrates that each cathode hole CH has a respective circular shape, one or more cathode holes CH may have various shapes other than the circular shape, such as an elliptical shape, a polygonal shape, an irregular shape or the like.

Figure 5:
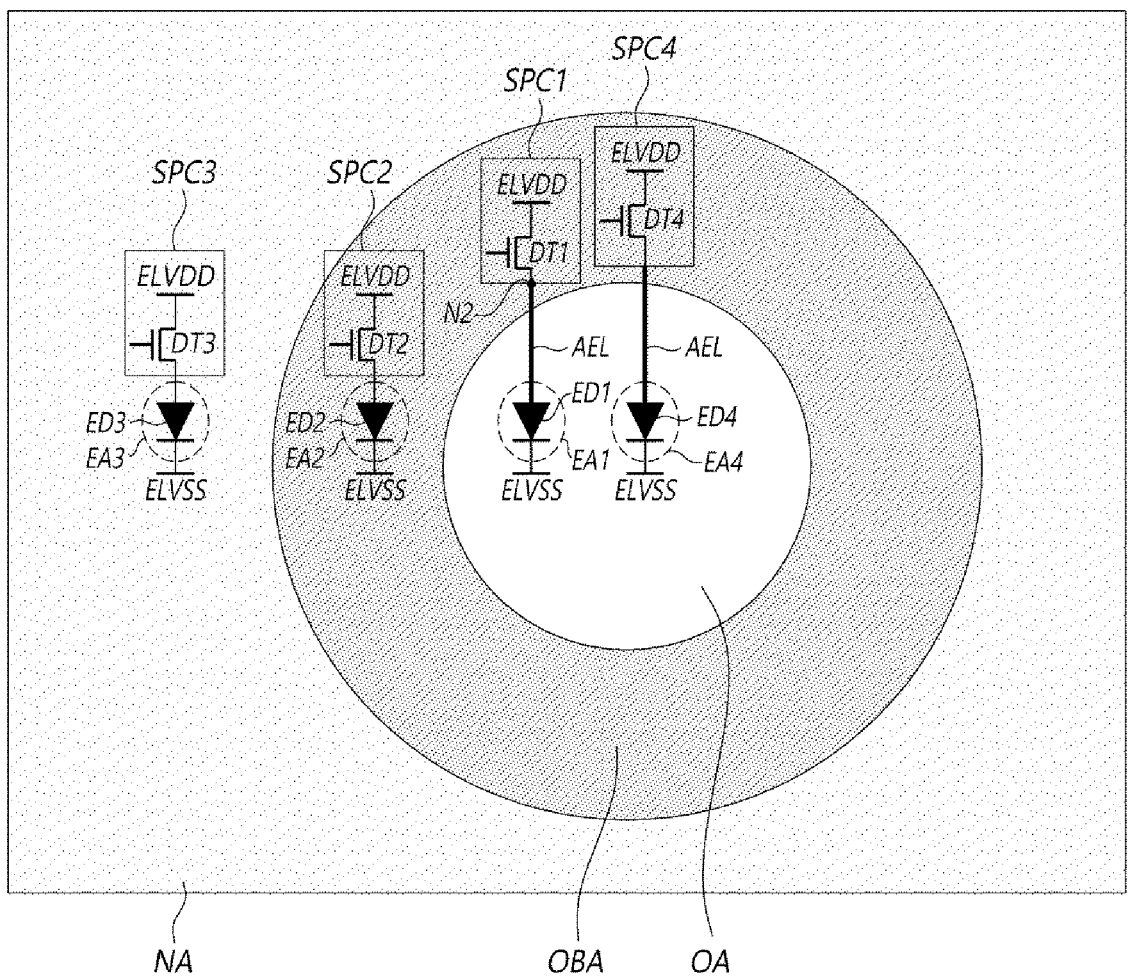
FIGS. 5 and 6 illustrate example light emitting elements and example pixel circuits for driving the light emitting elements, which are disposed in a normal area, an optical bezel area, and an optical area in the display panel according to aspects of the present disclosure.

FIG. 5 illustrates an example configuration of the display panel 110 according to aspects of the present disclosure. As illustrated in FIG. 5, the display panel 110 may include light emitting elements (ED1, ED2, ED3, and ED4) disposed in the normal area NA, the optical bezel area OBA, and the optical area OA, and pixel circuits (SPC1, SPC2, SPC3, and SPC4) for driving the light emitting elements (ED1, ED2, ED3, and ED4).

It should be understood here that each of the pixel circuits (SPC1, SPC2, SPC3, and SPC4) may include transistors (DT and ST), a storage capacitor Cst, and the like as shown in FIG. 3. However, it should be noted that for convenience of explanation, each of the pixel circuits (SPC1, SPC2, SPC3, and SPC4) is simply expressed as only a respective driving transistor (DT1, DT2, DT3, and DT4).

Referring to FIG. 5, the normal area NA, the optical area OA, and the optical bezel area OBA may have structural differences as well as positional differences.

As one example of such structural differences, one or more pixel circuits (SPC1, SPC2, SPC3, and/or SPC4) may be disposed in the optical bezel area OBA and the normal area NA, but a pixel circuit may not be disposed in the optical area OA. For example, the optical bezel area OBA and the normal area NA may be configured to allow one or more transistors (DT1, DT2, DT3, and/or DT4) to be disposed therein, but the optical area OA may be configured not to allow a transistor to be disposed therein.

Transistors and storage capacitors included in the pixel circuits (SPC1, SPC2, SPC3, and SPC4) may be components causing transmittance to be reduced. Thus, since a pixel circuit (e.g., SPC1, SPC2, SPC3, or SPC4) is not disposed in the optical area OA, the transmittance of the optical area OA can be further improved.

In one or more embodiments, although the pixel circuits (SPC1, SPC2, SPC3, and SPC4) may be disposed only in the normal area NA and the optical bezel area OBA, the light emitting elements (ED1, ED2, ED3, and ED4) may be disposed in the normal area NA, the optical bezel area OBA, and the optical area OA.

Referring to FIG. 5, although a first light emitting element ED1 may be disposed in the optical area OA, a first pixel circuit SPC1 for driving the first light emitting element ED1 may not be located in the optical area OA.

Referring to FIG. 5, the first pixel circuit SPC1 for driving the first light emitting element ED1 disposed in the optical area OA may be disposed in the optical bezel area OBA, not in the optical area OA.

Hereinafter, the normal area NA, the optical area OA, and the optical bezel area OBA will be described in more detail.

Referring to FIG. 5, in one or more embodiments, the plurality of light emitting areas EA included in the display panel 110 according to aspects of the present disclosure may include a first light emitting area EA1, a second light emitting area EA2, and a third light emitting area EA3. In these embodiments, the first light emitting area EA1, the second light emitting area EA2, and the third light emitting area EA3 may be included in the optical area OA, the optical bezel area OBA, and the normal area NA, respectively. Hereinafter, it is assumed that the first light emitting area EA1, the second light emitting area EA2, and the third light emitting area EA3 are areas emitting light of a same color.

Referring to FIG. 5, in one or more embodiments, the display panel 110 according to aspects of the present disclosure may include: a first light emitting element ED1 disposed in the optical area OA1 and having the first light emitting area EA1; a second light emitting element ED2 disposed in the optical bezel area OBA1 and having the second light emitting area EA2; and a third light emitting element ED3 disposed in the normal area NA and having the third light emitting area EA3.

Referring to FIG. 5, in one or more embodiments, the display panel 110 according to aspects of the present disclosure may further include a first pixel circuit SPC1 configured to drive the first light emitting element ED1, a second pixel circuit SPC2 configured to drive the second light emitting element ED2, and a third pixel circuit SPC3 configured to drive the third light emitting element ED3.

Referring to FIG. 5, the first pixel circuit SPC1 may include a first driving transistor DT1. The second pixel circuit SPC2 may include a second driving transistor DT2. The third pixel circuit SPC3 may include a third driving transistor DT3.

Referring to FIG. 5, in one or more embodiments, in the display panel 110 according to aspects of the present disclosure, the second pixel circuit SPC2 may be located in the optical bezel area OBA where the second light emitting element ED2 corresponding to the second pixel circuit SPC2 is disposed, and the third pixel circuit SPC3 may be located in the normal area NA where the third light emitting element ED3 corresponding to the third pixel circuit SPC3 is disposed.

Referring to FIG. 5, in one or more embodiments, in the display panel 110 according to aspects of the present disclosure, the first pixel circuit SPC1 may not be located in the optical area OA where the first light emitting element ED1 corresponding to the first pixel circuit SPC1 is disposed. Instead, the first pixel circuit SPC1 may be located in the optical bezel area OBA located outside of the optical area OA. As a result, the transmittance of the optical area OA can be improved.

Referring to FIG. 5, in one or more embodiments, the display panel 110 according to aspects of the present disclosure may further include an anode extension line AEL electrically connecting the first light emitting element ED1 disposed in the optical area OA to the first pixel circuit SPC1 disposed in the optical bezel area OBA.

The anode extension line AEL may electrically extend or connect an anode electrode AE of the first light emitting element ED1 to a second node N2 of the first driving transistor DT1 in the first pixel circuit SPC1.

As described above, in the display panel 110 according to aspects of the present disclosure, the first pixel circuit SPC1 for driving the first light emitting element ED1 disposed in the optical area OA may be disposed in the optical bezel area OBA, not in the optical area OA. Such configuration or structure may be referred to as an anode extension structure. Likewise, the first type of the optical area OA may be also referred to as an anode extension type.

In an embodiment where the display panel 110 according to aspects of the present disclosure has such an anode extension structure, all or at least a portion of the anode extension line AEL may be disposed in optical area OA, and the anode extension line AEL may include a transparent material, or be a transparent line or include a transparent line. Accordingly, even when the anode extension line AEL for connecting the first pixel circuit SPC1 to the first light emitting element ED1 is disposed in the optical area OA, the display device or the display panel 110 according to aspects of the present disclosure can prevent the transmittance of the optical area OA from being reduced.

Referring to FIG. 5, a plurality of light emitting areas EA may further include a fourth light emitting area EA4 emitting light of the same color as the first light emitting area EA1 and included in the optical area OA.

Referring to FIG. 5, the fourth light emitting area EA4 may be disposed adjacent to the first light emitting area EA1 in a row direction or a column direction.

Referring to FIG. 5, in one or more embodiments, the display panel 110 according to aspects of the present disclosure may further include a fourth light emitting element ED4 disposed in the optical area OA and having the fourth light emitting area EA4, and a fourth pixel circuit SPC4 configured to drive the fourth light emitting element ED4.

Referring to FIG. 5, the fourth pixel circuit SPC4 may include a fourth driving transistor DT4. For convenience of description, a scan transistor ST and a storage capacitor Cst included in the fourth pixel circuit SPC4 are omitted from FIG. 5.

Referring to FIG. 5, although the fourth pixel circuit SPC4 is a circuit for driving the fourth light emitting element ED4 disposed in the optical area OA, the fourth pixel circuit SPC4 may be disposed in the optical bezel area OBA.

Referring to FIG. 5, in one or more embodiments, the display panel 110 according to aspects of the present disclosure may further include an anode extension line AEL for electrically connecting the fourth light emitting element ED4 to the fourth pixel circuit SPC4.

All or at least a portion of the anode extension line AEL may be disposed in the optical area OA, and the anode extension line AEL may include a transparent material, or be a transparent line or include a transparent line.

As described above, the first pixel circuit SPC1 disposed in the optical bezel area OBA may be configured to drive one light emitting element ED1 disposed in the optical area OA. Such a circuit connection scheme may be referred to as a one-to-one (1:1) circuit connection scheme.

As a result, the number of pixel circuits SPC disposed in the optical bezel area OBA may be increased significantly. Further, the structure of the optical bezel area OBA may become complicated, and an open area of the optical bezel area OBA may be reduced. Herein, the open area may be referred to as a light emitting area, and may also be referred to as an open ratio or an aperture ratio.

In order to increase an open area of the optical bezel area OBA while having an anode extension structure, in one or more embodiments, the display device 100 according to aspects of the present disclosure may be configured in a 1:N (where N is 2 or more) circuit connection scheme.

According to the 1:N circuit connection scheme, the first pixel circuit SPC1 disposed in the optical bezel area OBA may be configured to drive two light emitting elements ED disposed in the optical area OA concurrently or together.

Figure 6:
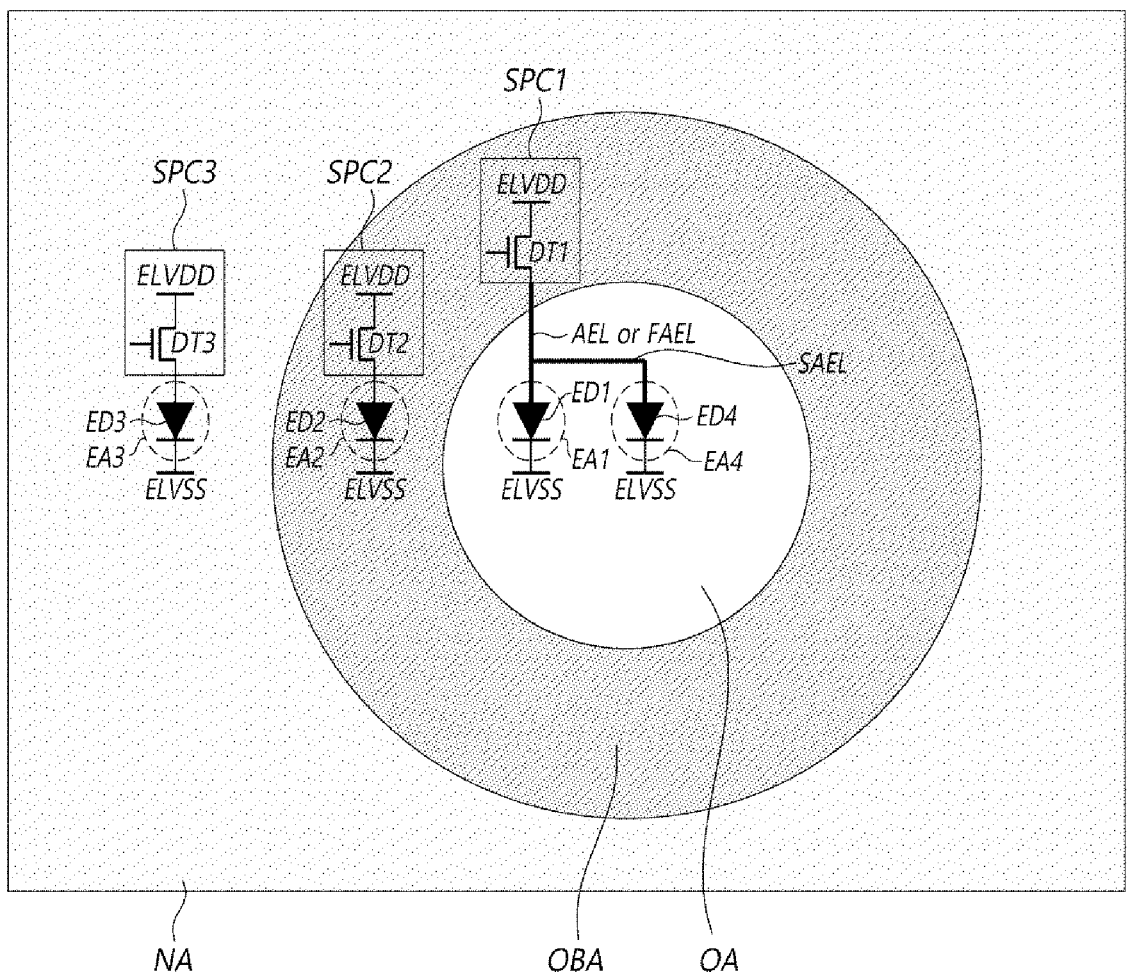

FIG. 6 illustrates a 1:2 circuit connection scheme as an example for convenience of description. In this example, a first pixel circuit SPC1 disposed in the optical bezel area OBA may be configured to drive two or more light emitting elements (ED1 and ED4) disposed in the optical area OA concurrently or together.

In one or more embodiments, referring to FIG. 6, light emitting elements (ED1, ED2, ED3, and ED4) disposed in the normal area NA, the optical bezel area OBA, and the optical area OA, and pixel circuits (SPC1, SPC2, and SPC3) for driving the light emitting elements (ED1, ED2, ED3, and ED4) may be disposed in the display panel 110.

Referring to FIG. 6, a fourth light emitting element ED4 disposed in the optical area OA can be driven by the first pixel circuit SPC1 for driving a first light emitting element ED1 located in the optical area OA. That is, the first pixel circuit SPC1 disposed in the optical bezel area OBA may be configured to drive the first light emitting element ED1 and the fourth light emitting element ED4 disposed in the optical area OA together or substantially concurrently.

Accordingly, even when the display panel 110 has an anode extension structure, the number of pixel circuits SPC disposed in the optical bezel area OBA can be significantly reduced, and thereby, an open area and a light emitting area of the optical bezel area OBA can be increased.

In the example of FIG. 6, the first light emitting element ED1 and the fourth light emitting element ED4 driven together by the first pixel circuit SPC1 disposed in the optical bezel area OBA may be light emitting elements that emit light of a same color, and are adjacent to each other in a row direction or a column direction.

Referring to FIG. 6, an anode extension line AEL may connect the first light emitting element ED1 and the fourth light emitting element ED4 disposed in the optical area OA to the first pixel circuit SPC1 disposed in the optical bezel area OBA. In particular, the anode extension line AEL extending from the first light emitting element ED1 to the first pixel circuit SPC1 disposed in the optical bezel area OBA may be referred to as a first anode extension line FAEL. A separate second anode extension line SAEL may extend from the first anode extension line FAEL to connect with the fourth light emitting element ED4 disposed in the optical area OA. As shown, the second anode extension line SAEL is also electrically connected to the first pixel circuit SPC1.

In one embodiment, the second anode extension line SAEL fully overlaps the optical area OA.

In one embodiment, the node that intersects with the first anode extension line FAEL and the second anode extension line SAEL may be located in the optical area OA. However, the embodiments of the present disclosure is not limited to those shown in FIG. 6. In another embodiment, the electrical connection between the first anode extension line FAEL and the second anode extension line SAEL may be made in the optical bezel area OBA.

Figure 7:
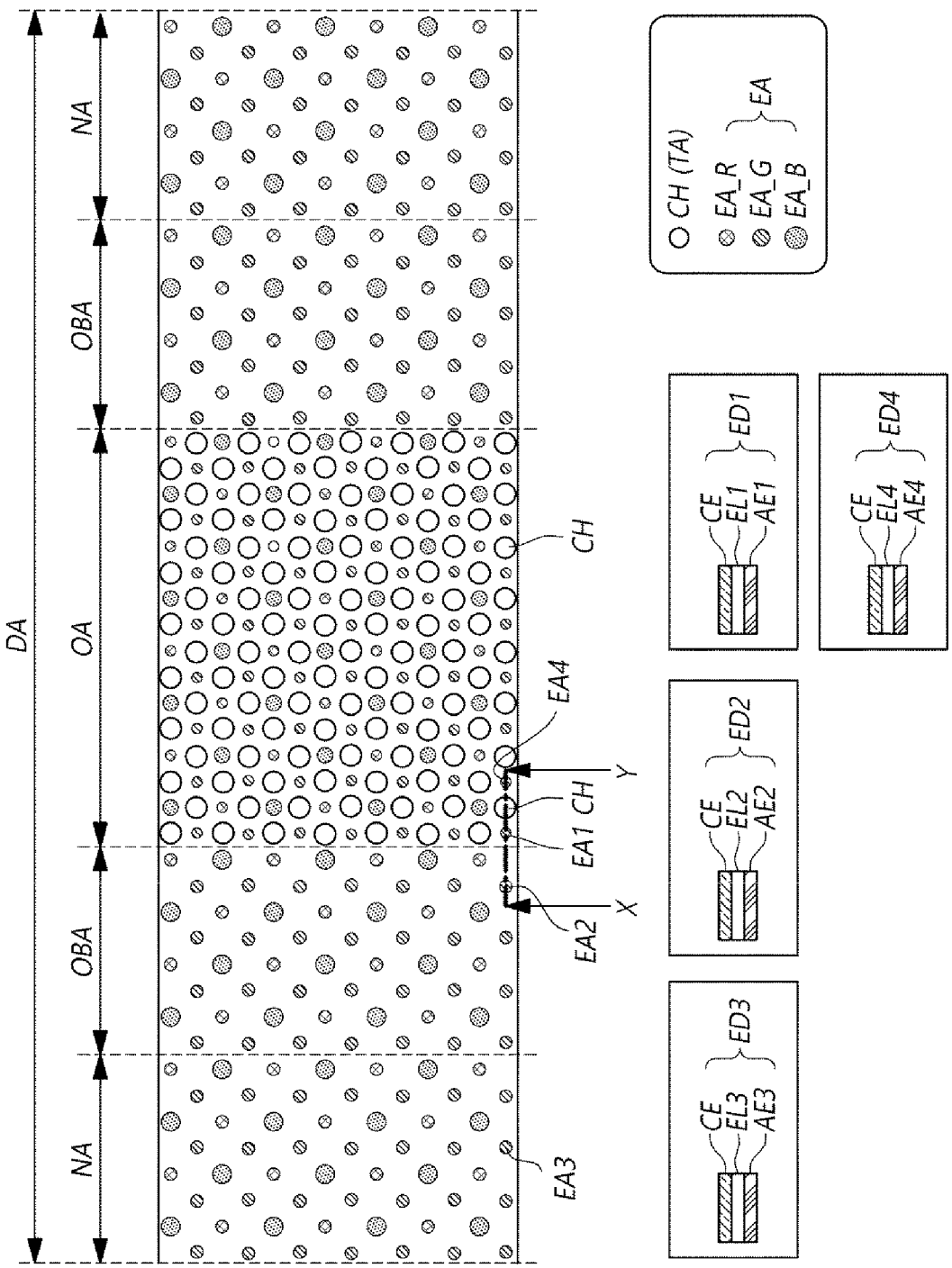
FIG. 7 is an example plan view of the normal area, the optical bezel area, and the optical area included in the display panel according to aspects of the present disclosure.

FIG. 7 is an example plan view of the normal area NA, the optical bezel area OBA, and the optical area OA in the display panel 110 according to aspects of the present disclosure.

Referring to FIG. 7, in one or more embodiments, in the display panel 110 according to aspects of the present disclosure, a plurality of light emitting areas EA disposed in each of the normal area NA, the optical bezel area OBA, and the optical area OA may include a red light emitting area EA_R, a green light emitting area EA_G, and a blue light emitting area EA_B.

Referring to FIG. 7, in one or more embodiments, in the display panel 110 according to aspects of the present disclosure, a cathode electrode (e.g., the cathode electrode CE of FIG. 3) may be commonly disposed in the normal area NA, the optical bezel area OBA, and the optical area OA.

The cathode electrode CE may include a plurality of cathode holes CH, and the plurality of cathode holes CH of the cathode electrode CE may be disposed in the optical area OA.

The normal area NA and the optical bezel area OBA may be areas through which light cannot be transmitted, and the optical area OA may be an area through which light can be transmitted. Accordingly, the transmittance of the optical area OA may be higher than respective transmittance of the optical bezel area OBA and the normal area NA.

All of the optical area OA may be an area through which light can be transmitted, and the plurality of cathode holes CH of the optical area OA may be transmissive areas TA through which light can be transmitted more effectively. For example, the remaining area except for the plurality of cathode holes CH in the optical area OA may be an area through which light can be transmitted, and respective transmittance of the plurality of cathode holes CH in the optical area OA may be higher than the transmittance of the remaining area except for the plurality of cathode holes (CH) in the optical area OA.

In another example, the plurality of cathode holes CH in the optical area OA may be transmissive areas TA through which light can be transmitted, and the remaining area except for the plurality of cathode holes CH in the optical area OA may be an area through which light cannot be transmitted.

Referring to FIG. 7, the arrangement of light emitting areas EA in the optical area OA, the arrangement of light emitting areas EA in the optical bezel area OBA, and the arrangement of light emitting areas EA in the normal area NA may be the same as one another.

Referring to FIG. 7, a plurality of light emitting areas EA may include a first light emitting area EA1 included in the optical area OA, a second light emitting area EA2 included in the optical bezel area OBA and emitting light of the same color as the first light emitting area EA1, and a third light emitting area EA3 included in the normal area NA and emitting light of the same color as the first light emitting area EA1.

Referring to FIG. 7, the plurality of light emitting areas EA may further include a fourth light emitting area EA4 included in the optical area OA and emitting light of the same color as the first light emitting area EA1.

Referring to FIG. 7, in one or more embodiments, the display panel 110 according to aspects of the present disclosure may include a first anode electrode AE1 disposed in the optical area OA, a second anode electrode AE2 disposed in the optical bezel area OBA, a third anode electrode AE3 disposed in the normal area NA, and a fourth anode electrode AE4 disposed in the optical area OA.

In one or more embodiments, the display panel 110 according to aspects of the present disclosure may further include a cathode electrode (e.g., the cathode electrode CE in FIG. 3) commonly disposed in the normal area NA, the optical bezel area OBA, and the optical area OA.

In one or more embodiments, the display panel 110 according to aspects of the present disclosure may include a first emission layer EL1 disposed in the optical area OA, a second emission layer EL2 disposed in the optical bezel area OBA, a third emission layer EL3 disposed in the normal area NA, and a fourth emission layer EL4 disposed in the optical area OA.

The first to fourth emission layers EL4 may be emission layers emitting light of a same color. In these embodiments, the first to fourth emission layers EL1 to EL4 may be disposed as separate emission layers or be integrated into a single emission layer.

Referring to FIG. 7, light emitting elements of the display panel 110 according to aspects of the present disclosure may be configured such that: the first light emitting element ED1 is configured with the first anode electrode AE1, the first emission layer EL1, and the cathode electrode CE; the second light emitting element ED2 is configured with the second anode electrode AE2, the second emission layer EL2, and the cathode electrode CE; the third light emitting element ED3 is configured with the third anode electrode AE3, the third emission layer EL3, and the cathode electrode CE; and the fourth light emitting element ED4 is configured with the fourth anode electrode AE4, the fourth emission layer EL4, and the cathode electrode CE.

Hereinafter, a cross-sectional structure taken along line X-Y of FIG. 7 will be discussed in more detail with reference to FIGS. 8 and 9.

A portion indicated by line X-Y in FIG. 7 includes a portion of the optical bezel area OBA1 and a portion of the optical area OA1 with respect to the boundary between the optical bezel area OBA1 and the optical area OA1.

The portion indicated by line X-Y in FIG. 7 may include the first light emitting area EA1 and the fourth light emitting area EA4 included in the optical area OA, and the second light emitting area EA2 included in the optical bezel area OBA. The first light emitting area EA1, the fourth light emitting area EA4, and the second light emitting area EA2 may represent light emitting areas EA emitting light of a same color.

Figure 8:
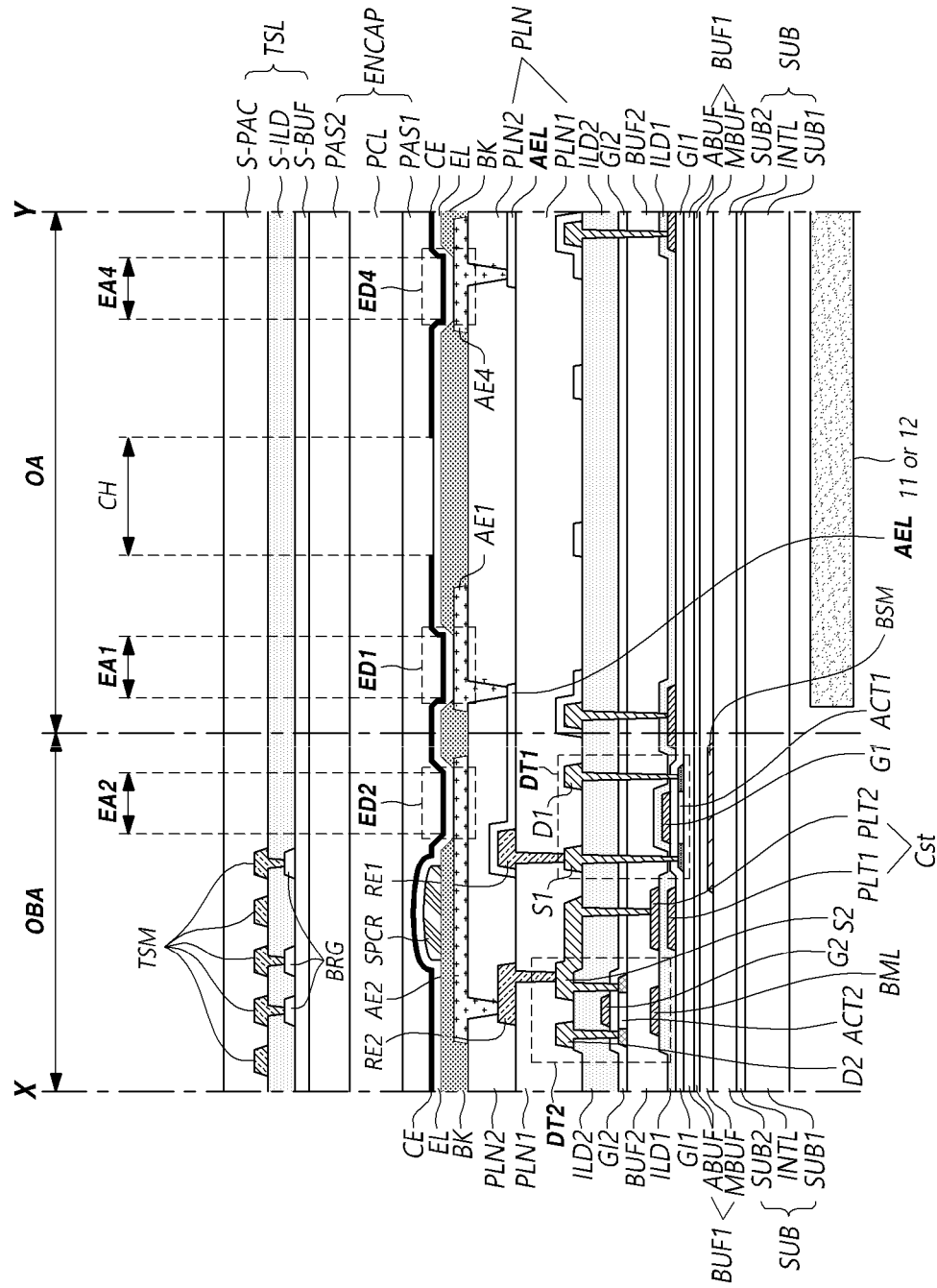
FIGS. 8 and 9 are example cross-sectional views of the display panel according to aspects of the present disclosure, and cross-sectional views of the optical bezel area and the optical area of the display panel.

FIG. 8 illustrates an example cross-sectional view of the display panel 110 according to aspects of the present disclosure, and more specifically, illustrates example cross-sectional views in the optical bezel area OBA and the optical area OA of the display panel 110. It should be noted here that FIG. 8 illustrates cross-sectional views based on the application of a 1:1 circuit connection scheme, as in FIG. 5.

Referring to FIG. 8, in terms of stackup configuration, the display panel 110 may include a transistor forming part, a light emitting element forming part, and an encapsulation part.

The transistor forming part may include a substrate SUB, a first buffer layer BUF1 on the substrate SUB, various types of transistors DT1 and DT2 formed on the first buffer layer BUF, a storage capacitor Cst, and various electrodes and signal lines.

The substrate SUB may include, for example, a first substrate SUB1 and a second substrate SUB2, and may include an intermediate layer INTL interposed between the first substrate SUB1 and the second substrate SUB2. In this example, the intermediate layer INTL may be an inorganic layer and can serve to prevent moisture permeation.

A lower shield metal BSM may be disposed over the substrate SUB. The lower shield metal BSM may be located under a first active layer ACT1 of a first driving transistor DT1.

The first buffer layer BUF1 may include a stack of a single layer or a stack of multiple layers. In an example where the first buffer layer BUF1 includes a stack of multilayer, the first buffer layer BUF1 may include a multi-buffer layer MBUF and an active buffer layer ABUF.

Various types of transistors (DT1, DT2, and the like), at least one storage capacitor Cst, and various electrodes or signal lines may be disposed on the first buffer layer BUF1.

For example, the transistors DT1 and DT2 formed on the first buffer layer BUF1 may include a same material, and be located in one or more same layers. In another example, as shown in FIG. 8, the first driving transistor DT1 and a second driving transistor DT2 among the transistors (DT1, DT2, and the like) may include different materials and be located in different layers.

Referring to FIG. 8, the first driving transistor DT1 may represent a driving transistor DT for driving the first light emitting element ED1 included in the optical area OA, and the second driving transistor DT2 may represent a driving transistor DT for driving the second light emitting element ED2 included in the optical bezel area OBA.

For example, the first driving transistor DT1 may represent a driving transistor included in the first pixel circuit SPC1 for driving the first light emitting element ED1 included in the optical area OA, and the second driving transistor DT2 may represent a driving transistor included in the second pixel circuit SPC2 for driving the second light emitting element ED2 included in the optical bezel area OBA.

Stackup configurations of the first driving transistor DT1 and the second driving transistor DT2 will be described below.

The first driving transistor DT1 may include the first active layer ACT1, a first gate electrode G1, a first source electrode S1, and a first drain electrode D1.

The second driving transistor DT2 may include a second active layer ACT2, a second gate electrode G2, a second source electrode S2, and a second drain electrode D2.

The second active layer ACT2 of the second driving transistor DT2 may be located in a higher location in the stackup configuration than the first active layer ACT1 of the first driving transistor DT1.

The first buffer layer BUF1 may be disposed under the first active layer ACT1 of the first driving transistor DT1, and the second buffer layer BUF2 may be disposed under the second active layer ACT2 of the second driving transistor DT2.

For example, the first active layer ACT1 of the first driving transistor DT1 may be located on the first buffer layer BUF1, and the second active layer ACT2 of the second driving transistor DT2 may be located on the second buffer layer BUF2. In this case, the second buffer layer BUF2 may be placed in a higher location than the first buffer layer BUF.

The first active layer ACT1 of the first driving transistor DT1 may be disposed on the first buffer layer BUF1, and a first gate insulating layer GI1 may be disposed on the first active layer ACT1 of the first driving transistor DT1. The first gate electrode G1 of the first driving transistor DT1 may be disposed on the first gate insulating layer GI1, and a first interlayer insulating layer ILD1 may be disposed on the first gate electrode G1 of the first driving transistor DT1.

In this implementation, the first active layer ACT1 of the first driving transistor DT1 may include a first channel region overlapping the first gate electrode G1, a first source connection region located on one side of the first channel region, and a first drain connection region located on the other side of the first channel region.

The second buffer layer BUF2 may be disposed on the first interlayer insulating layer ILD1.

The second active layer ACT2 of the second driving transistor DT2 may be disposed on the second buffer layer BUF2, and a second gate insulating layer GI2 may be disposed on the second active layer ACT2. The second gate electrode G2 of the second driving transistor DT2 may be disposed on the second gate insulating layer GI2, and a second interlayer insulating layer ILD2 may be disposed on the second gate electrode G2.

In this implementation, the second active layer ACT2 of the second driving transistor DT2 may include a second channel region overlapping the second gate electrode G2, a second source connection region located on one side of the second channel region, and a second drain connection region located on the other side of the second channel region.

The first source electrode S1 and the first drain electrode D1 of the first driving transistor DT1 may be disposed on the second interlayer insulating layer ILD2. The second source electrode S2 and the second drain electrode D2 of the second driving transistor DT2 may be also disposed on the second interlayer insulating layer ILD2.

The first source electrode S1 and the first drain electrode D1 of the first driving transistor DT1 may be respectively connected to the first source connection region and the first drain connection region of the first active layer ACT1 through through-holes formed in the second interlayer insulating layer ILD2, the second gate insulating layer GI2, the second buffer layer BUF2, the first interlayer insulating layer ILD1, and the first gate insulating layer GI1.

The second source electrode S2 and the second drain electrode D21 of the second driving transistor DT2 may be respectively connected to the second source connection region and the second drain connection region of the second active layer ACT2 through through-holes formed in the second interlayer insulating layer ILD2 and the second gate insulating layer GI2.

It should be understood that FIG. 8 illustrates only the second driving transistor DT2 and a storage capacitor Cst among circuit components included in the second pixel circuit SPC2, and other components such as one or more transistors, and the like are omitted. It should be also understood that FIG. 8 illustrates only the first driving transistor DT1 among circuit components included in the first pixel circuit SPC1, and other components such as one or more transistors, a storage capacitor, and the like are omitted.

Referring to FIG. 8, the storage capacitor Cst included in the second pixel circuit SPC2 may include a first capacitor electrode PLT1 and a second capacitor electrode PLT2.

The first capacitor electrode PLT1 may be electrically connected to the second gate electrode G2 of the second driving transistor DT2, and the second capacitor electrode PLT2 may be electrically connected to the second source electrode S2 of the second driving transistor DT2.

In one or more embodiments, referring to FIG. 8, a lower metal BML may be disposed under the second active layer ACT2 of the second driving transistor DT2. This lower metal BML may overlap all or at least a portion of the second active layer ACT2.

The lower metal BML may be electrically connected to, for example, the second gate electrode G2. In another example, the lower metal BML can serve as a light shield for shielding light traveling from a lower location than the lower metal BML. In this implementation, the lower metal BML may be electrically connected to the second source electrode S2.

Even though the first driving transistor DT1 is a transistor for driving the first light emitting element ED1 disposed in the optical area OA, the first driving transistor DT1 may be disposed in the optical bezel area OBA, not the optical area OA.

The second driving transistor DT2, which is a transistor for driving the second light emitting element ED2 disposed in the optical bezel area OBA, may be disposed in the optical bezel area OBA.

Referring to FIG. 8, the display panel 110 may include at least one planarization layer PLN disposed on the first driving transistor DT1 and the second driving transistor DT2.

Referring to FIG. 8, for example, the at least one planarization layer PLN may include a first planarization layer PLN1. For example, the first planarization layer PLN1 may be disposed on the first source electrode S1 and the first drain electrode D1 of the first driving transistor DT1 and the second source electrode S2 and the second drain electrode D2 of the second driving transistor DT2.

Referring to FIG. 8, a first relay electrode RE1 and a second relay electrode RE2 may be disposed on the first planarization layer PLN1.

The first relay electrode RE1 may represent an electrode for relaying an electrical interconnection between the first source electrode S1 of the first driving transistor DT1 and a first anode electrode AE1 of the first light emitting element ED1. The second relay electrode RE2 may represent an electrode for relaying an electrical interconnection between the second source electrode S2 of the second driving transistor DT2 and a second anode electrode AE2 of the second light emitting element ED2.

The first relay electrode RE1 may be electrically connected to the first source electrode S1 of the first driving transistor DT1 through a hole formed in the first planarization layer PLN1. The second relay electrode RE2 may be electrically connected to the second source electrode S2 of the second driving transistor DT2 through another hole formed in the first planarization layer PLN1.

Referring to FIG. 8, the first relay electrode RE2 and the second relay electrode RE2 may be disposed in the optical bezel area OBA.

Referring to FIG. 8, an anode extension line AEL may be connected to the first relay electrode RE1 and extend from the optical bezel area OBA to the optical area OA.

In one or more embodiments, referring to FIG. 8, the anode extension line AEL may be a metal layer disposed on the first relay electrode RE1 and include a transparent material.

Referring to FIG. 8, the at least one planarization layer PLN disposed on the display panel 110 may further include a second planarization layer PLN2 on the first planarization layer PLN1.

For example, the second planarization layer PLN2 may be disposed such that the second planarization layer PLN2 covers the first relay electrode RE1, the second relay electrode RE2, and the anode extension line AEL located on the first planarization layer PLN1.

Although FIG. 8 illustrates the example where the at least one planarization layer PLN includes the first planarization layer PLN1 and the second planarization layer PLN2, but embodiments of the present disclosure are not limited thereto. For example, the planarization layer PLN may further include at least one planarization layer PLN.

Referring to FIG. 8, the light emitting element forming part may be located on the second planarization layer PNL2.

Referring to FIG. 8, the light emitting element forming part may include the first light emitting element ED1, the second light emitting element ED2, and the fourth light emitting element ED4, which are disposed on the second planarization layer PNL2.

Referring to FIG. 8, the first light emitting element ED1 and the fourth light emitting element ED4 may be disposed in the optical area OA, and the second light emitting element ED2 may be disposed in the optical bezel area OBA.

In the example of FIG. 8, the first light emitting element ED1, the second light emitting element ED2, and the fourth light emitting element ED4 may be light emitting elements emitting light of a same color. Respective emission layers EL of the first light emitting element ED1, the second light emitting element ED2, and the fourth light emitting element ED4 may be formed independently of one another. However, in discussions that follow, for convenience of explanation, it is assumed that respective emission layers EL of the first light emitting element ED1, the second light emitting element ED2, and the fourth light emitting element ED4 are commonly formed as one common emission layer.

Referring to FIG. 8, the first light emitting element ED1 may be configured (e.g., made up) in an area where the first anode electrode AE1, the emission layer EL, and the cathode electrode CE overlap one another. The second light emitting element ED2 may be configured (e.g., made up) in an area where the second anode electrode AE2, the emission layer EL, and the cathode electrode CE overlap one another. The fourth light emitting element ED4 may be configured (e.g., made up) in an area where the fourth anode electrode AE4, the emission layer EL, and the cathode electrode CE overlap one another.

Referring to FIG. 8, the first anode electrode AE1, the second anode electrode AE2, and the fourth anode electrode AE4 may be disposed on the second planarization layer PLN2.

The second anode electrode AE2 may be connected to the second relay electrode RE2 through a hole formed in the second planarization layer PLN2.

The first anode electrode AE1 may be connected to an anode extension line AEL extending from the optical bezel area OBA to the optical area OA through another hole formed in the second planarization layer PLN2.

The fourth anode electrode AE4 may be connected to another anode extension line AEL extending from the optical bezel area OBA to the optical area OA through further another hole formed in the second planarization layer PLN2.

Referring to FIG. 8, a bank BK may be disposed on the first anode electrode AE1, the second anode electrode AE2, and the fourth anode electrode AE4.

The bank BK may include a plurality of bank holes, and respective portions of the first anode electrode AE1, the second anode electrode AE2, and the fourth anode electrode AE4 may be exposed through respective bank holes. That is, the plurality of bank holes formed in the bank BK may respectively overlap the respective portions of the first anode electrode AE1, the second anode electrode AE2, and the fourth anode electrode AE4.

Referring to FIG. 8, the emission layer EL may be disposed on the bank BK. The emission layer EL may contact the respective portions of the first anode electrode AE1, the second anode electrode AE2, and the fourth anode electrode AE4 through the plurality of bank holes.

Referring to FIG. 8, at least one spacer SPCR may be present between the emission layer EL and the bank BK.

Referring to FIG. 8, the cathode electrode CE may be disposed on the emission layer EL. The cathode electrode CE may include a plurality of cathode holes CH. The plurality of cathode holes CH formed in the cathode electrode CE may be disposed in the optical area OA.

One cathode hole CH illustrated in FIG. 8 may represent a cathode hole located between the first light emitting area EA1 and the fourth light emitting area EA4.

Referring to FIG. 8, the encapsulation part may be located on the cathode electrode CE. The encapsulation part may include an encapsulation layer ENCAP disposed on the cathode electrode CE.

Referring to FIG. 8, the encapsulation layer ENCAP can serve to prevent penetration of moisture or oxygen into the light emitting elements (ED1, ED2, and ED4) disposed under the encapsulation layer ENCAP. In particular, the encapsulation layer ENCAP may include an organic material or film and can serve to prevent penetration of moisture or oxygen into the emission layer EL. In one or more embodiments, the encapsulation layer ENCAP may include a stack of a single layer or a stack of a multilayer.

Referring to FIG. 8, the encapsulation layer ENCAP may include a first encapsulation layer PAS1, a second encapsulation layer PCL, and a third encapsulation layer PAS2.

For example, the first encapsulation layer PAS1 and the third encapsulation layer PAS2 may be inorganic material layers, and the second encapsulation layer PCL may be an organic material layer. Since the second encapsulation layer PCL is implemented using an organic material, the second encapsulation layer PCL can serve as a planarization layer.

In one or more embodiments, a touch sensor may be integrated into the display panel 110 according to aspects of the present disclosure. In these embodiments, the display panel 110 according to aspects of the present disclosure may include a touch sensor layer TSL disposed on the encapsulation layer ENCAP.

Referring to FIG. 8, the touch sensor layer TSL may include touch sensor metals TSM and bridge metals BRG, and may further include one or more insulating layers such as a sensor buffer layer S-BUF, a sensor interlayer insulating layer S-ILD, a sensor protective layer S-PAC, and the like. For example, the sensor interlayer insulating layer S-ILD may include one or more insulating layers.

The sensor buffer layer S-BUF may be disposed on the encapsulation layer ENCAP. The bridge metals BRG may be disposed on the sensor buffer layer S-BUF, and the sensor interlayer insulating layer S-ILD may be disposed on the bridge metals BRG.

The touch sensor metals TSM may be disposed on the sensor interlayer insulating layer S-ILD. One or more of the touch sensor metals TSM may be connected to one or more respective bridge metals BRG among the bridge metals BRG through one or more respective holes formed in the sensor interlayer insulating layer S-ILD.

Referring to FIG. 8, the touch sensor metals TSM and the bridge metals BRG may be disposed in the optical bezel area OBA. The touch sensor metals TSM and the bridge metals BRG may be disposed not to overlap the second light emitting area EA2 of the optical bezel area OBA.

A plurality of touch sensor metals TSM may be configured as one touch electrode (or one touch electrode line). For example, the plurality of touch sensor metals TSM may be arranged in a mesh pattern and therefore electrically connected to one another. One or more of the touch sensor metals TSM and the remaining one or more touch sensor metals TSM may be electrically connected through one or more respective bridge metals BRG, and thereby, be configured as one touch electrode (or one touch electrode line).

The sensor protective layer S-PAC may be disposed such that it covers the touch sensor metals TSM and the bridge metals BRG.

In an embodiment where a touch sensor is integrated into the display panel 110, at least one of the touch sensor metals TSM, or at least a portion of at least one of the touch sensor metals TSM, located on the encapsulation layer ENCAP may extend along an inclined surface formed in an edge of the encapsulation layer ENCAP, and be electrically connected to a pad located in an edge of the display panel 110 that is further away from the inclined surface of the edge of the encapsulation layer ENCAP. The pad may be disposed in the non-display area NDA and may be a metal pattern to which the touch driving circuit 260 is electrically connected.

The display panel 110 according to aspects of the present disclosure may include the bank BK disposed on the first anode electrode AE1 and having a bank hole exposing a portion of the first anode electrode AE1, and the emission layer EL disposed on the bank BK and contacting the portion of the first anode electrode AE1 exposed through the bank hole.

The bank hole formed in the bank BK may not overlap a plurality of cathode holes CH. For example, the bank BK may not be depressed or perforated (e.g., remained in a flat state) at places where the plurality of cathode holes CH are present. Thus, at places where the plurality of cathode holes CH are present, the second planarization layer PLN and the first planarization layer PLN1 located under the bank BK may not be depressed or perforated as well (e.g., remained in a flat state).

The flat state of the respective portion of the upper surface of the bank BK located under any one of the plurality of cathode holes CH may mean that one or more insulating layers or one or more metal patterns (e.g., one or more electrode, one or more lines, and/or the like), or the emission layers EL located under any one of the plurality of cathode holes CH have not been damaged by the process of forming the plurality of cathode holes CH in the cathode electrode CE.

A brief description for the process of forming cathode holes CH in the cathode electrode CE is as follows. A specific mask pattern can be deposited at respective locations where the cathode holes CH are to be formed, and then, a cathode electrode material can be deposited thereon. Accordingly, the cathode electrode material can be deposited only in an area where the specific mask pattern is not located, and thereby, the cathode electrode CE including the cathode holes CH can be formed. The specific mask pattern may include, for example, an organic material. The cathode electrode material may include a magnesium-silver (Mg—Ag) alloy.

In one or more embodiments, after the cathode electrode CE having the cathode holes CH is formed, the display panel 110 may be in a situation in which the specific mask pattern is completely removed, partially removed (where a portion of the specific mask pattern remains), or not removed (where all of the specific mask pattern remains without being removed).

In one or more embodiments, the display panel 110 according to aspects of the present disclosure may include the first driving transistor DT1 disposed in the optical bezel area OBA to drive the first light emitting element ED1 disposed in the optical area OA, and the second driving transistor DT2 disposed in the optical bezel area OBA to drive the second light emitting element ED2 disposed in the optical bezel area OBA.

In one or more embodiments, the display panel 110 according to aspects of the present disclosure may further include the first planarization layer PLN1 disposed on the first driving transistor DT1 and the second driving transistor DT2, the first relay electrode RE1 disposed on the first planarization layer PLN1 and electrically connected to the first source electrode S1 of the first driving transistor DT1 through a hole formed in the first planarization layer PLN1, the second relay electrode RE2 disposed on the first planarization layer PLN1 and electrically connected to the second source electrode S2 of the second driving transistor DT2 through another hole formed in the first planarization layer PLN1, and the second planarization layer PLN2 disposed on the first relay electrode RE1 and the second relay electrode RE2.

In one or more embodiments, the display panel 110 according to aspects of the present disclosure may further include an anode extension line (e.g., the anode extension line AEL) interconnecting the first relay electrode RE1 and the first anode electrode AE1, and located on the first planarization layer PLN1.

The second anode electrode AE2 may be electrically connected to the second relay electrode RE2 through a hole formed in the second planarization layer PLN2, and the first anode electrode AE1 may be electrically connected to the anode extension line AEL through another hole formed in the second planarization layer PLN2.

All or at least a portion of the anode extension line AEL may be disposed in the optical area OA, and the anode extension line AEL may include a transparent material, or be or include a transparent line.

The first pixel circuit SPC1 may include the first driving transistor DT1 for driving the first light emitting element ED1, and the second pixel circuit SPC2 may include the second driving transistor DT2 for driving the second light emitting element ED2.

The first active layer ACT1 of the first driving transistor DT1 may be located in a different layer from the second active layer ACT2 of the second driving transistor DT2.

In one or more embodiments, the display panel 110 according to aspects of the present disclosure may further include the substrate SUB, the first buffer layer BUF1 disposed between the substrate SUB and the first driving transistor DT1, and the second buffer layer BUF2 disposed between the first driving transistor DT1 and the second driving transistors DT2.

The first active layer ACT1 of the first driving transistor DT1 may include a different semiconductor material from the second active layer ACT2 of the second driving transistor DT2.

For example, the second active layer ACT2 of the second driving transistor DT2 may include an oxide semiconductor material. For example, such an oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), zinc indium tin oxide (ZITO), and/or the like.

For example, the first active layer ACT1 of the first driving transistor DT1 may include a different semiconductor material from the second active layer ACT2 of the second driving transistor DT2.

For example, the first active layer ACT1 of the first driving transistor DT1 may include a silicon-based semiconductor material. For example, the silicon-based semiconductor material may include low-temperature polycrystalline silicon (LTPS) or the like.

In one or more embodiments, the display panel 110 according to aspects of the present disclosure may further include the encapsulation layer ENCAP located on the first light emitting element ED1, the second light emitting element ED2, and the third light emitting element ED3, and touch sensor metals TSM located on the encapsulation layer ENCAP.

The touch sensor metals TSM may be disposed in the normal area NA and the optical bezel area OBA. For example, the touch sensor metals TSM may not be disposed in the optical area OA. In another example, the touch sensor metals TSM may be disposed in the optical area OA, the normal area NA and the optical bezel area OBA such that the optical area OA has a lower touch sensor metal density than each of the normal area NA and the optical bezel area OBA.

Referring to FIG. 8, the optical area OA may overlap an optical electronic device. The optical bezel area OBA may not overlap an optical electronic device. One or more embodiments, a portion of the optical bezel area OBA may overlap an optical electronic device.

The optical electronic device overlapping the optical area OA may be the first optical electronic device 11 and/or the second optical electronic device 12 in FIGS. 1A, 1B and 1C discussed above. For example, the optical electronic device may include a camera, an infrared sensor, an ultraviolet sensor, and/or the like. For example, the optical electronic device may be a device capable of receiving visible light and performing a selected operation, or a device capable of receiving light (e.g., infrared light, and/or ultraviolet light) different from visible light and performing a selected operation.

Referring to FIG. 8, a cross-sectional structure of the normal area NA may be substantially or nearly the same as that of the optical bezel area OBA. It should be noted here that the first pixel circuit SPC1 disposed in the optical bezel area OBA to drive the first light emitting element ED1 disposed in the optical area OA may not be disposed in the normal area NA.

Figure 9:
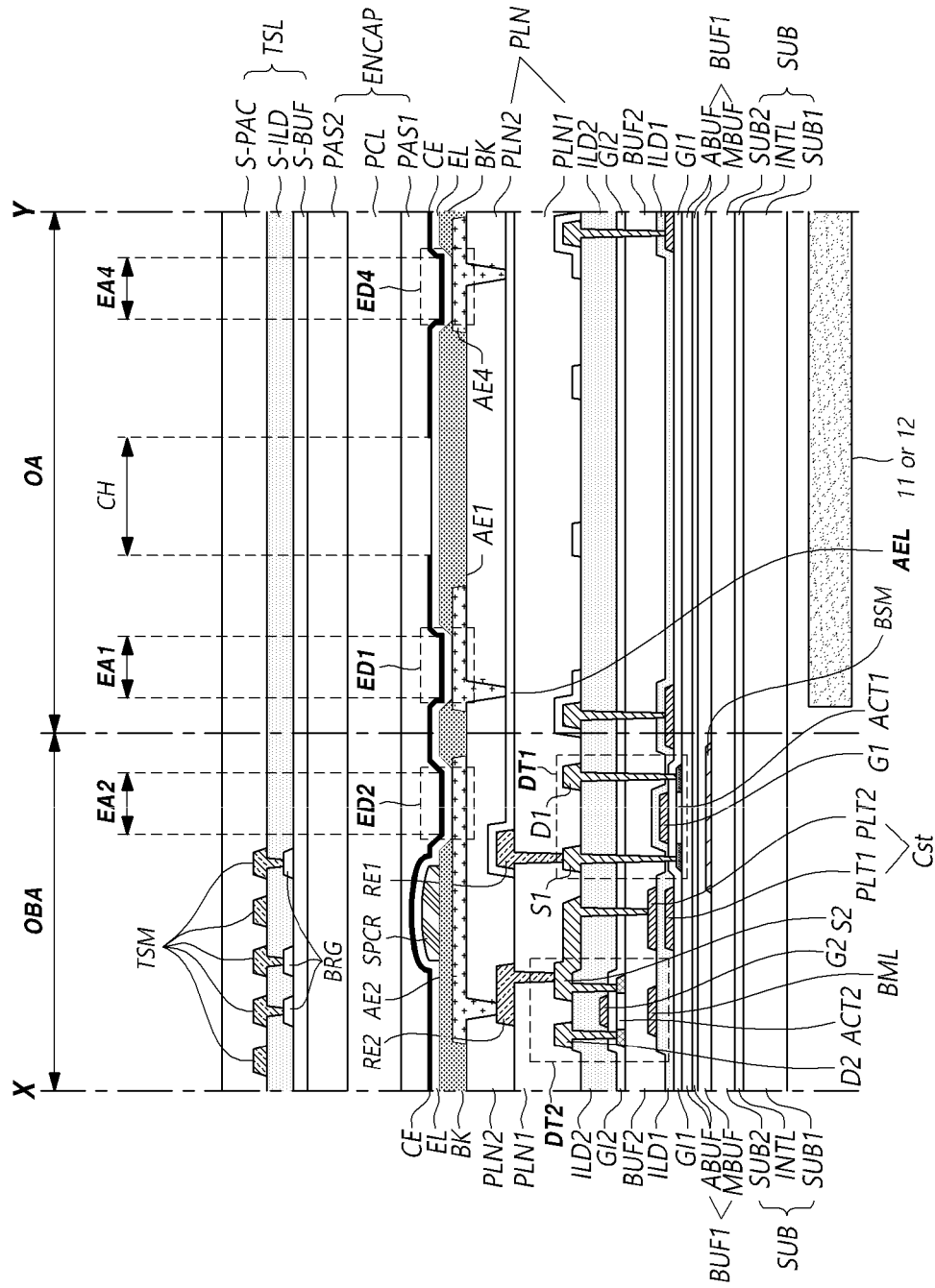

FIG. 9 illustrates an example cross-sectional view of the display panel 110 according to aspects of the present disclosure, and more specifically, illustrates example cross-sectional views in the optical bezel area OBA and the optical area OA of the display panel 110. It should be noted here that FIG. 9 illustrates an example cross-sectional view based on the application of a 1:2 circuit connection scheme, as in FIG. 6.

The cross-sectional view of FIG. 9 is basically the same as the cross-sectional view of FIG. 8. It should be noted here that one difference between the cross-sectional views of FIGS. 8 and 9 is that while FIG. 8 employs the 1:1 circuit connection scheme as in FIG. 5, FIG. 9 employs the 1:2 circuit connection scheme as in FIG. 6. Taking account of the similarity between them, hereinafter, descriptions on the cross-sectional structure of FIG. 9 will be provided by focusing on features different from the cross-sectional structure of FIG. 8.

Referring to FIG. 9, the first light emitting element ED1 and the fourth light emitting element ED4 disposed in the optical area OA may be driven the first driving transistor DT1 disposed in the optical bezel area OBA together or substantially concurrently.

Accordingly, as illustrated in FIG. 9, an anode extension line AEL (e.g., the anode extension line AEL of FIG. 8) may be further electrically connected to the fourth anode electrode AE4 different from the first anode electrode AE1, as well as the first anode electrode AE1. Thus, the anode extension line AEL may be electrically connected to both the first anode electrode AE1 of the first light emitting element ED1 and the fourth anode electrode AE4 of the fourth light emitting element ED4.

Referring to FIG. 9, the anode extension line AEL may overlap a cathode hole CH located between the first light emitting element ED1 and the fourth light emitting element ED4 among a plurality of cathode holes CH.

Referring to FIG. 9, the first light emitting area EA1 configured by the first light emitting element ED1 and the fourth light emitting area EA4 configured by the fourth light emitting element ED4 may be light emitting areas emitting light of a same color.

For example, in the optical area OA, an area except for a plurality of cathode holes CH, which are transmissive areas TA, may be an area through which light cannot be transmitted. In another example, in the optical area OA, the area except for the plurality of cathode holes CH, which are transmissive areas TA, may be an area through which light can be transmitted with a low transmittance (or a low transmissivity).

Thus, in the optical area OA, the transmittance (or transmissivity) of the area except for the plurality of cathode holes CH may be lower than that of the plurality of cathode holes CH. In one or more embodiments, the transmittance (or transmissivity) of the area except for the plurality of cathode holes CH in the optical area OA may be higher than that of the normal area NA.

Figure 10:
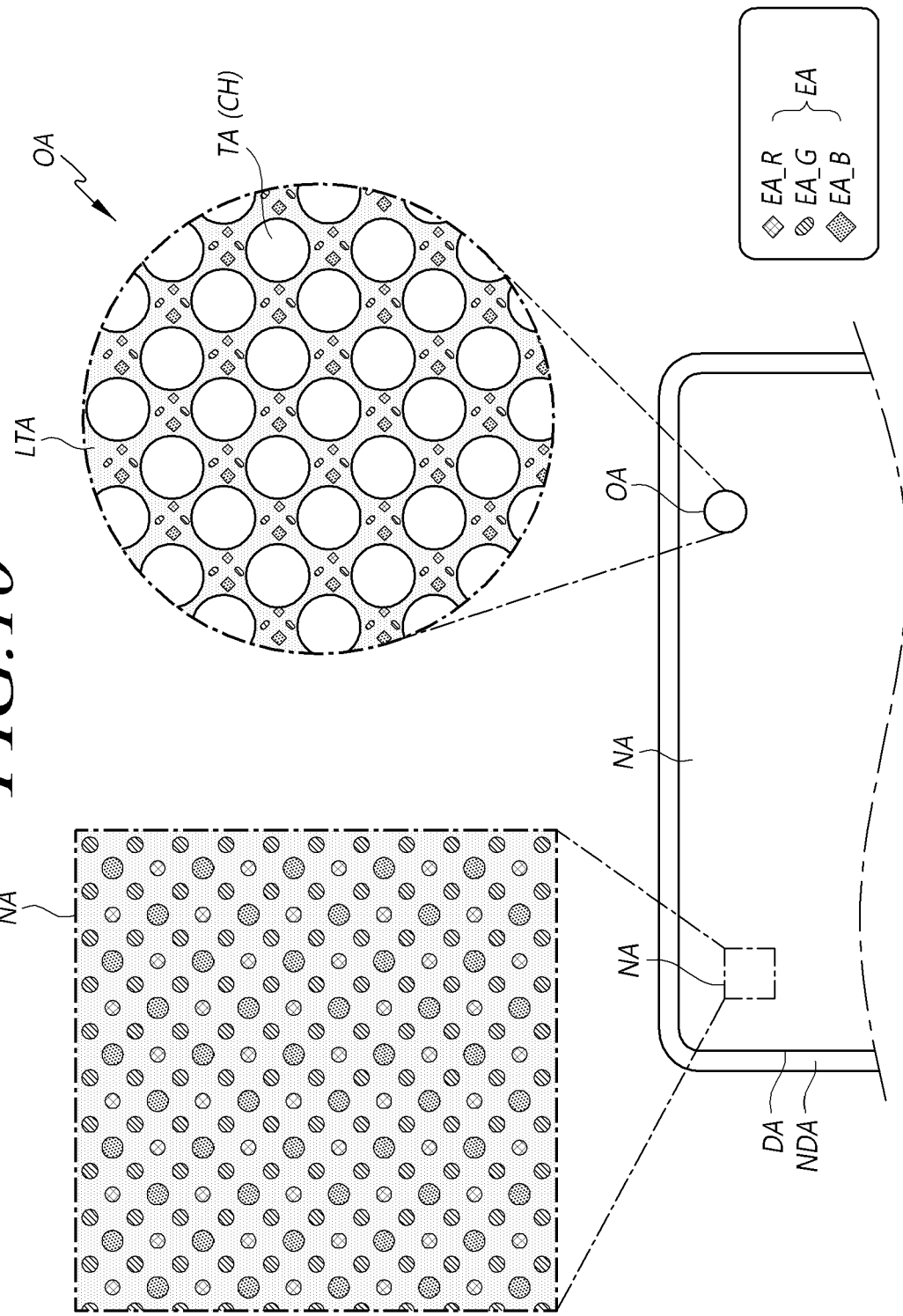
FIG. 10 illustrates an example second type of optical area and an example normal area around the second type of optical area included in the display panel according to aspects of the present disclosure.

FIG. 10 schematically illustrates an example second type of optical area OA and an example normal area NA around the second type of optical area OA in the display panel 110 according to aspects of the present disclosure.

Referring to FIG. 10, the display area DA may include an optical area OA. The optical area OA may have the structure of a second type. In an example where the second type of optical area OA is implemented in the second type, the optical area OA may include a plurality of transmissive areas TA and a low-transmissive area LTA. The second type may be referred to as a hole type.

Referring to FIG. 10, in the optical area OA, the low-transmissive area LTA except for the plurality of transmissive areas TA may include a plurality of light emitting areas EA. In the optical area OA, a plurality of light emitting elements ED for the plurality of light emitting areas EA may be disposed in the low-transmissive area LTA except for the plurality of transmissive areas TA.

Further, a plurality of pixel circuits SPC for driving the plurality of light emitting elements ED may be disposed in the low-transmissive area LTA. That is, the plurality of pixel circuits SPC may be disposed in the optical area OA. This is different from the first type (e.g., the anode extension type) of the optical area OA in the examples of FIGS. 4 to 9 in which that the plurality of pixel circuits SPC are not disposed in the optical area OA.

In one embodiment, the low-transmissive area LTA in the optical area OA may be an area through which light cannot be transmitted. In another embodiment, the low-transmissive area LTA in the optical area OA may be an area through which light can be transmitted with a low transmittance (or a low transmissivity).

In the optical area OA, the transmittance (or transmissivity) of the low-transmissive area LTA may be lower than that of the transmissive area TA. In one or more embodiments, the transmittance (or transmissivity) of the low-transmissive area LTA in the optical area OA may be higher than that of the normal area NA.

Referring to FIG. 10, the arrangement of light emitting areas EA in the optical area OA may be the same as the arrangement of light emitting areas EA in the normal area NA.

One or more embodiments, referring to FIG. 10, a respective area of each of a plurality of light emitting areas EA included in the optical area OA may be the same or substantially or nearly the same as, or be different within a predetermined range from, a respective area of each of a plurality of light emitting areas EA included in the normal area NA.

Further, a respective area of each of the plurality of light emitting areas EA included in the optical area OA may be the same or different within a predetermined range.

A cathode electrode (e.g., the cathode electrode CE in FIG. 3) may be commonly disposed in the normal area NA and the optical area OA, and may include a plurality of cathode holes CH in the optical area OA. The plurality of cathode holes CH of the cathode electrode CE may respectively correspond to transmissive areas TA of the optical area OA.

Since the optical area OA includes the plurality of transmissive areas TA, the optical area OA may have higher transmittance than the normal area NA.

All or at least a portion of the optical area OA may overlap an optical electronic device.

The optical electronic device overlapping the optical area OA may be the first optical electronic device 11 and/or the second optical electronic device 12 in FIGS. 1A, 1B and 1C discussed above. For example, the optical electronic device may include a camera, an infrared sensor, an ultraviolet sensor, and/or the like. For example, the optical electronic device may be a device capable of receiving visible light and performing a selected operation, or a device capable of receiving light (e.g., infrared light, and/or ultraviolet light) different from visible light and performing a selected operation.

Figure 11:
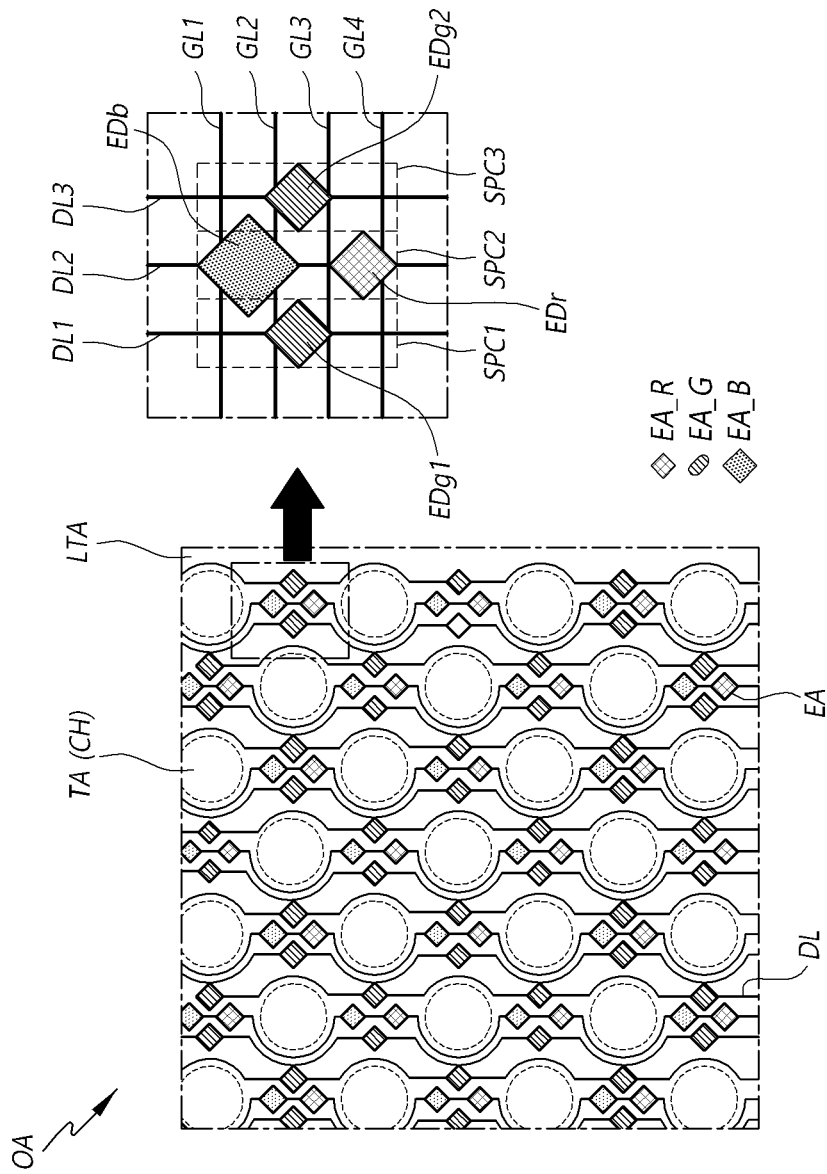
FIG. 11 is an example plan view of the second type of optical area in the display panel according to aspects of the present disclosure.

FIG. 11 is an example plan view of the second type of optical area OA (e.g., as in the configuration of the FIG. 10) in the display panel 110 according to aspects of the present disclosure.

Referring to FIG. 11, in an example where the optical area OA is implemented in the second type, the optical area OA may include one or more transmissive areas TA and a low-transmissive area LTA except for the one or more transmissive areas.

The low-transmissive area LTA may include a plurality of light emitting areas EA.

A respective light emitting element ED may be disposed in each of the plurality of light emitting areas EA.

A plurality of pixel circuits SPC for driving the plurality of light emitting elements ED may be disposed in the low-transmissive area LTA.

In the second type of optical area OA, the light emitting elements ED and the pixel circuits SPC may partially overlap each other.

In the case of the second type of optical area OA, data lines (DL1, DL2 and DL3) and gate lines (GL1, GL2, GL3, and GL4) may run across the optical area OA.

In the optical area OA, the data lines (DL1, DL2 and DL3) may be arranged in a row direction (or a column direction) while avoiding one or more transmissive areas TA, which correspond to one or more respective cathode holes CH.

In the optical area OA, the gate lines (GL1, GL2, GL3, and GL4) may be arranged in the column direction (or the row direction) while avoiding one or more transmissive areas TA, which correspond to one or more respective cathode holes CH.

The data lines (DL1, DL2 and DL3) and the gate lines (GL1, GL2, GL3, and GL4) may be connected to pixel circuits (SPC1, SPC2, and SPC3) disposed in the optical area OA.

For example, four light emitting elements (EDr, Edg1, Edg2, and Edb) may be disposed in a portion of the low-transmissive area LTA between four adjacent transmissive areas TA. The four light emitting elements (Edr, Edg1, Edg2, and Edb) may include one red light emitting element Edr, two green light emitting elements Edg1 and Edg2, and one blue light emitting element Edb.

For example, a pixel circuit SPC1 for driving the one red light emitting element EDR may be connected to a first data line DL1 and a first gate line GL1. A pixel circuit SPC2 for driving the two green light emitting elements Edg1 and Edg2 may be connected to a second data line DL2, a second gate line GL2, and a third gate line GL3. A pixel circuit SPC3 for driving the one blue light emitting element Edb may be connected to a third data line DL3 and a fourth gate line GL4.

Figure 12:
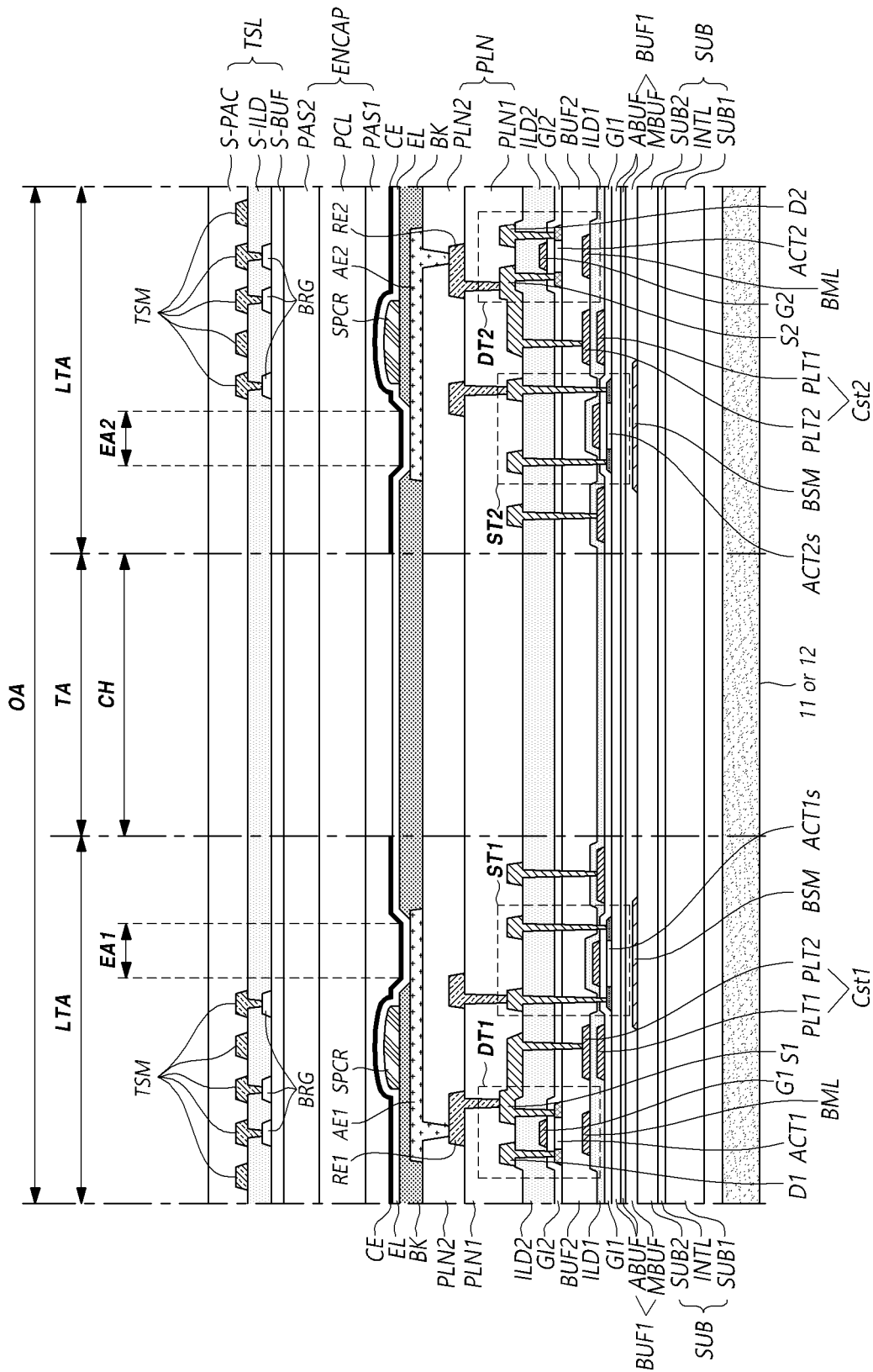
FIG. 12 is an example cross-sectional view of the second type of optical area in the display panel according to aspects of the present disclosure.

FIG. 12 is an example cross-sectional view of the second type of optical area OA (e.g., as in the configuration of FIGS. 10 and 11) in the display panel 110 according to aspects of the present disclosure.

Metal layers and insulating layers in the cross-sectional structure of FIG. 12 may be the same, or substantially or nearly the same, as the metal layers and insulating layers in the cross-sectional structures of FIGS. 8 and 9. Taking account of the similarity between them, discussions on the cross-sectional structure of FIG. 12 will be provided by focusing on features different from those of the cross-sectional structures of FIGS. 8 and 9.

Referring to FIG. 12, an optical electronic device may be disposed such that it overlaps all or at least a portion of the optical area OA. The optical electronic device may be the first optical electronic device 11 and/or the second optical electronic device 12 in FIGS. 1A, 1B and 1C discussed above.

Referring to FIG. 12, a first light emitting element ED1 and a second light emitting element ED2 may be disposed in the optical area OA. A first light emitting area EA1 configured by the first light emitting element ED1 and a second light emitting area EA2 configured by the second light emitting element ED2 may be light emitting areas emitting light of a same color.

Referring to FIG. 12, an area where the first light emitting element ED1 and the second light emitting element ED2 are disposed may be a low-transmissive area LTA, and a transmissive area TA may be present between the first light emitting element ED1 and the second light emitting element ED2. That is, the transmissive area TA may present between the first light emitting area EA1 configured by the first light emitting element ED1 and the second light emitting area EA2 configured by the second light emitting element ED2.

A pixel circuit SPC may be configured to drive the first light emitting element ED1, and be disposed to overlap all or at least a portion of the first light emitting element ED1 in the optical area OA.

Referring to FIG. 12, the pixel circuit SPC for driving the first light emitting element ED1 may include a first driving transistor DT1, a first scan transistor ST1, and a first storage capacitor Cst1.

A pixel circuit SPC may be configured to drive the second light emitting element ED2, and be disposed to overlap all or at least a portion of the second light emitting element ED2 in the optical area OA.

Referring to FIG. 12, the pixel circuit SPC for driving the second light emitting element ED2 may include a second driving transistor DT2, a second scan transistor ST2, and a second storage capacitor Cst2.

Referring to FIG. 12, the first driving transistor DT1 may include a first active layer ACT1, a first gate electrode G1, a first source electrode S1, and a first drain electrode D1.

The first light emitting element ED1 may be configured (e.g., made up) in an area where a first anode electrode AE1, an emission layer (e.g., the emission layer EL discussed above), and a cathode electrode (e.g., the cathode electrode CE discussed above) overlap one another.

The first source electrode S1 of the first driving transistor DT1 may be connected to the first anode electrode AE1 through a first relay electrode RE1.

The first storage capacitor Cst1 may include a first capacitor electrode PLT1 and a second capacitor electrode PLT2.

The first source electrode S1 of the first driving transistor DT1 may be connected to the second capacitor electrode PLT2 of the first storage capacitor Cst1.

The first gate electrode G1 of the first driving transistor DT1 may be connected to the first capacitor electrode PLT1 of the first storage capacitor Cst1.

The active layer ACT1s of the first scan transistor ST1 may be located on the first buffer layer BUF1 and be located in a lower location than the first active layer ACT1 of the first driving transistor DT1.

A semiconductor material included in the active layer ACT1s of the first scan transistor ST1 may be different from a semiconductor material included in the first active layer ACT1 of the first driving transistor DT1. For example, the semiconductor material included in the first active layer ACT1 of the first driving transistor DT1 may be an oxide semiconductor material, and the semiconductor material included in the active layer ACT1s of the first scan transistor ST1 may be a silicon-based semiconductor material (e.g., a low-temperature polycrystalline silicon (LTPS)).

Referring to FIG. 12, the second driving transistor DT2 may include a second active layer ACT2, a second gate electrode G2, a second source electrode S2, and a second drain electrode D2.

The second light emitting element ED2 may be configured (e.g., made up) in an area where a second anode electrode AE2, the emission layer EL, and the cathode electrode CE overlap one another.

The second source electrode S2 of the second driving transistor DT2 may be connected to the second anode electrode AE2 through a second relay electrode RE2.

The second storage capacitor Cst2 may include a first capacitor electrode PLT1 and a second capacitor electrode PLT2.

The second source electrode S2 of the second driving transistor DT1 may be connected to the second capacitor electrode PLT2 of the second storage capacitor Cst2.

The second gate electrode G2 of the second driving transistor DT2 may be connected to the first capacitor electrode PLT1 of the second storage capacitor Cst2.

An active layer ACT2s of the second scan transistor ST2 may be located on the first buffer layer BUF1 and be located in a lower location than the second active layer ACT2 of the second driving transistor DT2.

A semiconductor material included in the active layer ACT2s of the second scan transistor ST2 may be different from a semiconductor material included in the second active layer ACT2 of the second driving transistor DT2. For example, the semiconductor material included in the second active layer ACT2 of the second driving transistor DT2 may be an oxide semiconductor material, and the semiconductor material included in the active layer ACT2s of the second scan transistor ST2 may be a silicon-based semiconductor material (e.g., a low-temperature polycrystalline silicon (LTPS)).

The cathode electrode CE may not include a cathode hole CH or may include a plurality of cathode holes CH.

In an example where the cathode electrode CE includes a plurality of cathode holes CH, the cathode holes CH formed in the cathode electrode CE may be located to correspond to respective transmissive areas TA of the optical area OA.

A bank hole formed in the bank BK may not overlap any one of the cathode holes CH.

An upper surface of the bank BK located in a lower location than the cathode holes CH may be flat without being depressed or etched. For example, the bank BK may not be depressed or perforated (e.g., remained in the flat state) at places where cathode holes CH are present. Thus, at places where cathode holes CH are present, the second planarization layer PLN2 and the first planarization layer PLN1 located in a lower location than the bank BK may not be depressed or perforated as well (e.g., remained in a flat state).

The flat state of the respective portions of the upper surface of the bank BK located under the cathode holes CH may mean that one or more insulating layers or one or more metal patterns (e.g., one or more electrode, one or more lines, and/or the like), or the emission layer EL located under the cathode electrode CE have not been damaged by the process of forming the cathode holes CH in the cathode electrode CE.

A brief description for the process of forming cathode holes CH in the cathode electrode CE is as follows. A specific mask pattern can be deposited at respective locations where the cathode holes CH are to be formed, and then, a cathode electrode material can be deposited thereon. Accordingly, the cathode electrode material can be deposited only in an area where the specific mask pattern is not located, and thereby, the cathode electrode CE including the cathode holes CH can be formed.

The specific mask pattern may include, for example, an organic material. The cathode electrode material may include a magnesium-silver (Mg—Ag) alloy.

In one or more embodiments, after the cathode electrode CE having the cathode holes CH is formed, the display panel 110 may be in a situation in which the specific mask pattern is completely removed, partially removed (where a portion of the specific mask pattern remains), or not removed (where all of the specific mask pattern remains without being removed).

As discussed above, while transistors (e.g., DT and/or ST) and a storage capacitor Cst may not be disposed in the optical area OA configured in the first type (e.g., the anode extension type) as in the examples of FIGS. 4 to 9, transistors (e.g., DT and/or ST) and one or more storage capacitors Cst may be disposed in the optical area OA configured in the second type (e.g., the hole type) as in the examples of FIGS. 10 to 12.

In the first type (e.g., the anode extension type) of FIGS. 4 to 9, two or more light emitting elements ED may be disposed in the optical area OA, and two or more light emitting elements ED may be also disposed in the optical bezel area OBA, which is an area located outside of the optical area OA. Further, in the first type (e.g., the anode extension type), transistors (e.g., DT and/or ST) and a storage capacitor Cst may not be disposed in the optical area OA, and transistors (e.g., DT and/or ST) and one or more storage capacitors Cst may be disposed in the optical bezel area OBA located outside of the optical area OA.

Referring to FIGS. 10 to 12, in the second type (e.g., the hole type), two or more light emitting elements ED may be disposed in the optical area OA. That is, in the optical area OA of the second type (e.g., the hole type), two or more light emitting elements ED may be disposed in the low-transmissive area LTA of the optical area OA. Further, in the second type (e.g., the hole type), transistors (e.g., DT and/or ST) and one or more storage capacitors Cst may be disposed in the optical area OA. That is, in the optical area OA of the second type (e.g., the hole type), transistors (e.g., DT and/or ST) and one or more storage capacitors Cst may be disposed in the low-transmissive area LTA of the optical area OA.

Figure 13:
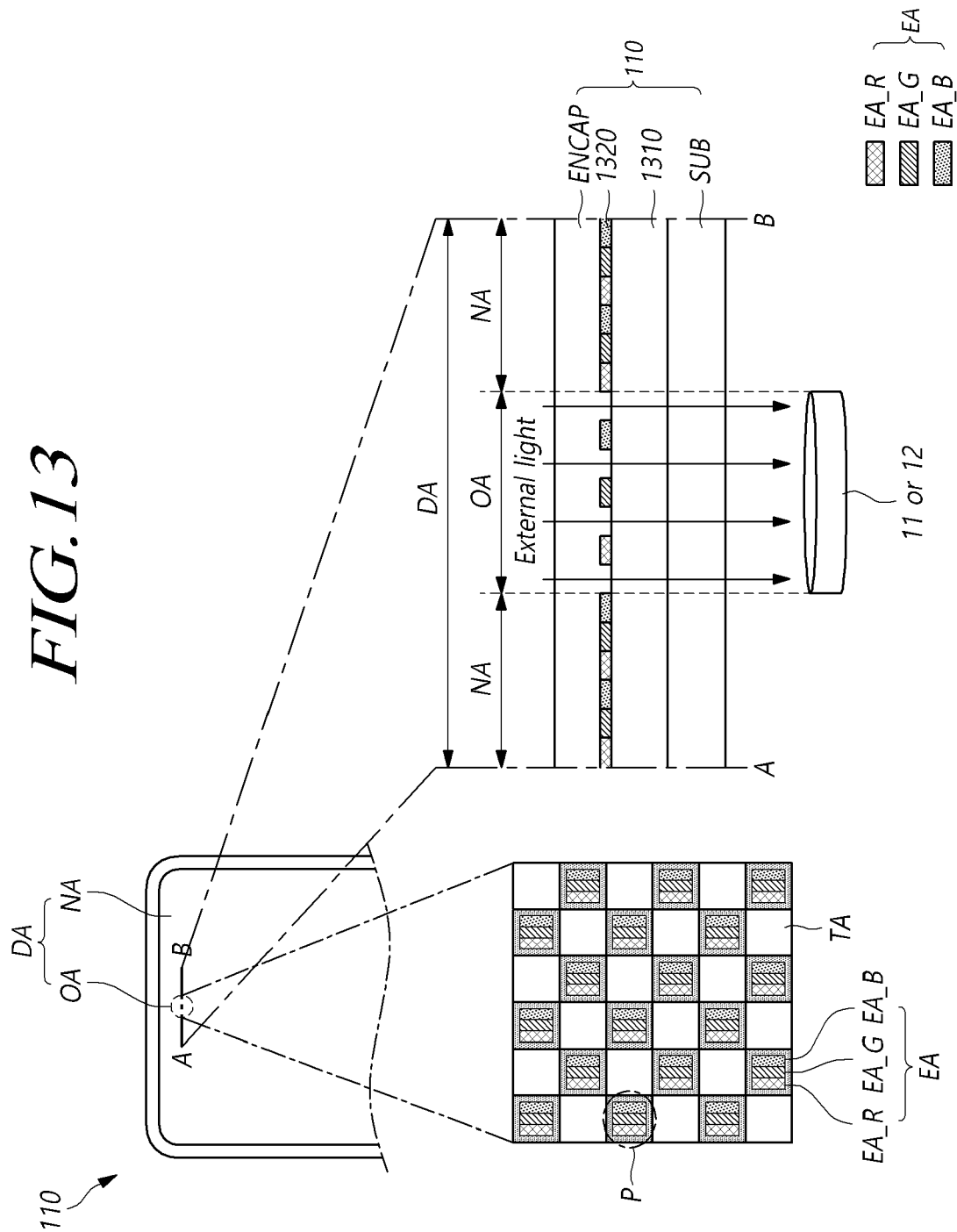
FIG. 13 illustrates an example structure of the display device according to aspects of the present disclosure.

FIG. 13 illustrates an example structure of the display device 100 according to aspects of the present disclosure.

Referring to FIG. 13, in one or more embodiments, in the display device 100 according to aspects of the present disclosure, one or more optical electronic devices (11 and/or 12), which need to receive external light (e.g., visible light, infrared light, ultraviolet light, and/or the like) for performing a predefined operation, may be located under, or in a lower portion of, the display panel 110, and be located to overlap the optical area OA, which is a partial area of the display area DA of the display panel 110. In these embodiments, by receiving external light transmitting through the optical area OA, the one or more optical electronic devices (11 and/or 12) can perform a predefined operation (e.g., a camera operation, a sensing operation, and the like) based on the received light (e.g., visible light, infrared light, ultraviolet light, and/or the like).

Referring to FIG. 13, although the one or more optical electronic devices (11 and/or 12) are placed at a specific location of the display device 100, the one or more optical electronic devices (11 and/or 12) are required to normally receive external light through the display panel 110. In addition, even when the one or more optical electronic devices (11 and/or 12) are disposed to overlap the optical area OA, which is a partial area of the display area DA of the display panel 110, the display panel 110 is required to normally perform image displaying.

Accordingly, the optical area OA in the display area DA of the display panel 110 is required to have a light transmission and display structure. In one or more embodiments, a boundary area adjacent to the optical area OA in the normal area NA of the display area DA of the display panel 110 may have a light transmission and display structure.

A stackup configuration of the display panel 110 will be briefly described with reference to FIG. 13. The display panel 110 may include a substrate SUB, a thin film transistor forming layer 1310, a light emitting element forming layer 1320, an encapsulation layer ENCAP, and the like.

The thin film transistor forming layer 1310 may be located on the substrate SUB, and may be a vertical area (e.g., include a stack of one or more layers) in which a plurality of thin film transistors (TFT) and a plurality of capacitors are disposed. The plurality of thin film transistors (TFT) may include transistors (DT and ST) disposed in each subpixel SP. The plurality of capacitors may include a storage capacitor Cst disposed in each subpixel SP.

The thin film transistor forming layer 1310 may include at least one metal layer, at least one semiconductor material layer (which may be also referred to as an active layer), and a plurality of insulating layers.

The light emitting element forming layer 1320 may be located on the thin film transistor forming layer 1310, and may be a vertical area (e.g., include a stack of one or more layers) in which a plurality of light emitting elements ED are disposed.

The light emitting element forming layer 1320 may include a plurality of anode electrodes AE, at least one emission layer EL, and a cathode electrode CE. One light emitting area EA may be formed in an area where one anode electrode AE overlaps the emission layer EL and the cathode electrode CE.

A plurality of light emitting areas EA may be formed in the light emitting element forming layer 1320. The plurality of light emitting areas EA may include one or more red light emitting areas EA_R for emitting red light, one or more green light emitting areas EA_G for emitting green light, and one or more blue light emitting area EA_B for emitting blue light.

Referring to FIG. 13, a plurality of light emitting areas EA may be densely disposed in the normal area NA of the display area DA. In contrast, in the optical area OA of the display area DA, a plurality of light emitting areas EA may not be densely disposed. Accordingly, the number of pixels per unit area in the optical area OA may be less than the number of pixels per unit area in the normal area NA.

The reason why a plurality of light emitting areas EA are not densely disposed in the optical area OA of the display area DA is to provide a space for helping light be effectively transmitted.

In the optical area OA of the display area DA, a space in which light emitting areas EA are not disposed may be a space for light transmission. The space for the light transmission may be also referred to as a transmissive area TA. A metal, which may not allow light to be transmitted, may not be disposed in the transmissive area TA. In one or more embodiments, one or more of insulating layers may be partially etched in the transmissive area TA to increase the light transmittance.

Referring to FIG. 13, in the optical area OA of the display area DA, pixels P, each of which includes subpixels grouped together from a plurality of subpixels SP, may be spaced apart from each other, and transmissive areas TA may be disposed between the pixels P.

The plurality of subpixels SP may include one or more red subpixels SP for emitting red light, one or more green subpixels SP for emitting green light, and one or more blue subpixels SP for emitting blue light.

For example, one pixel P may include one red subpixel SP, one green subpixel SP, and one blue subpixel SP.

For another example, one pixel P may include one red subpixel SP, two green subpixels SP, and one blue subpixel SP.

Herein, a light emitting area EA may also be described as a subpixel SP, and a red light emitting area EA_R, a green light emitting area EA_G, and a blue light emitting area EA_B may be described as a red subpixel SP, a green subpixel SP, and a blue subpixel, respectively. In addition, all of light emitting areas EA of subpixels SP included in a pixel P may be collectively described as one pixel P.

In one or more embodiments, the display panel 110 according to aspects of the present disclosure may further include a color filter layer. The color filter layer may include color filters disposed on a plurality of light emitting elements ED and a black matrix BM disposed between the color filters.

In the example where the color filter layer is added in the display panel 110, the plurality of light emitting elements ED may emit light of a same color. For example, when the color filter layer is added, the plurality of light emitting elements ED may emit same white light. In another example, the plurality of light emitting elements ED may emit same blue light.

For example, the color filters may include a red color filter, a green color filter, and a blue color filter. In another example, the color filters may include a red color filter and a green color filter, but may not include a blue color filter.

For example, the color filter layer may be disposed on an encapsulation layer ENCAP.

For example, the color filter layer may be disposed on a touch sensor layer TSL located on the encapsulation layer ENCAP. In another example, the color filters and the black matrix BM may be disposed between the encapsulation layer ENCAP and the touch sensor layer TSL.

In one or more embodiments, the display panel 110 according to aspects of the present disclosure may further include a color conversion layer. The color conversion layer may be disposed under or over the color filter layer. For example, the color conversion layer may include quantum dots.

As described above, since the display panel 110 of the display device 100 according to aspects of the present disclosure has a light transmission and display structure in the optical area OA, even when one or more optical electronic device (11 and/or 12) are located under the substrate SUB of the display panel 110 and overlap the optical area OA, the one or more optical electronic device (11 and/or 12) can normally receive light transmitting through the optical area OA and perform normal operations based on the received light.

Referring to FIG. 13, in the display device 100 according to aspects of the present disclosure, the number of pixels per unit area in the optical area OA may be less than the number of pixels per unit area in the normal area NA, and this may cause an image disparity between the normal area NA and the optical area OA. In particular, such an image disparity may be conspicuously perceived in a boundary area between the normal area NA and the optical area OA.

Figure 14:
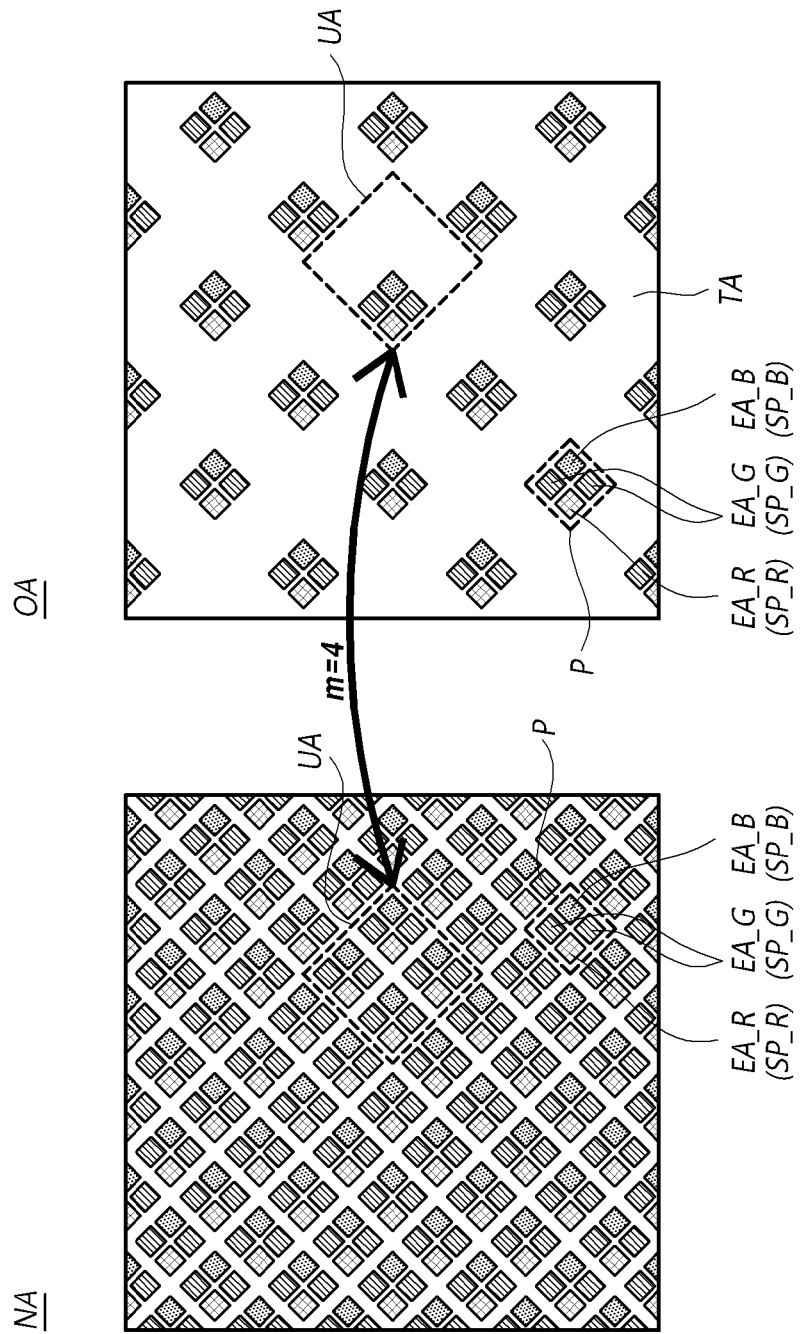
FIG. 14 illustrates example respective pixel arrangements in each of the normal area and the optical area in the display device according to aspects of the present disclosure.

FIG. 14 illustrates example respective pixel arrangements in each of the normal area NA and the optical area OA in the display device 100 according to aspects of the present disclosure.

Referring to FIG. 14, one pixel P may include one red subpixel SP_R, two green subpixels SP_G, and one blue subpixel SP_B.

Referring to FIG. 14, a light emitting area of one pixel P may include one red light emitting area EA_R of one red subpixel SP_R, two green light emitting areas EA_G of two green subpixels SP_G, and one blue light emitting area EA_B of one blue subpixel SP_B.

According to the example of FIG. 14, the number of pixels per unit area UA in the normal area NA may be four, and the number of pixels per unit area UA in the optical area OA may be one. That is, a ratio between the number of pixels per unit area UA in the normal area NA and the number of pixels per unit area UA in the optical area OA may be 4:1.

A light emitting area ratio (m) between the normal area NA and the optical area OA may be a value obtained by dividing the number of pixels per unit area UA in the normal area NA by the number of pixels per unit area UA in the optical area OA. According to this definition, a light emitting area ratio (m) in the example of FIG. 14 is 4.

Figure 15:
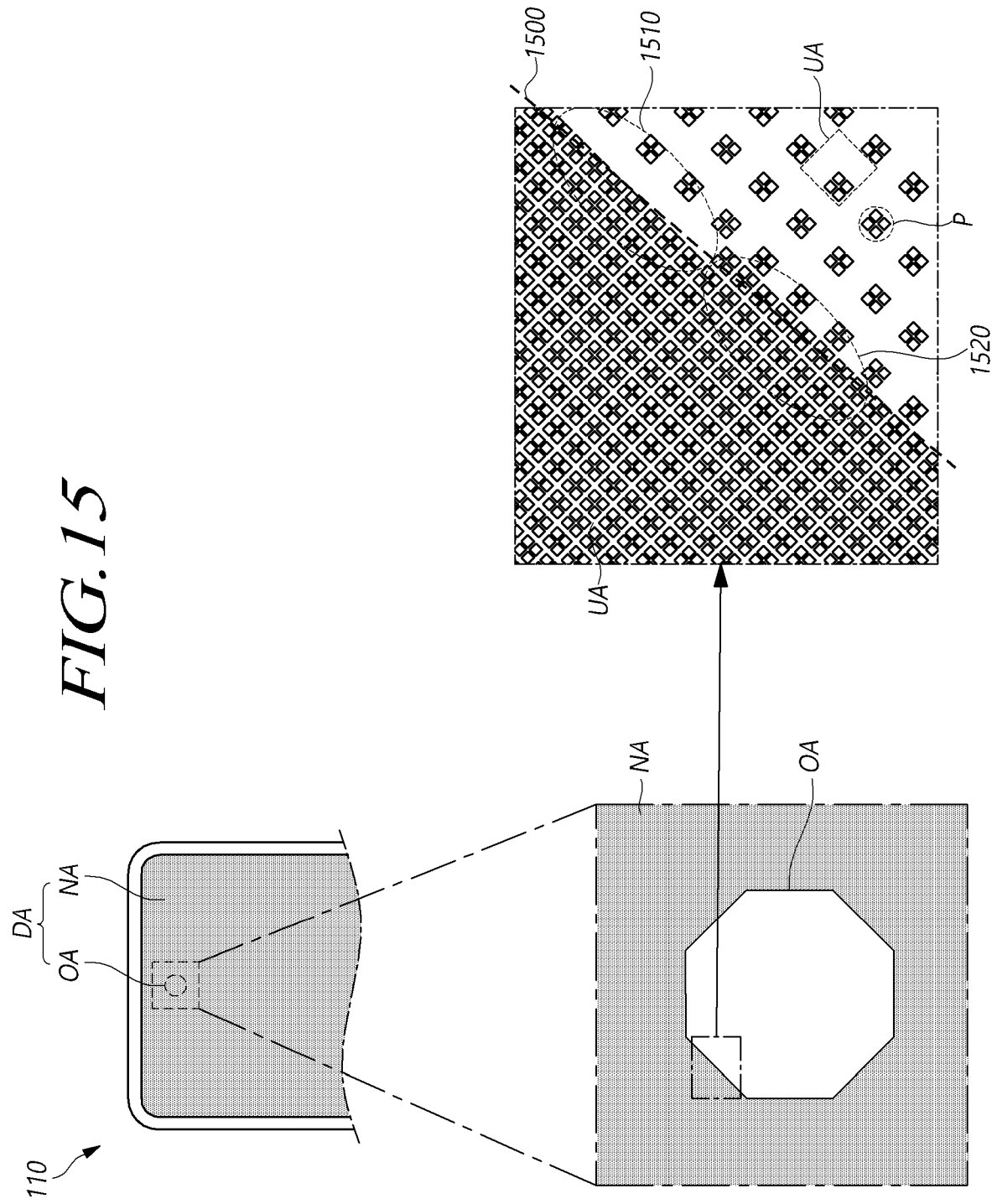
FIG. 15 illustrates an example irregular pixel arrangement at a boundary between the normal area and the optical area in the display device according to aspects of the present disclosure.

FIG. 15 illustrates an example irregular pixel arrangement at a boundary between the normal area NA and the optical area OA in the display device 100 according to aspects of the present disclosure.

Referring to FIG. 15, a plurality of pixels P are disposed in each of the normal area NA and the optical area OA included in the display area DA of the display panel 110. The number of pixels per unit area UA in the optical area OA may be less than the number of pixels per unit area UA in the normal area NA.

As shown in FIG. 15, depending on a shape of the optical area NA, a boundary line 1500 between the normal area NA and the optical area NA may include horizontal, vertical, inclined, and/or curved portions. In this implementation, pixels located around the boundary line 1500 between the normal area NA and the optical area NA may be differently arranged according to locations along the boundary line.

Referring to FIG. 15, in an area 1510 adjacent to a first location in the boundary line 1500, an empty area in which a pixel P is not disposed may be relatively wide. As a result, the area 1510 adjacent to the first location in the boundary line 1500 may be a low luminance area.

Referring to FIG. 15, in an area 1520 adjacent to a second location in the boundary line 1500, pixels P of the normal area NA and pixels P of the optical area OA may be arranged to contact each other, and thereby, an empty area in which a pixel P is not present may be relatively narrow. As a result, the area 1520 adjacent to the second location in the boundary line 1500 may be a high luminance area.

As described above, the irregularity of respective pixel arrangements at locations in the boundary line 1500 between the normal area NA and the optical area OA may cause a luminance disparity. As a result, dark lines or bright lines may be presented, and a difference in color perception according to pixel locations may occur due to color fringing.

In other words, as luminance is simply controlled for each line, pixel layouts (e.g., pixel arrangements) may be different at different locations (e.g., top, bottom, left, and/or right locations) along the boundary between the normal area NA and the optical area OA, and therefore, a difference in color perception still occur at locations along the boundary due to color fringing. This may cause corresponding areas to be presented as a dark line and/or a bright line in monochromatic driving.

Display characteristics of the boundary area (1500, 1510 and/or 1520) between the normal area NA and the optical area OA may be different from those of the normal area NA and from those of the optical area OA.

Since a gamma curve is an exponential function, it may be difficult to accurately fit in a desired gamma curve (e.g., a 2.2 gamma curve) even when a predefined gain is applied, and a difference between grayscales may therefore occur.

Figure 16:
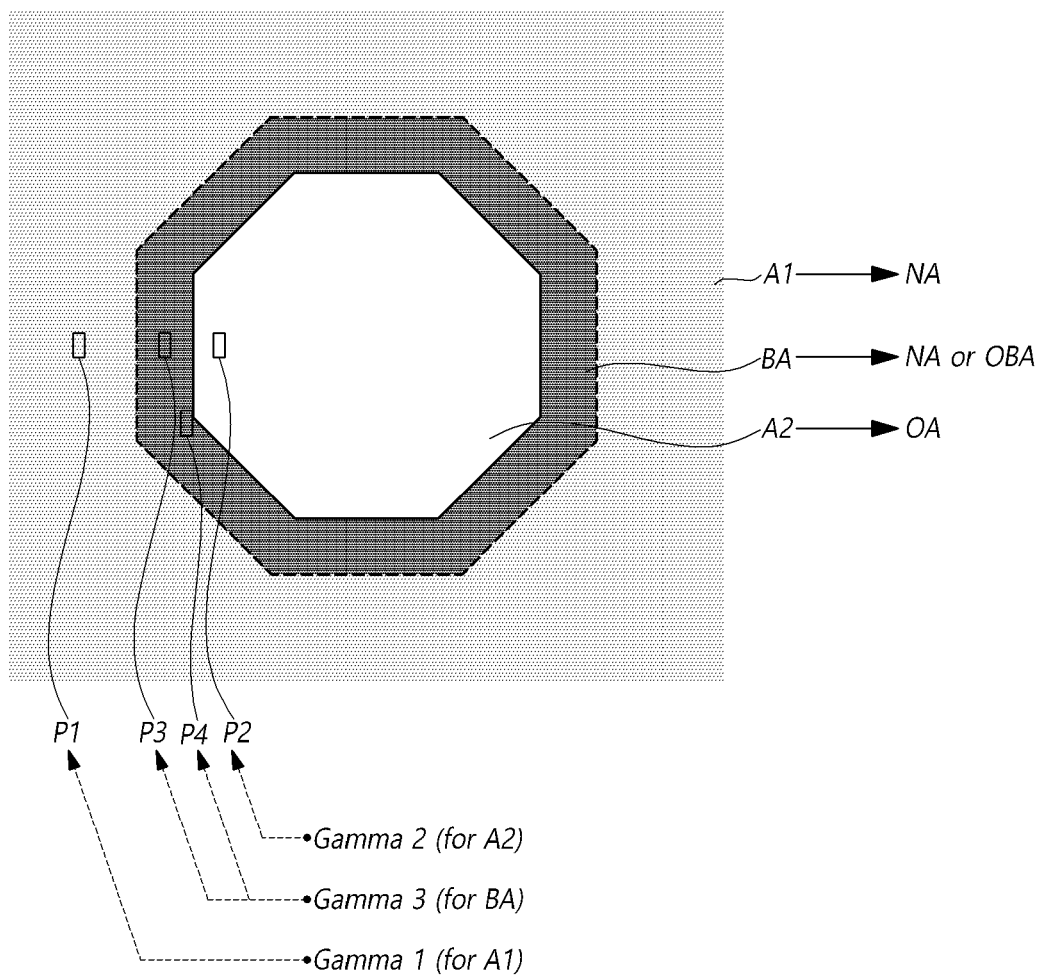
FIG. 16 illustrates an example triple gamma-based boundary perception level reduction driving in the display device according to aspects of the present disclosure.
Figure 17:
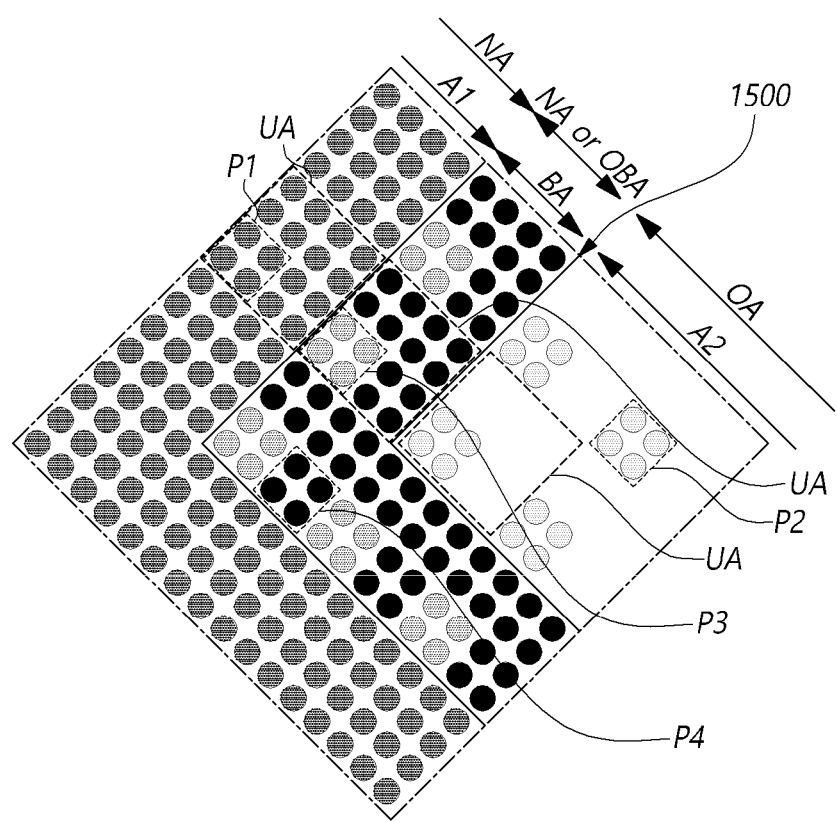
FIG. 17 illustrates example pixel arrangements in the normal area, the optical area, and a boundary driving area in the display device according to aspects of the present disclosure.
Figure 18:
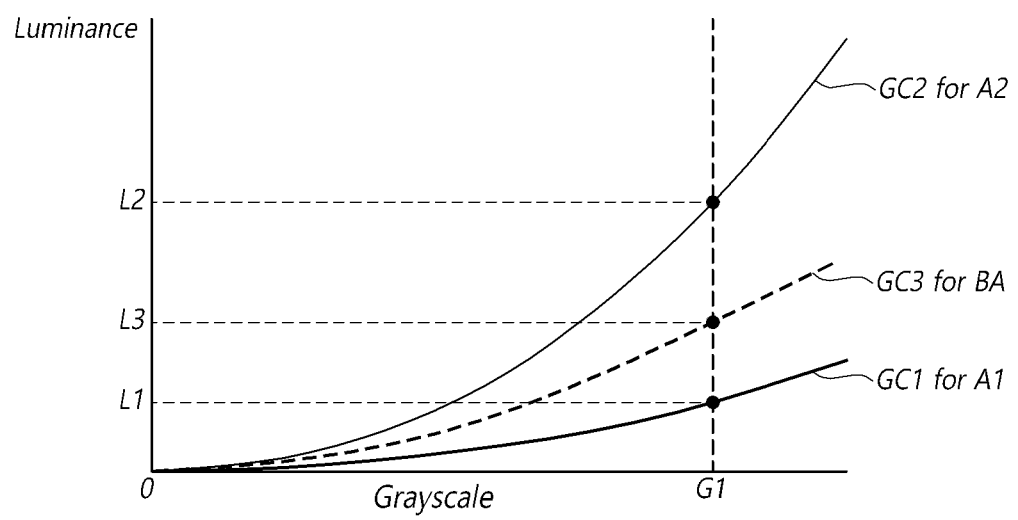
FIG. 18 illustrates example triple gamma curves for the triple gamma-based boundary perception level reduction driving in the display device according to aspects of the present disclosure.

FIG. 16 illustrates an example triple gamma-based boundary perception level reduction driving in the display device 100 according to aspects of the present disclosure. FIG. 17 illustrates example pixel arrangements in the normal area NA, the optical area OA, and a boundary driving area BA in the display device 100 according to aspects of the present disclosure. FIG. 18 illustrates example triple gamma curves for the triple gamma-based boundary perception level reduction driving in the display device 100 according to aspects of the present disclosure.

In one or more embodiments, the display device 100 according to aspects of the present disclosure may include a substrate SUB including a display area DA for displaying an image and a plurality of pixels P arranged in the display area DA.

Referring to FIGS. 16 and 17, the display area DA may include a first driving area A1, a second driving area A2, and a boundary driving area BA between the first driving area A1 and the second driving area A2.

Referring to FIGS. 16 and 17, the second driving area A2 may be included in the optical area OA configured to help light be transmitted. Accordingly, the second driving area A2 may include a transmissive area for helping light be transmitted.

Referring to FIGS. 16 and 17, the first driving area A1 may be included in the normal area NA different from the optical area OA.

Referring to FIGS. 16 and 17, the boundary driving area BA between the first driving area A1 and the second driving area A2 may be included in the normal area NA or be included in an optical bezel area OBA between the normal area NA and the optical area OA.

In an example where the optical area OA is configured in the first type (e.g., the anode extension type) as in FIG. 4, the boundary driving area BA may be included in the optical bezel area OBA. In an example where the optical area OA is configured in the second type (e.g., the hole type) as in FIG. 10, the boundary driving area BA may be included in the normal area NA.

Referring to FIGS. 16 and 17, a plurality of pixels P may include a plurality of first pixels P1 disposed in the first driving area A1, a plurality of second pixels P2 disposed in the second driving area A2, and a plurality of third pixels P3 disposed in the boundary driving area BA.

Referring to FIGS. 16 and 17, the plurality of pixels P may further include a plurality of fourth pixels P4 disposed in the boundary driving area BA.

For example, as illustrated in FIG. 17, each of the first to fourth pixels (P1, P2, P3, and P4) may include four subpixels SP. In FIG. 17, each of several circles represents one subpixel SP. One pixel may be configured with four subpixels SP, and one unit area may be configured with four pixels.

Referring to FIG. 17, the number of pixels per unit area UA in the second driving area A2 may be less than the number of pixels per unit area UA in the first driving area A1. For example, as shown in FIG. 14, the ratio of the number of pixels per unit area UA in the first driving area A1 to the number of pixels per unit area UA in the second driving area A2 may be 4:1.

Referring to FIG. 16, the display device 100 according to aspects of the present disclosure can provide a driving for reducing a level of the perception of a boundary between the normal area NA and the optical area OA (hereinafter, referred to as a boundary perception level reduction driving).

In one or more embodiments, the display device 100 according to aspects of the present disclosure may use triple gammas for the boundary perception level reduction driving.

Referring to FIGS. 16 and 18, in one or more embodiments, the display device 100 according to aspects of the present disclosure may use a first gamma (Gamma 1) for the first driving area A1, a second gamma (Gamma 2) for the second driving area A2, and a third gamma (Gamma 3) for the boundary driving area BA.

Referring to FIGS. 16 and 18, the first gamma (Gamma 1), the second gamma (Gamma 2), and the third gamma (Gamma 3) may be different from each other.

Referring to FIGS. 16 and 18, in the triple gamma-based boundary perception level reduction driving according to embodiments of the present disclosure, each of the plurality of first pixels P1 disposed in the first driving area A1 can represent a first luminance L1 for a first grayscale G1 according to a first gamma curve GC1, each of the plurality of second pixels P2 disposed in the second driving area A2 can represent a second luminance L2 for the first grayscale G1 according to a second gamma curve GC2, and each of the plurality of third pixels P3 arranged in the boundary driving area BA can represent a third luminance L3 for the first grayscale G1 according to a third gamma curve GC3.

Referring to FIGS. 16 and 18, the first gamma curve GC1, the second gamma curve GC2, and the third gamma curve GC3 may be different from each other, and the first luminance L1 of each first pixel P1 in the first driving area A1, the second luminance L2 of each second pixel P2 in the second driving area A2, and the third luminance L3 of each third pixel P3 in the boundary driving area BA may be different from each other.

Referring to FIGS. 16 and 18, each of the plurality of fourth pixels P4 disposed in the boundary driving area BA can represent a fourth luminance for the first grayscale G1 according to the third gamma curve GC3. For example, the fourth luminance of each fourth pixel P4 disposed in the boundary driving area BA may be different from the first luminance L1 of each first pixel P1 in the first driving area A1, the second luminance L2 of each second pixel P2 in the second driving area A2, and the third luminance L3 of each third pixel P3 in the boundary driving area BA.

Referring to FIG. 18, the first gamma curve GC1 may have a first slope at the first grayscale G1, the second gamma curve GC2 may have a second slope at the first grayscale G1, and the third gamma curve GC3 may have a third slope at the first grayscale G1.

Referring to FIG. 18, the second slope may be greater than the first slope and the third slope, and the third slope may be greater than the first slope and less than the second slope.

As described above, the display area DA may include the optical area OA for helping light be transmitted and the normal area NA different from the optical area OA. The first driving area A1 may be included in the normal area NA, the second driving area A2 may be included in the optical area OA, and the boundary driving area BA may be included in the normal area NA or included in the optical bezel area OBA between the normal area NA and the optical area OA.

The optical area OA may overlap one or more optical electronic devices (11 and/or 12) located under the substrate SUB.

The one or more optical electronic devices (11 and/or 12) can perform a predefined operation by receiving light transmitting through the optical area OA.

The one or more optical electronic devices (11 and/or 12) may include a first optical electronic devices 11 (e.g., the first optical electronic device 11 in FIGS. 1A, 1B, 1C and 13 discussed above) configured to perform a predefined operation by receiving light (e.g., visible light) having a first range of wavelengths (e.g., wavelengths of visible light) transmitting through the optical area OA, and a second optical electronic device 12 (e.g., the second optical electronic device 12 in FIGS. 1A, 1B, 1C and 13 discussed above) configured to perform a predefined operation by receiving light (e.g., infrared light) having a second range of wavelengths (e.g., wavelengths of infrared light) transmitting through the optical area OA.

Referring to FIG. 17, since the boundary driving area BA has the same rendering pixel structure as the first driving area A1, a same pixel arrangement layout can be implemented at each location in the boundary driving area BA.

Therefore, a luminance disparity due to an irregularity of respective pixel arrangements at locations in the boundary between the normal area NA and the optical area OA, and thereby, a difference in color perception can be prevented or reduced.

As shown in FIG. 17, for example, the number of pixels per unit area UA of the boundary driving area BA may be the same as the number of pixels per unit area UA of the first driving area A1.

In another example, the number of pixels per unit area UA of the boundary driving area BA may be greater than the number of pixels per unit area UA of the second driving area A2 and may be less than the number of pixels per unit area UA of the first driving area A1.

Figure 19:
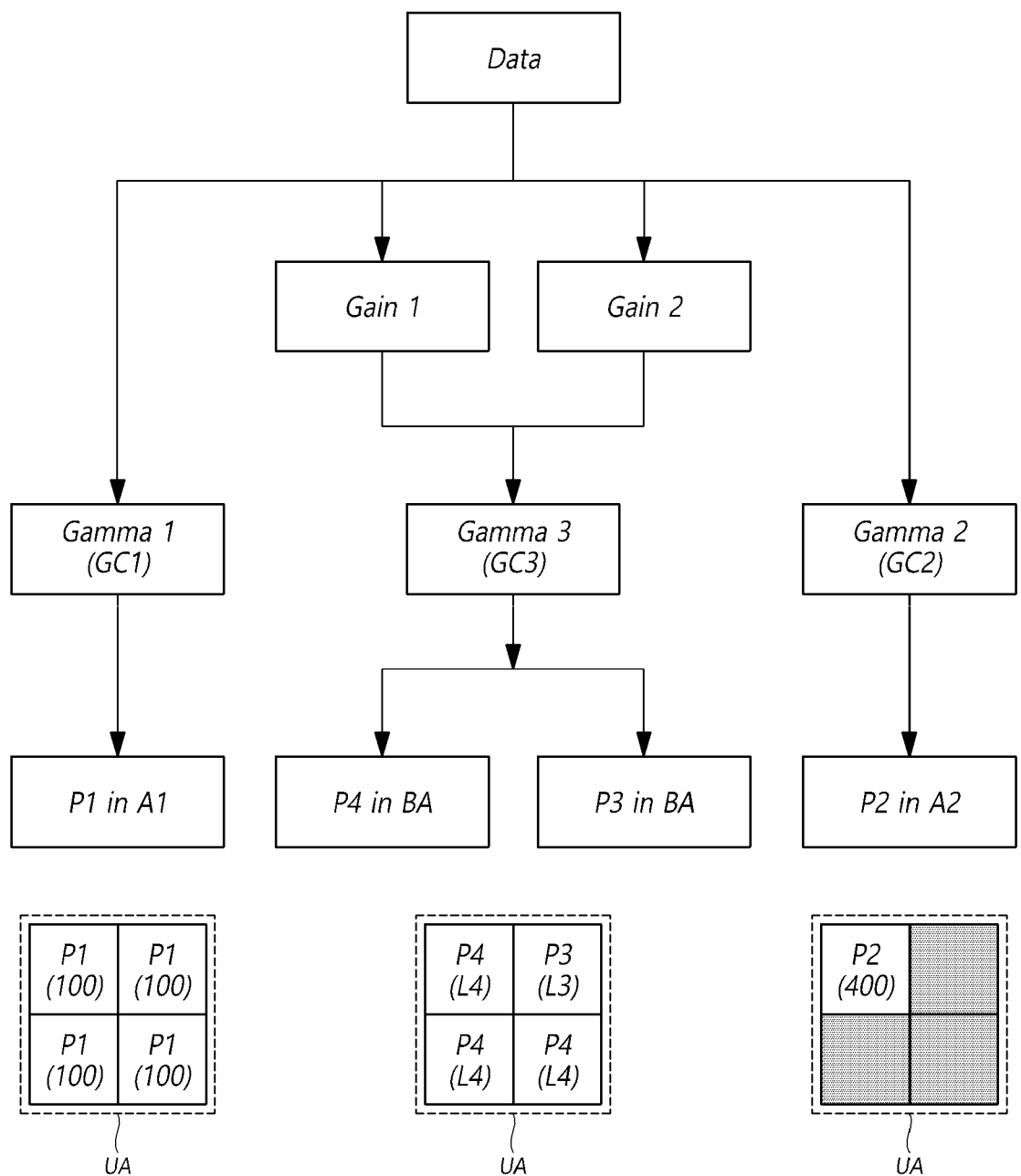
FIG. 19 illustrates an example triple gamma-based boundary perception level reduction driving for each pixel in the display device according to aspects of the present disclosure.
Figure 20:
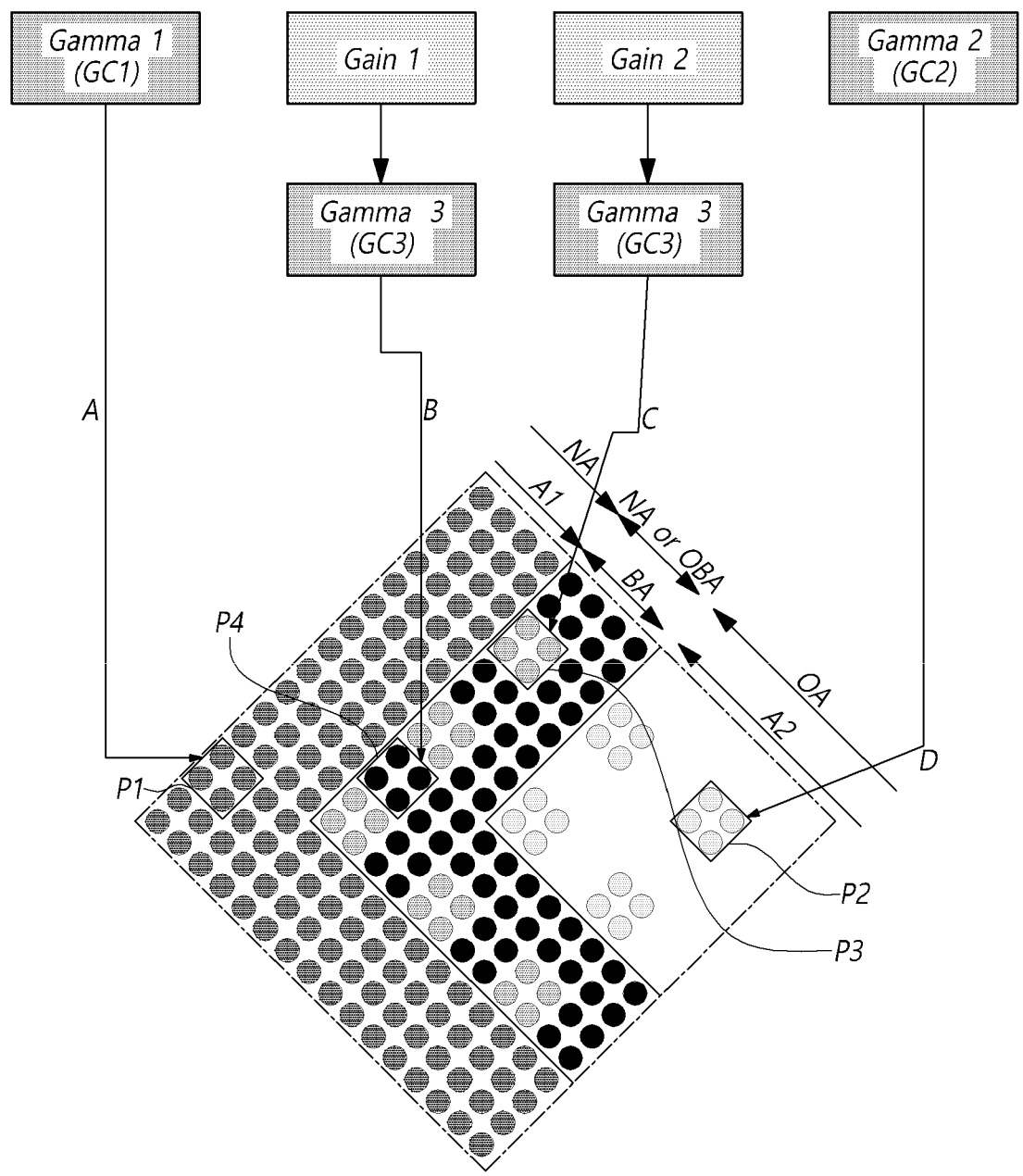
FIGS. 20 and 21 illustrate example respective pixel luminance in each of a first driving area, a boundary driving area, and a second driving area when the triple gamma-based boundary perception level reduction driving is performed in the display device according to aspects of the present disclosure.
Figure 21:
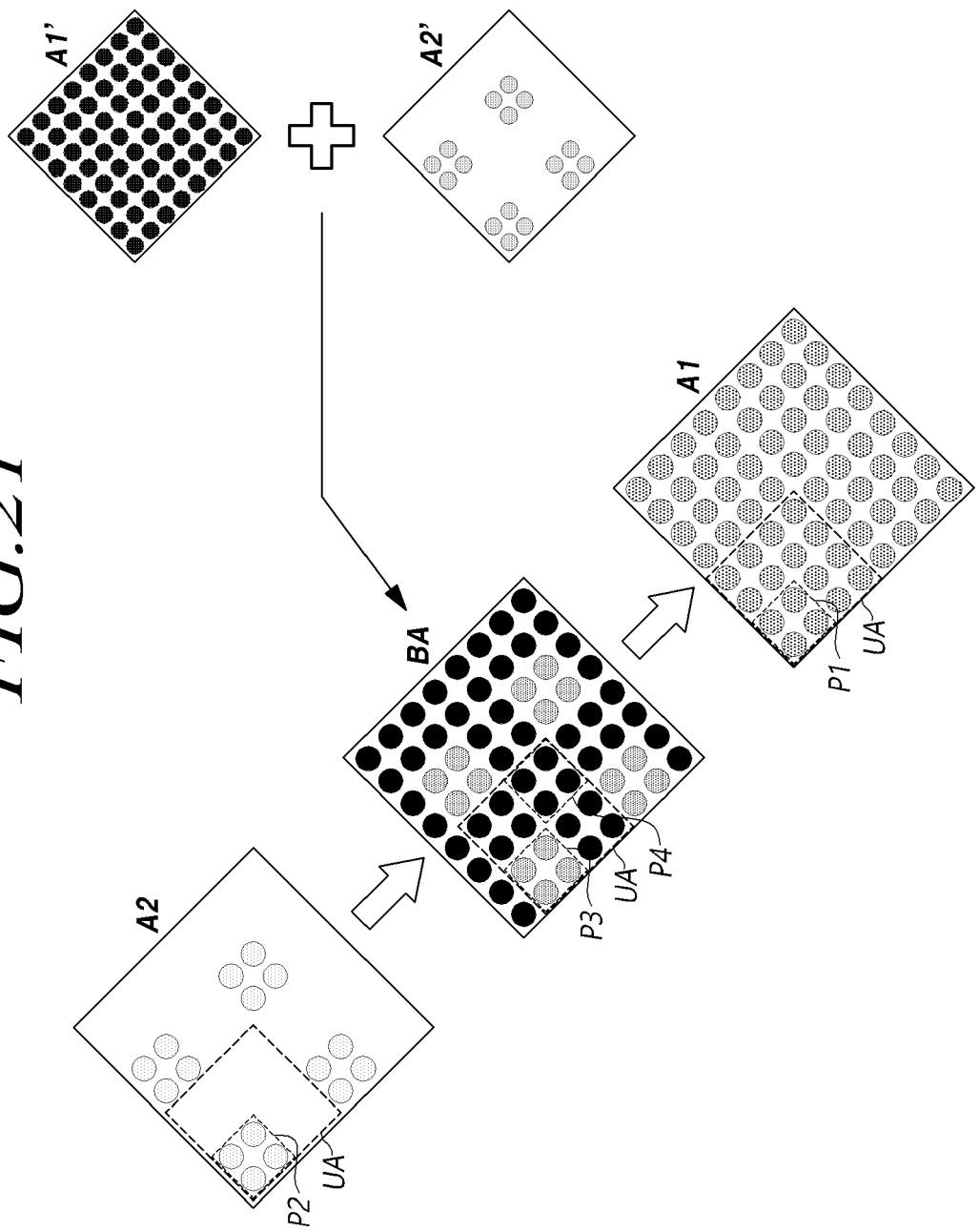

FIG. 19 illustrates an example triple gamma-based boundary perception level reduction driving for each pixel in the display device 100 according to aspects of the present disclosure. FIGS. 20 and 21 illustrate example respective pixel luminance in each of the first driving area A1, the boundary driving area BA, and the second driving area A2 (see FIG. 17) when the triple gamma-based boundary perception level reduction driving is performed in the display device 100 according to aspects of the present disclosure.

Referring to FIGS. 19, 20, and 21, image data to be supplied to each of a plurality of first pixels P1 disposed in the first driving area A1 may be image data obtained by correcting first original image data according to the first gamma curve GC1 (e.g., correcting using digital gamma correction), and image data to be supplied to each of a plurality of second pixels P2 disposed in the second driving area A2 may be image data obtained by correcting second original image data according to the second gamma curve GC2 (e.g., correcting using digital gamma correction).

Herein, the term "gamma" may be an index representing a relationship between the grayscale of an input image and the luminance of an output image, and may be defined as a gamma curve. The term "gamma correction" may refer to a process of changing the luminance of a corresponding grayscale to a luminance according to a corresponding gamma, and may be realized through a process of correcting (changing) image data according to a gamma curve. Herein, the gamma correction may represent digital gamma correction in which gamma correction is implemented in the digital manner.

Referring to FIGS. 19, 20 and 21, image data to be supplied to each of a plurality of fourth pixels P4 disposed in the boundary driving area BA may be image data corrected according to the third gamma curve GC3 after fourth original image data is multiplied by a first gain (Gain 1) (e.g., correcting using digital gamma correction).

Referring to FIGS. 19, 20 and 21, image data to be supplied to each of a plurality of third pixels P3 disposed in the boundary driving area BA may be image data corrected according to the third gamma curve GC3 after third original image data is multiplied by a second gain (Gain 2) different from the first gain (Gain 1) (e.g., correcting using digital gamma correction).

Referring to FIGS. 19, 20, and 21, in one or more embodiments, according to the triple gamma-based boundary perception level reduction driving, among a respective first luminance of each first pixel P1 in the first drive area A1, a respective second luminance of each second pixel P2 in the second driving area A2, and a respective third luminance of each third pixel P3 in the boundary driving area BA, the second luminance may be the highest, and the third luminance may be higher than the first luminance and lower than the second luminance (e.g., the second luminance>the third luminance>the first luminance).

Referring to FIGS. 19, 20, and 21, in one or more embodiments, according to the triple gamma-based boundary perception level reduction driving, among a respective first luminance of each first pixel P1 in the first drive area A1, a respective second luminance of each second pixel P2 in the second driving area A2, a respective third luminance of each third pixel P3 in the boundary driving area BA, and a respective fourth luminance of each fourth pixel P4 in the boundary driving area BA, the second luminance may be the highest, the third luminance may be higher than the first luminance and lower than the second luminance, and the fourth luminance may be lower than the first luminance (e.g., the second luminance>the third luminance>the first luminance>the fourth luminance).

Referring to FIGS. 19, 20, and 21, according to the triple gamma-based boundary perception level reduction driving according to embodiments of the present disclosure, the first gain (Gain 1) may be set smaller than the second gain (Gain 2). Accordingly, among the plurality of third pixels P3 and the plurality of fourth pixels P4 disposed in the boundary driving area BA, each of the plurality of fourth pixels P4 can emit darker light than each of the plurality of third pixels P3.

Referring to FIGS. 19, 20, and 21, each of the plurality of fourth pixels P4 can emit darker light than each of the plurality of first pixels P1 disposed in the first driving area A1. Each of the plurality of third pixels P3 can emit darker light than each of the plurality of second pixels P2 disposed in the second driving area A2.

Referring to FIGS. 19, 20, and 21, the first gain (Gain 1) may be set so that each of the plurality of fourth pixels P4 can emit darker light than each of the plurality of third pixels P3 and also emit darker light than each of the plurality of first pixels P1 disposed in the first driving area A1.

Referring to FIGS. 19, 20, and 21, the second gain (Gain 2) may be set so that each of the plurality of third pixels P3 can emit brighter light than each of the plurality of fourth pixels P4 and emit darker light than each of the plurality of second pixels P2 disposed in the second driving area A2.

Referring to FIG. 21, the driving of the pixels (P3 and P4) disposed in the boundary driving area BA may result from both a driving (A1') for enabling darker light than the first pixels P1 disposed in the first driving area A1 to be emitted, and an additional driving (A2') for enabling light darker than the second pixels P2 disposed in the second driving area A2 to be emitted.

According to the foregoing discussions, although there are present differences in luminance between the first pixel P1, the second pixel P2, the third pixel P3, and the fourth pixel P4, the total luminance of the first driving area A1, the total luminance of the second driving area A2 and the total luminance of the boundary driving area BA may be the same. Thus, according to the triple gamma-based boundary perception level reduction driving according to embodiments of the present disclosure, although there may be present differences in luminance between pixels, a difference luminance between areas may not be produced. As a result, a difference in color perception by users can be eliminated or reduced. That is, during operation, luminance of the first driving area A1, luminance of the second driving area A2, and luminance of the boundary driving area BA may be perceived as being the same as each other by the users due to the gamma correction function (e.g., triple gamma-based boundary perception level reduction driving).

Figure 22:
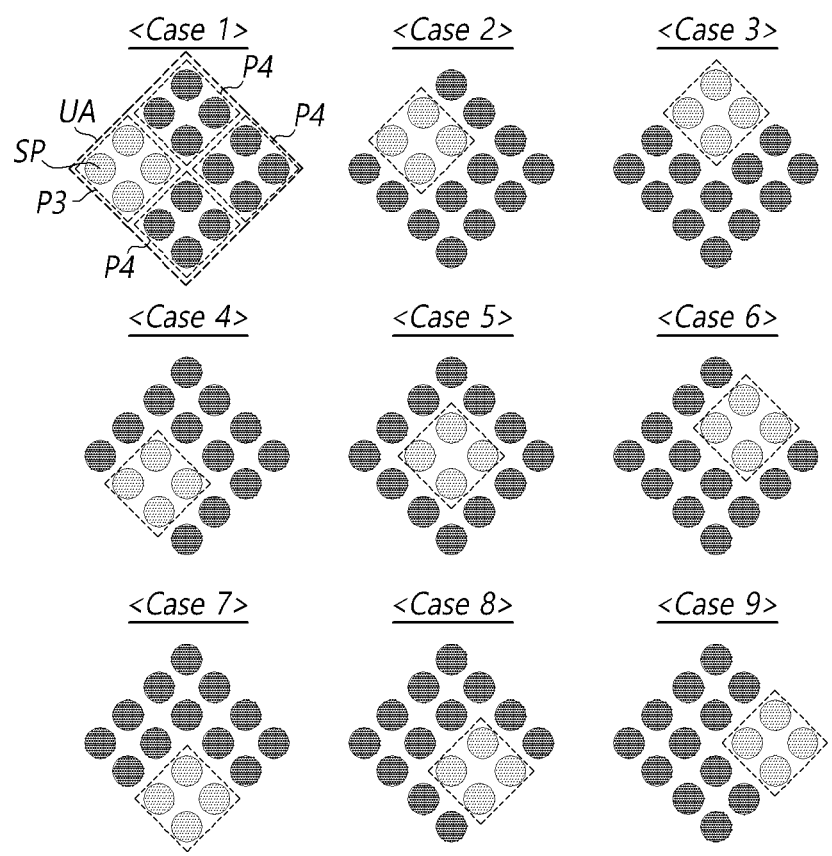
FIG. 22 illustrates example nine types of pixel arrangement patterns in the boundary driving area when the triple gamma-based boundary perception level reduction driving is performed in the display device according to aspects of the present disclosure.

FIG. 22 illustrates example nine types of pixel arrangement patterns (Case 1 to Case 9) of four pixels (e.g., one third pixel P3 and three fourth pixels P4) in a unit area UA in the boundary driving area BA when the triple gamma-based boundary perception level reduction driving is performed in the display device 100 according to aspects of the present disclosure.

For example, the unit area UA may include four pixels P. The four pixels P may include one third pixel P3 and three fourth pixels P4. In the unit area UA, four pixels P may be arranged in two rows and two columns.

For example, each of the four pixels P may include four subpixels SP. For example, the four subpixels SP may include one red subpixel, two green subpixels, and one blue subpixel.

When the unit area UA is expressed based on subpixels SP, the unit area UA may include 16 subpixels SP arranged in 4 rows and 4 columns.

According to nine types of pixel arrangement patterns (Case 1 to Case 9), the third pixel P3 including four subpixels SP arranged in two rows and two columns may located in nine types of patterns.

Circuit elements for performing the triple gamma-based boundary perception level reduction driving according to embodiments of the present disclosure will be briefly described below.

Figure 23:
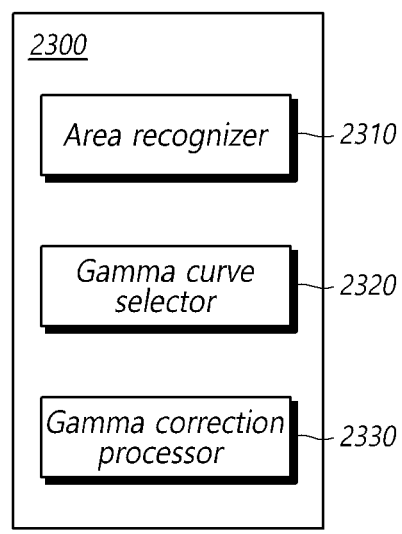
FIG. 23 is an example block diagram of a triple gamma-based gamma correction circuit in the display device according to aspects of the present disclosure.

FIG. 23 is an example block diagram of a gamma correction circuit based on triple gammas in the display device 100 according to aspects of the present disclosure.

Referring to FIG. 23, in one or more embodiments, the display device 100 according to aspects of the present disclosure may include a gamma correction circuit 2300 configured to perform digital gamma correction on image data based on a gamma curve corresponding to a location to which the image data is supplied among a first gamma curve GC1, a second gamma curve GC2, and a third gamma curve GC3, and output the corrected image data.

Referring to FIG. 23, in one or more embodiments, the gamma correction circuit 2300 based on triple gammas may include an area recognizing circuit 2310 (also referred to as "area recognizer 2310"), a gamma curve selecting circuit 2320 (also referred to as "gamma curve selector 2320"), and a gamma correction processor 2330.

The area recognizer 2310 may be configured to recognize an area in which a subpixel to which image data is to be supplied is disposed as one of a first driving area A1, a second driving area A2, and a boundary driving areas BA between the first driving area A1 and the second driving area A2.

The gamma curve selector 2320 may be configured to select a gamma curve corresponding to the recognized area among the first gamma curve GC1 for the first driving area A1, the second gamma curve GC2 for the second driving area A2, and the third gamma curve GC3 for the boundary driving area BA.

The gamma correction processor 2330 can perform digital gamma correction on image data based on the selected gamma curve, and output the corrected image data.

The first gamma curve GC1 may have a first slope at a first grayscale, the second gamma curve GC2 may have a second slope at the first grayscale, and the third gamma curve GC3 may have a third slope at the first grayscale.

In one or more embodiments, the second slope may be greater than the first slope and the third slope, and the third slope may be greater than the first slope and less than the second slope.

In one or more embodiments, data on each of the first gamma curve GC1 for the first driving area A1, the second gamma curve GC2 for the second driving area A2, and the third gamma curve GC3 for the boundary driving area BA can be generated through an optical compensation process during the panel manufacturing process and stored in a memory of the display device 100.

The gamma correction circuit 2300 may identify data on the first to third gamma curves (GC1, GC2, and GC3) by accessing the memory in which the data on the first to third gamma curves (GC1, GC2, and GC3) are stored.

When a subpixel to which image data is to be supplied is included in a plurality of first pixels P1 disposed in the first driving area A1, the gamma correction processor 2330 can correct (e.g., perform digital gamma correction for) the image data according to the first gamma curve, and output the corrected image data.

When a subpixel to which image data is to be supplied is included in a plurality of second pixels P2 disposed in the second driving area A2, the gamma correction processor 2330 can correct (e.g., perform digital gamma correction for) the image data according to the second gamma curve, and output the corrected image data.

When a subpixel to which image data is to be supplied is included in a plurality of third pixels P3 disposed in the boundary driving area BA, the gamma correction processor 2330 can multiply the image data by a gain (e.g., a second gain), thereafter correct (e.g., perform digital gamma correction for) adjusted image data resulting from the multiplying according to the third gamma curve, and output the corrected image data.

When a subpixel to which image data is to be supplied is included in a plurality of fourth pixels P4 disposed in the boundary driving area BA, the gamma correction processor 2330 can multiply the image data by another gain (e.g., a first gain), thereafter correct (e.g., perform digital gamma correction for) adjusted image data resulting from the multiplying according to the third gamma curve, and output the corrected image data.

In one or more embodiments, the gamma correction circuit 2300 based on triple gammas may be configured inside or outside of the display controller 240.

In an example where the gamma correction circuit 2300 based on triple gammas is configured outside of the display controller 240, the gamma correction circuit 2300 may be configured between the host system 250 and the display controller 240 or be configured between the display controller 240 and the data driving circuit 220.

An example where the gamma correction circuit 2300 based on triple gammas is configured inside of the display controller 240 will be described below.

Figure 24:
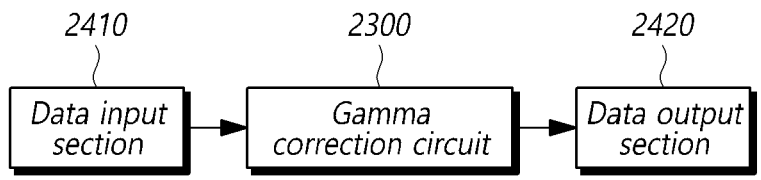
FIG. 24 is an example block diagram of a display controller of the display device according to aspects of the present disclosure.

FIG. 24 is an example block diagram of the display controller 240 of the display device 100 according to aspects of the present disclosure.

Referring to FIG. 24, in one or more embodiments, the display controller 240 of the display device 100 according to aspects of the present disclosure may include a data input section 2410 configured to receive image data, a gamma correction circuit 2300 (e.g., the gamma correction circuit 2300 in FIG. 23) configured to perform digital gamma correction on image data based on a gamma curve corresponding to a location at which the image data is supplied, and provide the corrected image data, and a data output section 2420 configured to output the corrected image data resulting from the digital gamma correction.

In one or more embodiments, the display controller 240 may be a timing controller. That is, the gamma correction circuit 2300 may be included in the timing controller. However, as previously described, in other embodiments, the gamma correction circuit 2300 may be operatively connected to the timing controller but located outside of the timing controller.

The data output section 2420 can supply the corrected image data resulting from the digital gamma correction to the data driving circuit 220.

The gamma curve corresponding to the location at which the image data is supplied may include the first gamma curve GC1 for the first driving area A1, the second gamma curve GC2 for the second driving area A2 including one or more transmissive areas, and the third gamma curve GC3 for the boundary driving area BA between the first driving area A1 and the second driving area A2.

As shown in FIG. 23, the gamma correction circuit 2300 may include the area recognizer 2310, the gamma curve selector 2320, and the gamma correction processor 2330.

A driving method of the display device 100 based on triple gammas according to the embodiments described above will be briefly described below.

In one or more embodiments, the method of driving the display device 100 based on triple gammas may include: recognizing an area in which a subpixel to which image data is to be supplied is disposed as one of a first driving area A1, a second driving area A2, and a boundary driving area BA between the first driving area A1 and the second driving area A2 (which may referred to as an area recognition step); and correcting (e.g., performing digital gamma correction for) image data based on a gamma or a gamma curve defining the gamma corresponding to the recognized area among a first gamma (Gamma 1) for the first driving area A1 or a first gamma curve GC1 defining the first gamma (Gamma 1), a second gamma (Gamma 2) for the second driving area A2 or a second gamma curve GC2 defining the second gamma (Gamma 2), and a third gamma (Gamma 3) for the boundary driving area BA2 or a third gamma curve GC3 defining the third gamma (Gamma 3), and outputting the corrected image data (which may referred to as a gamma correction processing step).

The first gamma curve GC1 may have a first slope at a first grayscale G1, the second gamma curve GC2 may have a second slope at the first grayscale G1, and the third gamma curve GC3 may have a third slope at the first grayscale G1. In one or more embodiments, the second slope may be greater than the first slope and the third slope, and the third slope may be greater than the first slope and less than the second slope (e.g., the second slope>the third slope>the first slope). The term slope may also include the meaning of a tangent line or simply tangent at the first grayscale G1.

The first gamma curve GC1 can define a first luminance at the first grayscale G1, the second gamma curve GC2 can define a second luminance at the first grayscale G1, and the third gamma curve GC3 can define a third luminance at the first grayscale G1. The second luminance may be the highest, and the third luminance may be higher than the first luminance and lower than the second luminance.

Among the first luminance at the first grayscale G1 according to the first gamma (Gamma 1), the second luminance at the first grayscale G1 according to the second gamma (Gamma 2), and the third luminance at the first grayscale G1 according to the third gamma (Gamma 3), the second luminance may be the highest, and the third luminance may be higher than the first luminance and lower than the second luminance.

The first driving area A1 and the second driving area A2 may have different numbers of pixels per unit area UA. The first driving area A1 and the second driving area A2 may have different numbers of light emitting pixels per unit area UA.

The first driving area A1 may be an area not including a transmissive area TA, and the second driving area A2 may be an area including one or more transmissive areas TA.

The first driving area A1 may be an area included in the normal area NA, and the second driving area A2 may be an area included in the optical area OA.

The first driving area A1 may be an area not overlapping one or more optical electronic devices (11 and/or 12), and the second driving area A2 may be an area overlapping the one or more optical electronic devices (11 and/or 12).

For example, the number of pixels per unit area UA of the boundary driving area BA between the first driving area A1 and the second driving area A2 may be equal, or similar, to the number of pixels per unit area UA of the first driving area A1.

In another example, the number of pixels per unit area UA of the boundary driving area BA between the first driving area A1 and the second driving area A2 may be greater than the number of pixels per unit area UA of the second driving area A2 and be less than or equal to the number of pixels per unit area UA of the first driving area A1.

In an example where the optical area OA is configured in the second type (e.g., the hole type), the boundary driving area BA between the first driving area A1 and the second driving area A2 may be included in the normal area NA.

In an example where the optical area OA is configured in the first type (e.g., the anode extension type), the boundary driving area BA between the first driving area A1 and the second driving area A2 may be included in the optical bezel area OBA.

According to the embodiments described herein, the display device 100 may be provided that includes a transmission and display structure in which one or more optical electronic devices required to receive light are disposed under, or at a lower portion of, a display panel, and a display area of the display panel overlapping the one or more optical electronic devices is configured to serve as image displaying, as well as a light transmission path.

According to the embodiments described herein, the display device 100, the gamma correction circuit 2300, and the display driving method can be provided that are capable of decreasing a level at which a user perceives a boundary between a normal area and an optical area by applying a different gamma for the boundary between the normal area and the optical area.

According to the embodiments described herein, the display device 100, the gamma correction circuit 2300, and the display driving method can be provided that are capable of reducing a color difference between a normal area and an optical area perceived by a user by using a respective gamma for each area. That is, by reducing the color difference between the normal area and an optical area where optical electronic devices are disposed, the user may not recognize the boundary between the normal area and the optical area.

According to the embodiments described herein, the display device 100, the gamma correction circuit 2300, and the display driving method can be provided that are capable of preventing display artifacts such as luminance disparities at a boundary between a normal area and an optical area by designing pixels to be arranged in a same layout for each location at the boundary between the normal area and the optical area.

According to the embodiments described herein, the display device 100, the gamma correction circuit 2300, and the display driving method can be provided that are capable of reducing power consumption, performing efficient driving, and enabling low-power design by using a respective gamma suitable for each area.

The above description has been presented to enable any person skilled in the art to make, use and practice the technical features of the present disclosure, and has been provided in the context of a particular application and its requirements as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present disclosure for illustrative purposes only. That is, the disclosed embodiments are intended to illustrate the scope of the technical features of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate having a display area for displaying an image, the display area including:
a first driving area, a second driving area, and a boundary driving area between the first driving area and the second driving area; and
a plurality of pixels including a plurality of first pixels disposed in the first driving area, a plurality of second pixels disposed in the second driving area, a plurality of third pixels disposed in the boundary driving area, and a plurality of fourth pixels disposed in the boundary driving area,
wherein the number of pixels per unit area in the second driving area is less than the number of pixels per unit area in the first driving area,
wherein each of the plurality of first pixels has a first luminance for a first grayscale according to a first gamma curve, each of the plurality of second pixels has a second luminance for the first grayscale according to a second gamma curve, each of the plurality of third pixels has a third luminance for the first grayscale according to a third gamma curve, and each of the plurality of fourth pixels has a fourth luminance for the first grayscale according to the third gamma curve,
wherein all of the first gamma curve, the second gamma curve, and the third gamma curve are different from each other, and all of the first luminance, the second luminance, the third luminance, and the fourth luminance are different from each other,
wherein among the first luminance, the second luminance, the third luminance, and the fourth luminance, the second luminance is the highest, the third luminance is higher than the first luminance and lower than the second luminance, and the fourth luminance is lower than the first luminance, and
wherein among the plurality of third pixels and the plurality of fourth pixels disposed in the boundary driving area, each of the plurality of fourth pixels emits darker light than each of the plurality of third pixels.

2. The display device of claim 1, wherein the second driving area comprises one or more transmissive areas allowing light to be transmitted.

3. The display device of claim 1, wherein, during operation, luminance of the first driving area, luminance of the second driving area, and luminance of the boundary driving area are perceived as the same as each other.

4. The display device of claim 1, wherein among the first luminance, the second luminance, and the third luminance, the second luminance is the highest, and the third luminance is higher than the first luminance and lower than the second luminance.

5. The display device of claim 1, wherein the first gamma curve has a first slope at the first grayscale, the second gamma curve has a second slope at the first grayscale, and the third gamma curve has a third slope at the first grayscale, and
wherein among the first slope, the second slope, and the third slope, the second slope is greatest, and the third slope is greater than the first slope and less than the second slope.

6. A display device comprising:
a substrate having a display area for displaying an image the display area including:
a first driving area, a second driving area, and a boundary driving area between the first driving area and the second driving area; and
a plurality of pixels including a plurality of first pixels disposed in the first driving area, a plurality of second pixels disposed in the second driving area, a plurality of third pixels disposed in the boundary driving area, and a plurality of fourth pixels disposed in the boundary driving area,
wherein the number of pixels per unit area in the second driving area is less than the number of pixels per unit area in the first driving area,
wherein each of the plurality of first pixels has a first luminance for a first grayscale according to a first gamma curve, each of the plurality of second pixels has a second luminance for the first grayscale according to a second gamma curve, each of the plurality of third pixels has a third luminance for the first grayscale according to a third gamma curve, and each of the plurality of fourth pixels has a fourth luminance for the first grayscale according to the third gamma curve,
wherein all of the first gamma curve, the second gamma curve, and the third gamma curve are different from each other, and all of the first luminance, the second luminance, the third luminance, and the fourth luminance are different from each other,
wherein: image data to be supplied to each of the plurality of first pixels disposed in the first driving area is image data obtained by correcting first original image data according to the first gamma curve;
image data to be supplied to each of the plurality of second pixels disposed in the second driving area is image data obtained by correcting second original image data according to the second gamma curve;
image data to be supplied to each of the plurality of fourth pixels disposed in the boundary driving area is image data corrected according to the third gamma curve after fourth original image data is multiplied by a first gain; and
image data to be supplied to each of the plurality of third pixels disposed in the boundary driving area is image data corrected according to the third gamma curve after third original image data is multiplied by a second gain different from the first gain.

7. The display device of claim 1, wherein the plurality of third pixels of the boundary driving area are arranged in a same layout at each location in the boundary driving area.

8. The display device of claim 1, wherein the number of pixels per unit area in the boundary driving area is either equal to the number of pixels per unit area in the first driving area, or greater than the number of pixels per unit area in the second driving area and less than the number of pixels per unit area in the first driving area.

9. The display device of claim 1, wherein the display area comprises an optical area allowing light to be transmitted and a normal area different from the optical area,
wherein the first driving area is included in the normal area, and the second driving area is included in the optical area, and
wherein the boundary driving area, which is an area between the first driving area and the second driving area, is included in the normal area or an optical bezel area between the normal area and the optical area,
further comprising: one or more optical electronic devices located under the substrate and overlapping the optical area,
wherein the one or more optical electronic devices performs a selected operation by receiving light transmitting through the optical area.

10. The display device of claim 1, further comprising: a gamma correction circuit configured to correct image data based on a gamma curve corresponding to a location to which the image data is supplied among the first gamma curve, the second gamma curve, and the third gamma curve, and output the corrected image data.

11. A gamma correction circuit comprising:
an area recognizing circuit configured to recognize an area where a subpixel to which image data is to be supplied is disposed as one of a first driving area, a second driving area, and a boundary driving area between the first driving area and the second driving area;
a gamma curve selecting circuit configured to select a gamma curve corresponding to the recognized area among a first gamma curve for the first driving area, a second gamma curve for the second driving area, and a third gamma curve for the boundary driving area; and
a gamma correction processor for correcting the image data based on the selected gamma curve, and outputting the corrected image data,
wherein the first driving area includes a plurality of first pixels, the second driving area includes a plurality of second pixels, and the boundary driving area includes a plurality of third pixels and a plurality of fourth pixels,
wherein each of the plurality of first pixels has a first luminance for a first grayscale according to the first gamma curve, each of the plurality of second pixels has a second luminance for the first grayscale according to the second gamma curve, each of the plurality of third pixels has a third luminance for the first grayscale according to the third gamma curve, and each of the plurality of fourth pixels has a fourth luminance for the first grayscale according to the third gamma curve,
wherein among the first luminance, the second luminance, the third luminance, and the fourth luminance, the second luminance is the highest, the third luminance is higher than the first luminance and lower than the second luminance, and the fourth luminance is lower than the first luminance, and
wherein among the plurality of third pixels and the plurality of fourth pixels disposed in the boundary driving area, each of the plurality of fourth pixels emits darker light than each of the plurality of third pixels.

12. The gamma correction circuit of claim 11, wherein the first gamma curve has a first slope at the first grayscale, the second gamma curve has a second slope at the first grayscale, and the third gamma curve has a third slope at the first grayscale, and
wherein among the first slope, the second slope, and the third slope, the second slope is greatest, and the third slope is greater than the first slope and less than the second slope.

13. A display driving method comprising:
recognizing an area where a subpixel to which image data is to be supplied is disposed as one of a first driving area, a second driving area, and a boundary driving area between the first driving area and the second driving area; and
among a first gamma for the first driving area, a second gamma for the second driving area, and a third gamma for the boundary driving area, correcting the image data based on a gamma corresponding to the recognized area, and outputting the corrected image date,
wherein the first driving area includes a plurality of first pixels, the second driving area includes a plurality of second pixels, and the boundary driving area includes a plurality of third pixels and a plurality of fourth pixels,
wherein each of the plurality of first pixels has a first luminance for a first grayscale according to a first gamma, each of the plurality of second pixels has a second luminance for the first grayscale according to a second gamma, each of the plurality of third pixels has a third luminance for the first grayscale according to a third gamma, and each of the plurality of fourth pixels has a fourth luminance for the first grayscale according to the third gamma,
wherein among the first luminance, the second luminance, the third luminance, and the fourth luminance, the second luminance is the highest, the third luminance is higher than the first luminance and lower than the second luminance, and the fourth luminance is lower than the first luminance, and
wherein among the plurality of third pixels and the plurality of fourth pixels disposed in the boundary driving area, each of the plurality of fourth pixels emits darker light than each of the plurality of third pixels.

14. The display driving method of claim 13, wherein among a first luminance at a first grayscale according to the first gamma, a second luminance at the first grayscale according to the second gamma, and a third luminance at the first grayscale according to the third gamma, the second luminance is the highest, and the third luminance is higher than the first luminance and lower than the second luminance.

* * * * *